United States Patent
Tada

(10) Patent No.: US 7,436,205 B2
(45) Date of Patent: Oct. 14, 2008

(54) SEMICONDUCTOR DEVICE REDUCING POWER CONSUMPTION IN STANDBY MODE

(75) Inventor: Akira Tada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 43 days.

(21) Appl. No.: 11/708,458

(22) Filed: Feb. 21, 2007

(65) Prior Publication Data

US 2007/0211553 A1 Sep. 13, 2007

(30) Foreign Application Priority Data

Feb. 24, 2006 (JP) ............................ 2006-049014

(51) Int. Cl.
*H03K 17/16* (2006.01)
(52) U.S. Cl. ............................ 326/33; 326/81; 327/544
(58) Field of Classification Search ............. 326/33–35, 326/81–83, 86, 95, 98, 112–113; 327/544; 365/226–229
See application file for complete search history.

(56) References Cited

U.S. PATENT DOCUMENTS

| | | | |
|---|---|---|---|
| 6,049,245 A * | 4/2000 | Son et al. ..................... | 327/544 |
| 6,285,213 B1 * | 9/2001 | Makino ........................ | 326/81 |
| 6,556,071 B2 * | 4/2003 | Notani et al. ................ | 327/544 |
| 7,164,616 B2 * | 1/2007 | Miller et al. ............. | 365/230.06 |
| 7,345,947 B2 * | 3/2008 | Miller et al. ............. | 365/230.06 |
| 7,355,455 B2 * | 4/2008 | Hidaka ........................ | 326/121 |
| 2004/0004499 A1 * | 1/2004 | Yonemaru ................... | 326/113 |

FOREIGN PATENT DOCUMENTS

| | | |
|---|---|---|
| JP | 9-064715 A | 3/1997 |
| JP | 9-321600 A | 12/1997 |
| JP | 2000-059200 A | 2/2000 |

OTHER PUBLICATIONS

Suhwan Kim et al., "Experimental Measurement of a Novel Power Gating Structure With Intermediate Power Saving Mode", Proceedings of the 2004 International Symposium on Low Power Electronics and Design (ISLPED'04), 2004, pp. 20-25.
Norio Hama et al., "SOI Circuit Technology For Batteryless Mobile System With Green Energy Sources", Symposium on VLSI Circuits Digest of Technical Papers, IEEE, 2002, pp. 280-283.

* cited by examiner

*Primary Examiner*—Rexford Barnie
*Assistant Examiner*—Christopher Lo
(74) *Attorney, Agent, or Firm*—Buchanan, Ingersoll & Rooney PC

(57) ABSTRACT

A voltage supply control circuit is arranged between a true ground voltage and a pseudo ground line. In an active mode, first and second control signals are at the "H" and "L" levels, respectively. In response to this, a first switch is turned on so that a first node is electrically coupled to a power supply voltage, and attains the "H" level. Further, a second switch is turned on to couple electrically the ground voltage to a second node. In a standby mode, the first and second control signals are at the "L" and "H" levels, respectively. In response to this, a third switch is turned on to couple electrically the first and second nodes together. Since the power supply voltage was electrically coupled to the first node according to the turn-on of the first switch in the active mode, the path of the control signal including the first node to the switch has accumulated charged charges.

19 Claims, 34 Drawing Sheets

SEMICONDUCTOR DEVICE REDUCING POWER CONSUMPTION IN STANDBY MODE

BACKGROUND OF THE INVENTION

1. Field of the Invention

The present invention relates to a semiconductor device. Particularly, the invention relates to a semiconductor device having a structure that interrupts electric connections of power and ground lines to logic circuits or the like in a standby mode, and is pertinent to a semiconductor device that can reduce power consumption in the standby mode.

2. Description of the Background Art

In recent years, degrees of integration as well as performance of semiconductor devices have been developing, and application ranges thereof have been increasing. With these situations, it has been technically required to reduce power consumption of semiconductor devices and semiconductor chip bodies. More specifically, it is required to increase a battery operation time of an internal battery in a data information device that includes a telephone, an electronic notebook and a small personal computer in an integrated fashion. In information processing devices of high performance, it is required to reduce sizes of a cooling device and a power supply device. Since effective use of energy resources has been socially demanded for protecting the global environment, the reduction in power consumption of the semiconductor devices as well as the improvement of the performance have been important constituent techniques for high value addition to the semiconductor devices.

As an example of such techniques, there has been a semiconductor device using multiple kinds of thresholds, i.e., a multi-threshold CMOS which will be referred to as an "MTCMOS" hereinafter. The MTCMOS circuit is formed of a logic circuit group and transistors of high threshold voltages, and can prevent increase in power consumption of the logic circuit group formed of CMOSs when the logic circuit group is on standby. In connection with this, Japanese Patent Laying-Open Nos. 09-064715, 09-321600 and 2000-059200 have disclosed various manners that can reduce the power consumption in the standby mode.

More specifically, a logic circuit group includes one or a plurality of logic gate(s), each of which is formed of a P-channel MOS transistor having a threshold voltage of a small absolute value and an N-channel MOS transistor having a low threshold voltage of the small absolute value.

FIG. 38 shows a conventional MTCMOS circuit.

Referring to FIG. 38, a logic circuit group L1 includes a P-channel MOS transistor P2 of a low threshold voltage and an N-channel MOS transistor Q1 of a low threshold voltage, which are connected between a pseudo power supply line VA on a high potential side and a pseudo ground line VB on a low potential side.

Pseudo power supply line VA is connected via a P-channel MOS transistor P1 having a high threshold to a power supply voltage Vcc provided from a power supply line VL. Pseudo ground line VB is connected via an N-channel MOS transistor Q2 having a high threshold to a ground voltage GND provided from a ground line GL. Transistor P1 receives on its gate a control signal /Sleep, and transistor Q2 receives on its gate an inverted signal of control signal /Sleep provided via an inverter IV.

Inverter IV is formed of P- and N-channel MOS transistors PT1 and NT1 connected between power supply voltage Vcc and ground voltage GND. A connection node N1 between transistors PT1 and NT1 is electrically coupled to a gate of transistor Q2. This MTCMOS circuit operates as follows. In an active mode, control signal /Sleep is set to an "L" level, and transistors P1 and Q2 are turned on so that pseudo power supply line VA and pseudo ground line VB are electrically coupled to power supply voltage Vcc and ground voltage GND, respectively.

Thereby, pseudo power supply line VA and pseudo ground line VB are supplied with the required voltages via low-resistance paths, respectively, and thereby can perform predetermined circuit operations.

In the standby mode, control signal /Sleep is set to an "H" level so that transistors P1 and Q2 are turned off.

Therefore, power supply voltage Vcc and pseudo power supply line VA are electrically isolated. Likewise, ground voltage GND and pseudo ground line VB are electrically isolated.

Thereby, transistors P1 and Q2 significantly reduce a leak current in the whole circuit.

In general, a lower threshold voltage of a transistor lowers a leak current preventing capability. Thus, the power consumption increases in transistors P2 and Q1. Therefore, this circuit structure reducing the leak currents in transistors P1 and Q2 can reduce the power consumption in the standby mode. More specifically, even when logic circuit group L1 uses, e.g., transistors of a low threshold voltage, the leak current in the transistors of the logic circuit group can be suppressed so that the power consumption of the whole circuit can be reduced.

During the standby period of the above circuit structure, pseudo power supply line VA and pseudo ground line VB are electrically isolated from power supply Vcc and ground voltage GND provided from power supply line and ground line, respectively, and are set to a high-impedance state. Therefore, small amounts of currents continuously leak to pseudo power supply line VA and pseudo ground line VB via the transistors forming logic circuit group L1 with the passage of time. The leak current occurs because logic circuit group L1 is formed of the transistors of low threshold voltages as described above, and the potentials of pseudo power supply line VA and pseudo ground line VB become closer to each other.

When logic circuit group L1 is formed of a sequential circuit or the like such as a register circuit, a latch circuit or a flip-flop circuit that can store a logical state, and a standby period is long, a potential difference that can hold the logic state may not ensured between pseudo power supply line VA and pseudo ground line VB. Thus, stored information may be lost. Consequently, the semiconductor device cannot be restored to the original state even when it enters an active mode after the standby period. In logic circuits or the like other than the circuit that is required to store the logic state, such a state may be allowed that the potentials of pseudo power supply line VA and pseudo ground line VB become closer to each other.

Referring to FIG. 39, another MTCMOS circuit in the prior art will now be described.

The MTCMOS circuit in FIG. 39 differs from the structure in FIG. 38 in that a transistor P3 is additionally arranged in parallel with transistor Q2 and between a node N0 and ground voltage GND. Other structures are substantially the same, and description thereof is not repeated.

Referring to FIG. 40, description will now be given on the case where the potential level of pseudo ground line VB in FIGS. 38 and 39 rises with time.

Referring to FIG. 40, the leak current on the side of power supply voltage Vcc supplied via logic circuit group L1 raises the potential level of pseudo ground line VB in the structure of FIG. 38 with time as illustrated by dotted line in FIG. 40. A balanced state is attained when the leak current on the side of power supply voltage Vcc is balanced with the leak current passing through the transistor. In this case, the potentials of pseudo power supply line VA and pseudo ground line VB become closer to each other as already described.

In the structure of FIG. 39, transistor P3 is supplied on its gate with a control signal SV (at the "L" level) in the standby mode. Thereby, the potential of pseudo ground line VB rises to a potential level near the threshold voltage of transistor P3 so that transistor P3 starts to be turned on, and the current starts to flow from pseudo ground line VB via transistor P3. Thus, when the potential of node N0 rises to the threshold voltage of transistor P3, transistor P3 is fully turned on. If the potential is lower than it, the degree of the turn-on of transistor P3 is small.

Therefore, as illustrated in solid line in FIG. 40, the potential of node N0 attains the balanced state when it attains a level keeping the balance between the quantity of the current passing to pseudo ground line VB through logic circuit group L1 and the quantity of the current passing to ground voltage GND through transistor P3. This balanced potential depends on the threshold voltage of transistor P3, a transistor width and others. Thus, the potential level of pseudo ground line VB can be adjusted owing to provision of transistor P3. This structure is disclosed by Suhwan Kim, Stephen V. Kosonocky, Daniel R, Knebel, and Kevin Stawiasz, "Experimental Measurement of A Novel Power Gating Structure with Intermediate Power Saving Mode," Proceedings of the 2004 International Symposium on Low Power Electronics and Design, pp. 20-25, 2004.

However, even in either of the case where transistor P3 in FIG. 39 is employed to adjust the potential level, and the case where transistor P3 is not employed, the charging current that flows immediately after the start of the standby mode until a balanced state and thus a certain predetermined balanced potential are attained is pulling from power supply voltage Vcc by the leak current flowing through logic circuit group L1.

Therefore, when the power consumption can be reduced during the above period, the power consumption can be further reduced.

SUMMARY OF THE INVENTION

The invention has been made for overcoming the above problems, and it is an object of the invention to provide a semiconductor device that can reduce power consumption.

A semiconductor device according to the invention includes a first voltage interconnection supplying a first voltage; a second voltage interconnection supplying a second voltage; a third voltage interconnection supplying a third voltage; a first voltage supply interconnection arranged between the first and second voltage interconnections; an internal circuit connected between the second voltage interconnection and the first voltage supply interconnection, and forming a current path between the second voltage interconnection and the first voltage supply interconnection according to an input signal; and a first voltage supply control circuit connected between the first voltage interconnection and the first voltage supply interconnection, and being capable of controlling a state of electrical conduction between the first voltage interconnection and the first voltage supply interconnection according to an input instruction signal. The first voltage supply control circuit includes a first switch arranged between the first voltage supply interconnection and the first voltage interconnection, and a first logic circuit controlling the first switch according to the instruction signal. The first logic circuit includes a second switch arranged between the third voltage interconnection and a control end of the first switch, and electrically coupling the third voltage interconnection to the control end of the first switch according to an instruction signal setting the first switch to an on state; and a third switch arranged between the first voltage supply interconnection and the control end of the first switch, and electrically coupling the first voltage supply interconnection to the control end of the first switch according to an instruction signal attaining an off state of passing a smaller quantity of current through the first switch than the on state.

The semiconductor device according to the invention includes the internal circuit forming the current path between the second voltage interconnection and the first voltage supply interconnection; and the first voltage supply control circuit capable of controlling the state of electrical conduction between the first voltage supply interconnection and the first voltage interconnection. The first voltage supply control circuit includes the first switch arranged between the first voltage supply interconnection and the first voltage interconnection, the second switch arranged between the third voltage interconnection and the control end of the first switch, and electrically coupling the third voltage interconnection to the control end of the first switch according to the instruction signal turning on the first switch, and the third switch electrically coupling the first voltage supply interconnection to the control end of the first switch according to the instruction signal attaining the off state of passing a smaller quantity of current through the first switch than the on state. When the first switch is turned on according to the instruction signal, the control end of the first switch is charged by a third voltage. When the first switch is turned off according to the instruction signal, the third switch electrically couples the first voltage supply interconnection to the control end of the first switch to discharge the charges. Thereby, the current path of the internal circuit arranged between the first and second voltage interconnections can reduce the quantity of charges pulled out from the second voltage interconnection, and thereby can reduce the power consumption. Since the third switch is connected to the first voltage interconnection through the first switch, a current interrupting effect of the first switch can reduce the leak current leaking to the first voltage interconnection via the third switch. Therefore, the leak current of the first voltage supply control circuit can be reduced, and the current consumption of the whole circuit can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers, and description thereof is not repeated.

First Embodiment

Figure 1:
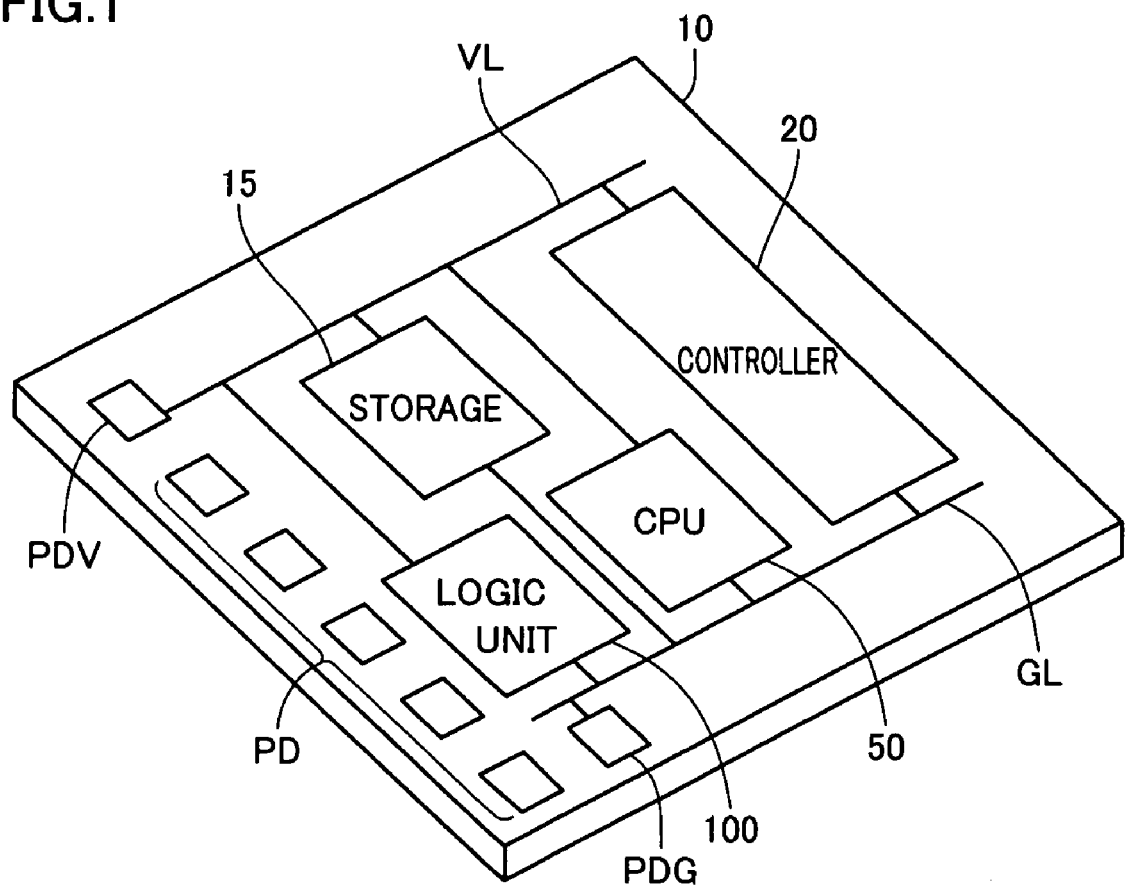
FIG. 1 shows a schematic structure of a semiconductor device according to a first embodiment of the invention.

Referring to FIG. 1, a semiconductor device 10 according to a first embodiment of the invention includes a CPU 50 controlling a whole circuit, a storage 15 having a memory for storing information, a controller 20 that is a peripheral circuit for producing a clock signal or a control signal, and a logic unit 100 for executing various arithmetic and logic operations.

In general, the semiconductor device is provided at its peripheral region with pads, and is supplied via the pads with, e.g., a power supply voltage, a ground voltage, external instruction signals and the like. In this example, FIG. 1 shows a power supply voltage pad PDV supplied with a power supply voltage Vcc, a ground voltage pad PDG supplied with a ground voltage GND and pads PD supplied with other voltages, external instruction signals and the like.

FIG. 1 shows, by way of example, a ground line GL for supplying the ground voltage for the circuits via ground voltage pad PDG. There is also arranged a power supply line VL for supplying power supply voltage Vcc for the circuits via power supply voltage pad PDV. Power supply voltage Vcc and ground voltage GND in the following description are supplied from power supply line VL and ground line GL, i.e., voltage interconnections supplying the voltages, respectively. Although one interconnection is described by way of example as each of the voltage interconnections supplying power supply voltage Vcc and ground voltage GND, respectively, the voltage interconnections are employed corresponding to the types of the voltage levels to be supplied.

Figure 2A:
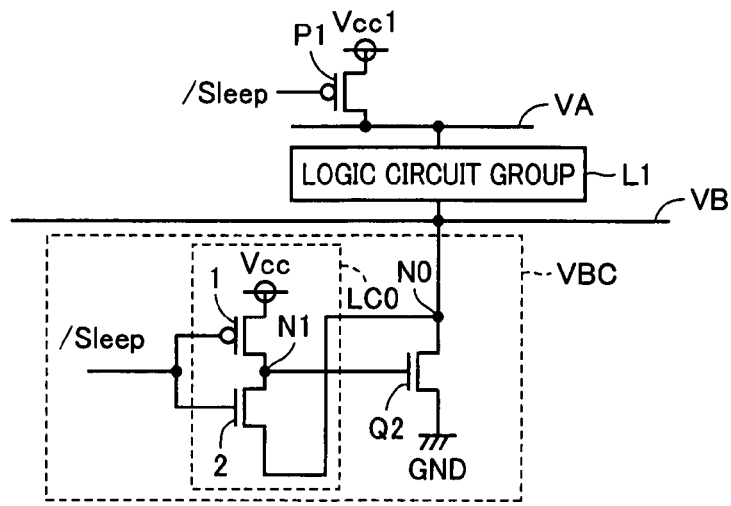
FIGS. 2A-2C illustrate an MTCMOS circuit according to the first embodiment of the invention.
Figure 2B:
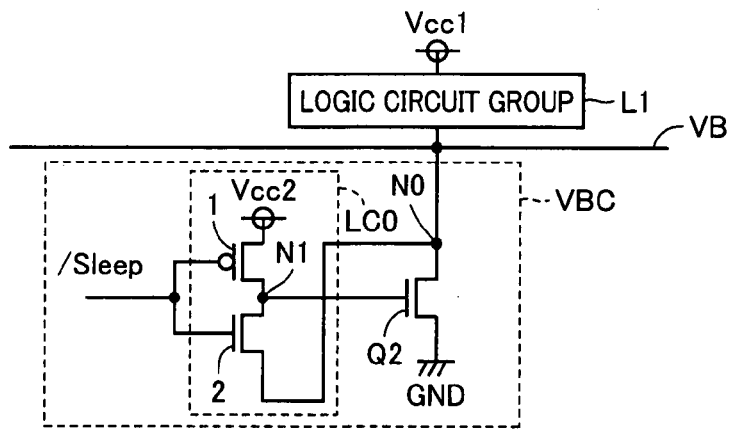
Figure 2C:
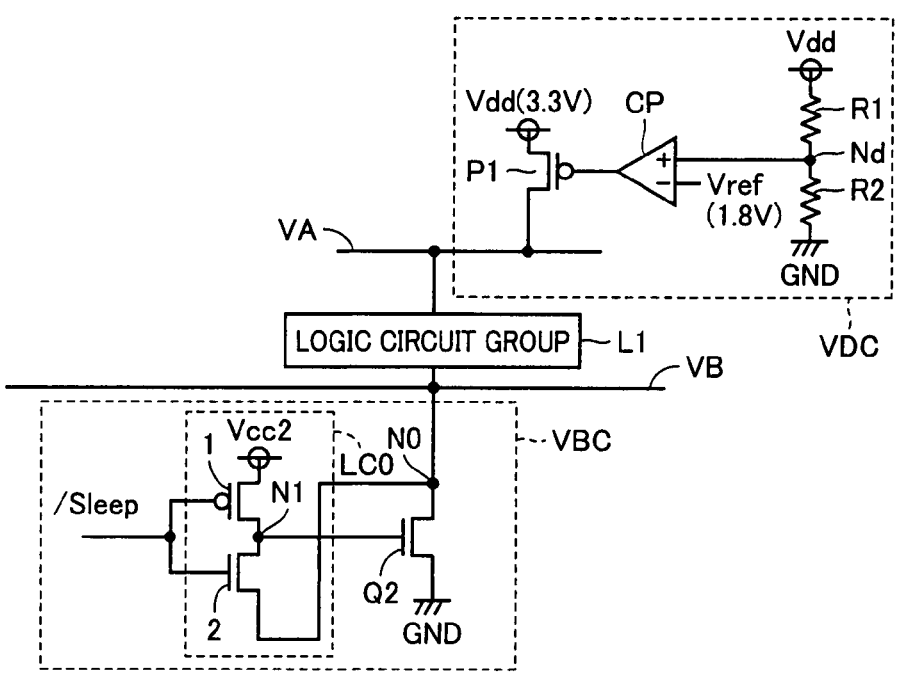

Referring to FIGS. 2A-2C, an MTCMOS circuit according to the first embodiment of the invention will now be described. A logic circuit group L1 included in logic unit 100 will be described as a typical example of an internal circuit included in semiconductor device 10.

Referring to FIG. 2A, the MTCMOS circuit according to the first embodiment of the invention includes logic circuit group L1, a transistor P1 having a threshold voltage larger in absolute value than those of transistors forming logic circuit group L1, and a voltage supply control circuit VBC arranged between ground voltage GND supplied from ground line GL and a pseudo ground line VB. Pseudo ground line VB supplies ground voltage GND to logic unit 100, and forms a voltage supply interconnection.

Voltage supply control circuit VBC includes a transistor Q2 as well as P- and N-channel MOS transistors 1 and 2. The P- and N-channel MOS transistors may be merely referred to as the "transistors" hereinafter. Transistors 1 and 2 are arranged between a power supply voltage Vcc2 and a node N0 with a node N1 arranged therebetween. Transistors 1 and 2 form a logic circuit LC0. Each of transistors 1 and 2 receives on its gate a control signal /Sleep. Transistor Q2 is arranged between node N0 and ground voltage GND, and has a gate electrically coupled to node N1. Control signal /Sleep is input according to an active mode and a standby mode of the circuit and, in this embodiment, is provided, e.g., from CPU 50.

The active mode indicates a state in which logic circuit group L1 can operate to output signals according to a signal (e.g., a control signal provided from CPU 50, a clock signal or the like) provided to logic circuit group L1, and provides a signal. In other words, it indicates a state in which an operation current is passed by a switching operation of turning on and of the transistors forming logic circuit group L1. In the description of the embodiment, "on" of the transistor indicates a conductive state, and "off" indicates a non-conductive state.

The standby mode indicates a state in which the circuits forming logic circuit group L1 are not operating and, in other words, indicates an off state in which operation currents do not flow through the transistors forming logic circuit group L1. Usually, an off current of the like of the transistor i.e., a current that is smaller in quantity than the operation current of the transistor in the active mode flows through the transistor forming logic circuit group L1.

When the semiconductor device (chip) is a semiconductor storage device such as an SRAM, such operations are performed in the active mode that a signal activating the semiconductor device (e.g., an activating signal for a chip select signal) is externally provided to the semiconductor device, and data reading or data writing is effected on memory cells. In the standby mode, such operations are performed that a signal deactivating the semiconductor device (e.g., a deactivating signal for the chip select signal) is externally provided to the semiconductor device, and memory cells hold data thereof.

Although this example shows a structure in which the voltage interconnections, i.e., power supply lines different from each other supply two power supply voltages Vcc1 and Vcc2, respectively, and the voltages are set, e.g., to 1.8V. However, the voltage values may be different from each other. For example, a threshold voltage Vth of a smaller absolute value of the transistor is from 0.3 V to 0.35 V. Threshold voltage Vth of a larger absolute value of the transistor is from 0.4 V to 0.45 V.

The following description will be primarily given on the MTCMOS circuit that includes logic circuit group L1 formed of the transistors of a low threshold voltage and voltage supply control circuit VBC formed of the transistors of a high threshold voltage. However, voltage supply control circuit VBC according to the invention can be applied to structures other than the above MTCMOS circuit. Thus, it can be applied to the case in which the transistors forming logic circuit group L1, transistor P1 and the transistors (transistors Q2, 1) forming voltage supply control circuit VBC have the same threshold voltage. This is true also with respect to the following modification and embodiments.

An operation of the MTCMOS circuit according to the first embodiment of the invention will now be described.

In the active mode, control signal /Sleep is at the "L" level. Thereby, transistor P1 is on and electrically couples power supply voltage Vcc1 to a pseudo power supply line VA. Pseudo power supply line VA supplies power supply voltage Vcc1 to logic unit 100, and forms a voltage supply interconnection.

Since control signal /Sleep provided to voltage supply control circuit VBC is at the "L" level, transistor 1 is turned on to couple electrically power supply voltage Vcc2 to node N1, and transistor Q2 is turned on. Thereby, pseudo ground line VB is electrically coupled to ground voltage GND.

Therefore, logic circuit group L1 is supplied with a voltage required for operations, and executes a predetermined operation.

In the standby mode, control signal /Sleep attains the "H" level. Thereby, transistor P1 is turned off to isolate electrically power supply voltage Vcc1 from pseudo power supply line VA.

Control signal /Sleep provided to voltage supply control circuit VBC is at the "H" level so that transistor 2 is turned on, and transistor 1 is turned off.

In this operation, nodes N1 and N0 are electrically coupled together.

In the active mode, since transistor 1 is turned on to couple electrically power supply voltage Vcc2 to node N1, a gate region of transistor Q2 including node N1 has accumulated the charged electric charges.

Therefore, the charged charges in node N1, i.e., the charges charged and stored in the region connected to the gate of transistor Q2 are discharged to node N0 in response to the turn-on of transistor 2. Thereby, the charges accumulated in node N1 are discharged to node N0 immediately after the start of the standby mode, in contrast to the case where the potential level of pseudo ground line VB is gradually charged by the leak current of power supply voltage Vcc1 in the standby mode. Therefore, the quantity of current pulled out from power supply voltage Vcc1 can be small.

In this structure, nodes N0 and N1 are electrically coupled together in the standby mode as described above. Thus, the diode connection is made in transistor Q2. Therefore, when the potential of pseudo ground line VB rises to the voltage level of the threshold voltage of transistor Q2, transistor Q2 starts to be turned on, and the current starts to flow from pseudo ground line VB via transistor Q2. Thus, when the potential of node N1 rises to the threshold voltage of transistor Q2, transistor Q2 is completely turned on. Otherwise, the degree of turn-on is lower than the above.

Figure 39:
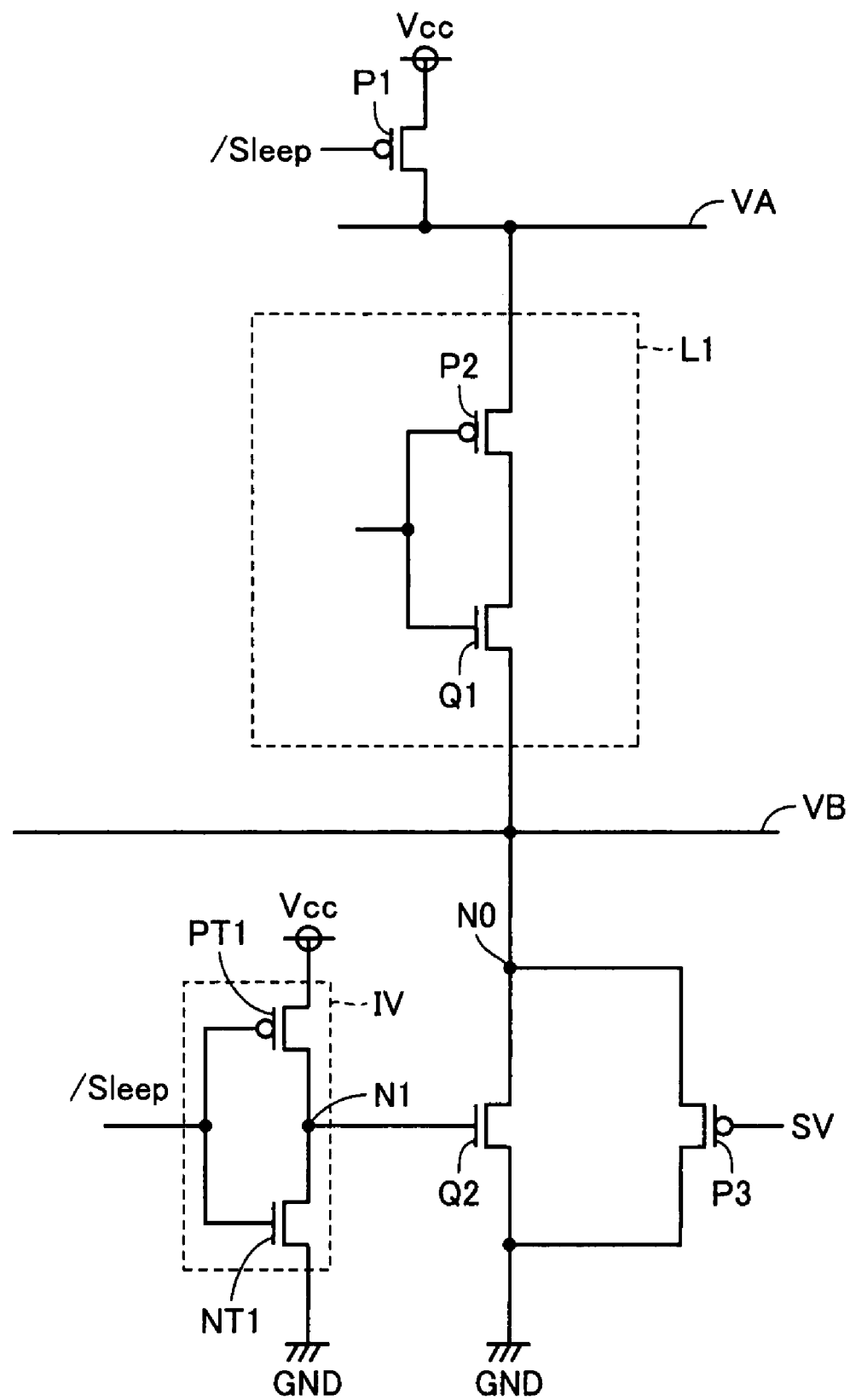
FIG. 39 illustrates another conventional MTCMOS circuit.
Figure 40:
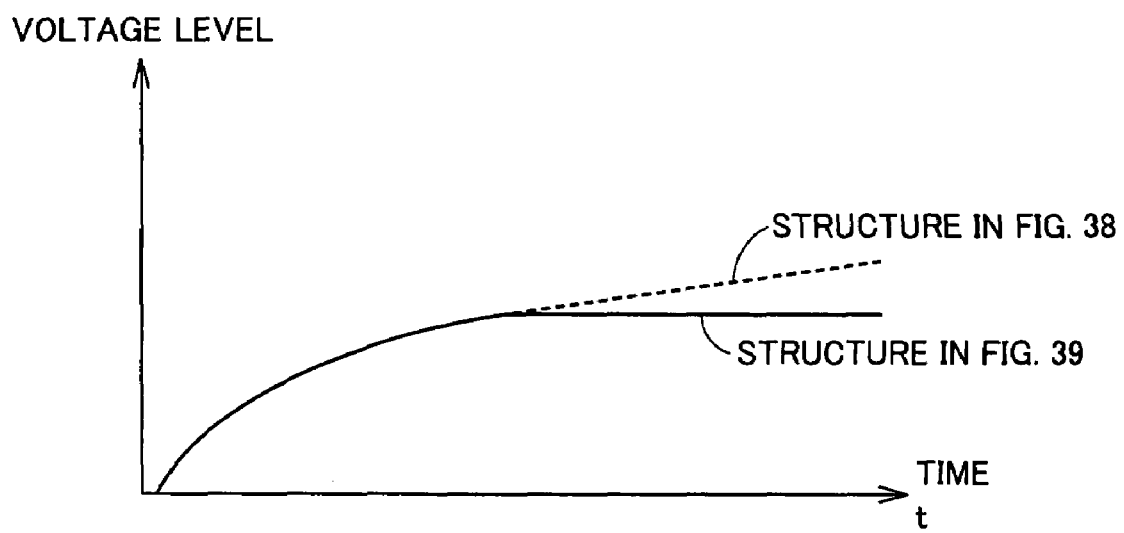
FIG. 40 illustrates a potential level of a pseudo ground line in FIGS. 38 and 39 rising with time.

When the voltage on pseudo ground line VB excessively rises, the above structure operates to lower the voltage on pseudo ground line VB, and has the effect of adjusting the voltage level. Therefore, an additional element P3, which is used in the conventional structure FIG. 39, is not required for adjusting the voltage level, and an area of the circuits can be reduced.

In the above structure, transistor 2 is connected to ground voltage GND via transistor Q2. In the standby mode, the quantity of current flowing through transistor Q2 is smaller than that in the on state. Therefore, the current reducing effect of transistor Q2 can reduce the leak current flowing via transistor 2 to ground voltage GND.

From a result of a simulation of the embodiment, it has been determined that the current can be reduced by 10% as compared with the conventional structure.

Therefore, the leak current of logic circuit LC0 can be reduced, and the power consumption of the whole circuit can be reduced.

Further, the level of the potential of node N0 attains a balanced state when a sum of the quantities of the current flowing to pseudo ground line VB via logic circuit group L1 and the current flowing to pseudo ground line VB via logic circuit LC0 is balanced with a quantity of the current flowing to ground voltage GND via transistor Q2. This balanced potential depends on the threshold voltage, the transistor width and the like of transistor Q2.

Although the description has been given on the structure of FIG. 2A that has transistor P1 arranged between power supply voltage Vcc1 and pseudo power supply line VA, the invention can be likewise applied to a structure of FIG. 2B in which transistor P1 and pseudo power supply line VA are eliminated, and power supply voltage Vcc1 is directly supplied to logic circuit group L1.

The invention can be applied to still another structure of FIG. 2C in which transistor P1 is used as a driver transistor of a voltage down converter VDC.

FIG. 2C shows an example of a structure in which a power supply voltage Vdd of 3.3 V is stepped down to supply a voltage of 1.8 V (=Vcc2) to pseudo power supply line VA. Voltage down converter VDC includes a driver transistor P1, a comparator CP and resistances R1 and R2. Driver transistor P1 is arranged between power supply voltage Vdd and pseudo power supply line VA, and receives an output signal of comparator CP on its gate. Comparator CP makes a comparison between the voltage on an internal node Nd and a reference voltage Vref, and provides a result of the comparison. More specifically, when the voltage on internal node Nd is higher than reference voltage Vref (1.8 V), it provides the output at the "H" level so that driver transistor P1 is turned off. When the voltage on internal node Nd is lower than reference voltage Vref (1.8 V), it provides the output at the "L" level so that drive transistor P1 is turned on. Resistances R1 and R2 are connected in series between power supply voltage Vdd and ground voltage GND with internal node Nd therebetween. The resistance division based on resistances R1 and R2 is adjusted to place the voltage of about 1.8 V on internal node Nd when power supply voltage Vdd is 3.3 V.

According to the above structure, transistor P1 illustrated in FIG. 2A can be used as driver transistor P1 in the final stage of voltage down converter VDC.

Although the following description will be given primarily in connection with the structure in FIG. 2A, the invention can similarly applied to other structures. The description has been given by way of example on the structure in which two power supply voltages Vcc1 and Vcc2 are supplied. However, power supply voltage Vcc is used in the following description for the sake of simplicity.

Figure 3:
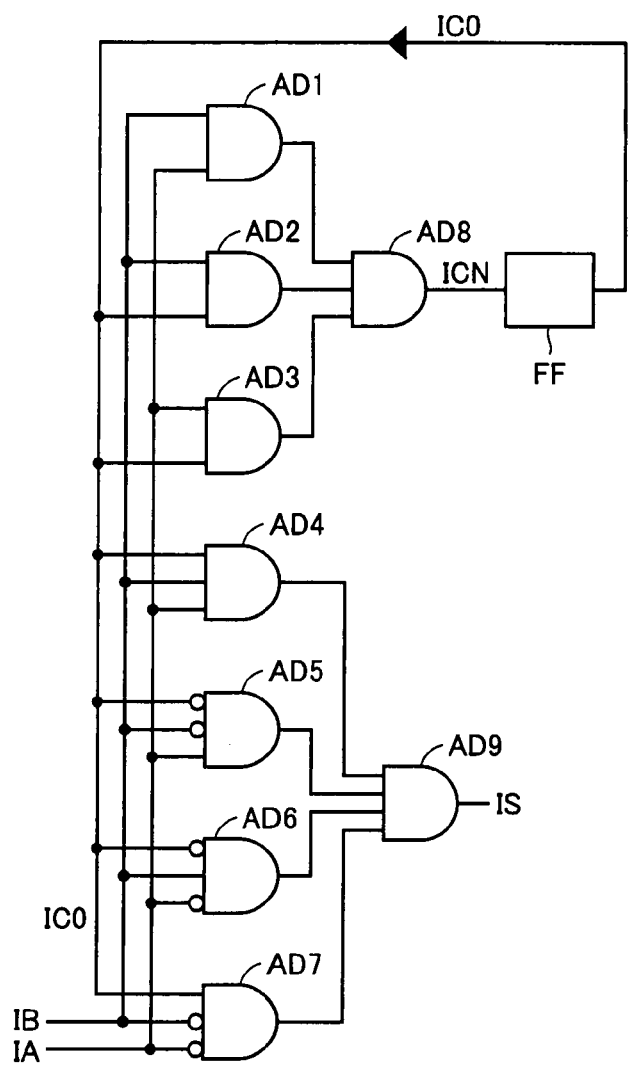
FIG. 3 shows an example of an arithmetic and logic unit forming a logic circuit group L1.

Referring to FIG. 3, an arithmetic and logic circuit forming logic circuit group L1 will now be described.

FIG. 3 shows a full adder as an example of the arithmetic and logic circuit. More specifically, AND circuits AD1-AD9 and a flip-flop circuit FF are arranged.

AND circuit AD1 provides a result of logical AND between input data IA and IB to one of input nodes of AND circuit AD8. AND circuit AD2 provides a result of logical AND between input data IB and IC0 to one of input nodes of AND circuit AD8. AND circuit AD3 provides a result of logical AND between input data IA and IC0 to one of input nodes of AND circuit AD8. AND circuit AD8 receives results provided from AND circuits AD1-AD3, and provides a result of logical AND of them to flip-flop circuit FF as an output data ICN. Flip-flop circuit FF receives and holds output data ICN provided from AND circuit AD8. When next input data IA and IB are input, flip-flop circuit FF provides output data ICN as input data IC0.

AND circuit AD4 provides a result of logical AND of input data IA, IB and IC0 to one of the input nodes of AND circuit AD9. AND circuit AD5 provides a result of logical AND of the inverted data of input data IC0, the inverted data of input data IB and input data IA to one of input nodes of AND circuit AD9. AND circuit AD6 provides a result of logical AND of the inverted data of input data IC0, input data IB and the inverted data of input data IA to one of input nodes of AND circuit AD9. AND circuit AD7 provides a results of logical AND of input data IC, the inverted data of input data IA and the inverted data of input data IB to one of input nodes of AND circuit AD9. AND circuit AD9 provides a results of the logical AND of the output data of AND circuits AD4-AD7 as output data IS. Output data IS is a sum data of input data IA and IB, and output data ICN is carry data.

Although the full adder has been described as an example of logic circuit group L1, logic circuit group L1 is not restricted to the above structure, and may be formed of various circuits such as inverters, NAND circuits, NOR circuits and the like as well as a combination thereof. Also, it may be formed of arithmetic and logic units (ALUs) such as subtractors, multipliers and the like.

Figure 4:
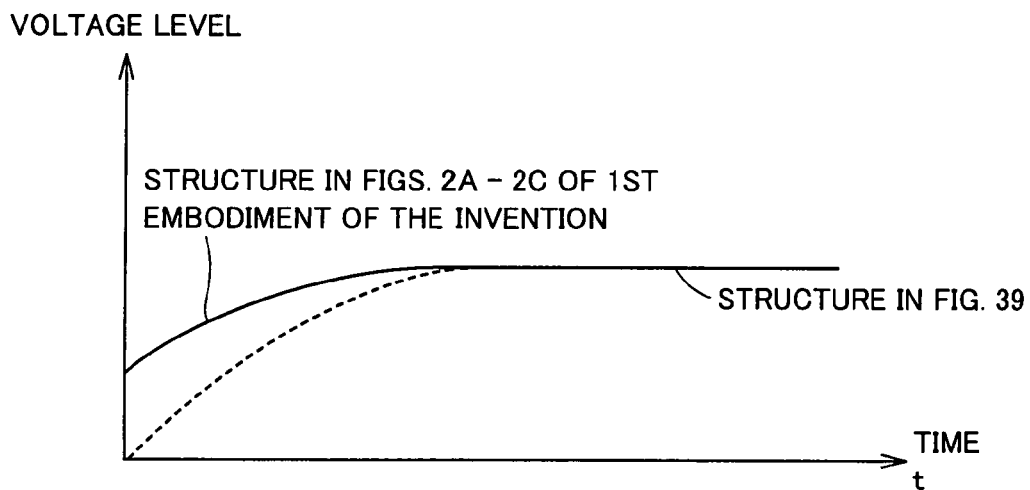
FIG. 4 illustrates a voltage level of a pseudo ground line of the MTCMOS circuit according to the first embodiment of the invention.

Referring to FIG. 4, description will now be given on the voltage level of the pseudo ground line of the MTCMOS circuit according to the first embodiment of the invention. Waveforms illustrated therein are obtained by a simulation performed with transistor Q2 having a length l of 0.18 μm and a width w of 0.94 μm, transistor 2 having a length l of 0.18 μm and a width of 0.94 μm, transistor 1 having a length l of 0.18 μm and a width of 1.14 μm, and logic circuit group L1 having a current path that is formed of transistors each having a length l of 0.18 μm. Among these transistors, N-channel MOS transistors have a total width (w) of 19.5 μm, and P-channel MOS transistors have a total width (w) of 20.84 μm.

As already described, when the structure merely employs only transistor Q2, the potential level of pseudo ground line VB gradually rises with time, approaches the potential level of pseudo power supply line VA and will attain the balanced state at a predetermined potential level.

Referring to FIG. 4, the conventional structure illustrated in FIG. 39 employs transistor P3 in parallel with transistor Q2 for the purpose of adjusting the potential level of pseudo ground line, and performs the adjustment to lower the balanced potential. According to this configuration, charges are pulled out from the side of power supply voltage Vcc until the balanced potential is attained.

According to the structure of the first embodiment of the invention, however, the charged charges accumulated in node N1 connected to the gate of transistor Q2 can be used for raising the potential of pseudo ground line VB so that the low power consumption can be achieved by efficiently using the charged charges. During the standby, nodes N0 and N1 are electrically coupled to provide diode connection in transistor Q2 so that the potential of pseudo ground line VB can be adjusted to a low level. Therefore, the structure can also achieve the effect of suppressing the potential rising without employing transistor P3.

Therefore, the voltage supply control circuit according to the first embodiment of the invention can reduce the power consumption as compared with the conventional structure. Although transistor P3 for adjusting the balanced potential can be additionally employed, components of the circuits can be reduced in number by eliminating transistor P3, which results in the circuit structure that is advantageous in layout and cost.

First Modification of the First Embodiment

Figure 5:
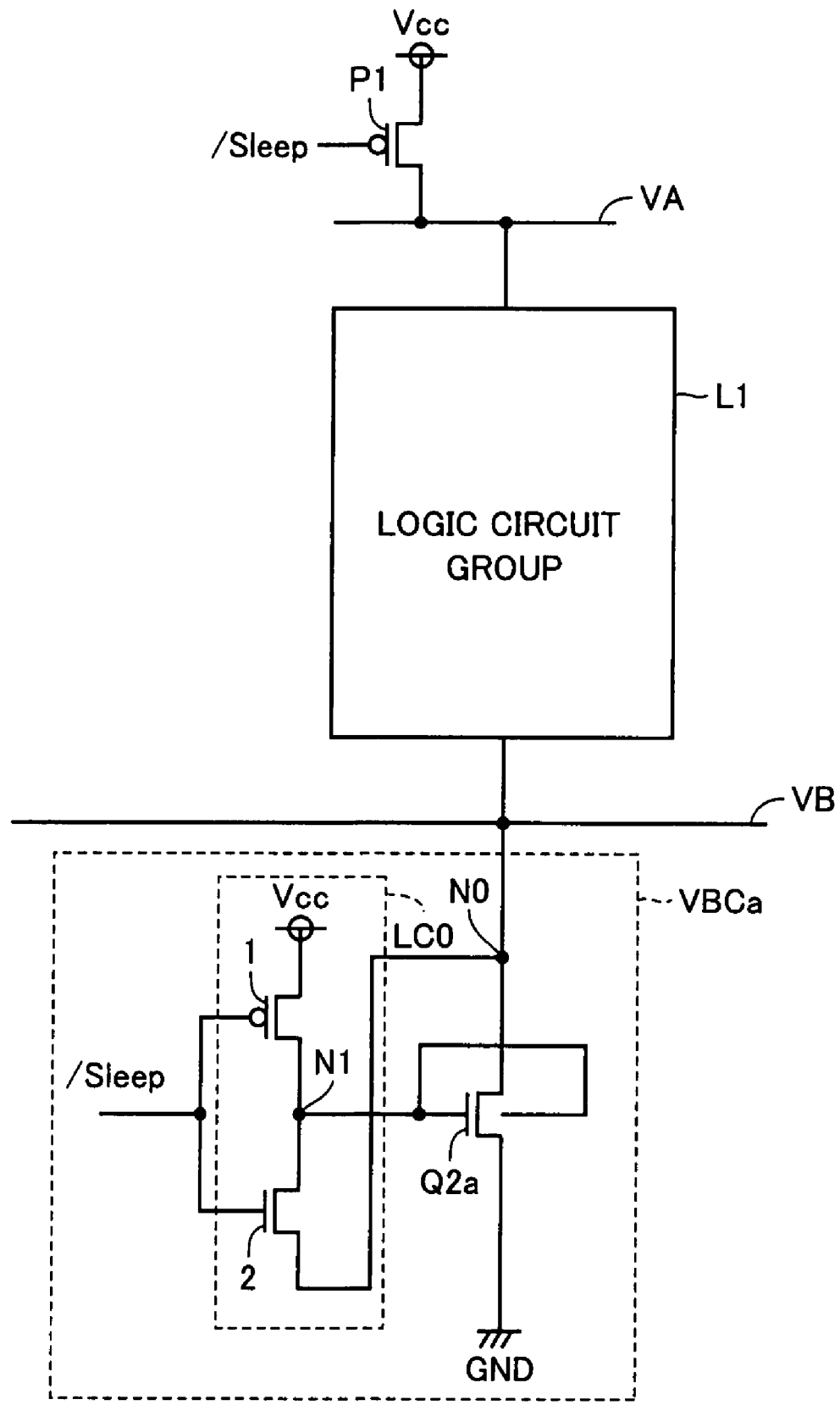
FIG. 5 illustrates an MTCMOS circuit according to a first modification of the first embodiment of the invention.

FIG. 5 illustrates an MTCMOS circuit according to a first modification of the first embodiment of the invention.

Referring to FIG. 5, the MTCMOS circuit according to the first modification of the first embodiment of the invention differs from the foregoing structure in that voltage supply control circuit VBC is replaced with a voltage supply control circuit VBCa. Other structures are substantially the same, and therefore description thereof is not repeated.

Voltage supply control circuit VBCa includes a transistor Q2a in place of transistor Q2, and transistor Q2a has a gate electrically coupled to a back gate thereof. When a back gate bias is applied to transistor Q2a, a forward bias is applied to lower a threshold of transistor Q2a.

Therefore, such a situation is attained that even a low voltage level of node N1 can readily turn on transistor Q2a, and this lowers the balanced potential of pseudo ground line VB. Thereby, the balanced potential of pseudo ground line VB can be adjusted. Since the capacity of node N1 increases, the charged charges can raise the potential to a larger extent.

According to the above structure, the balanced potential, e.g., of pseudo ground line VB is adjusted to a low level, and this adjustment can likewise ensure a sufficiently large potential difference between pseudo power supply line VA and pseudo ground line VB. In the active mode, the threshold of transistor Q2a is likewise low, and the circuit operation speed can be high.

Figure 6:
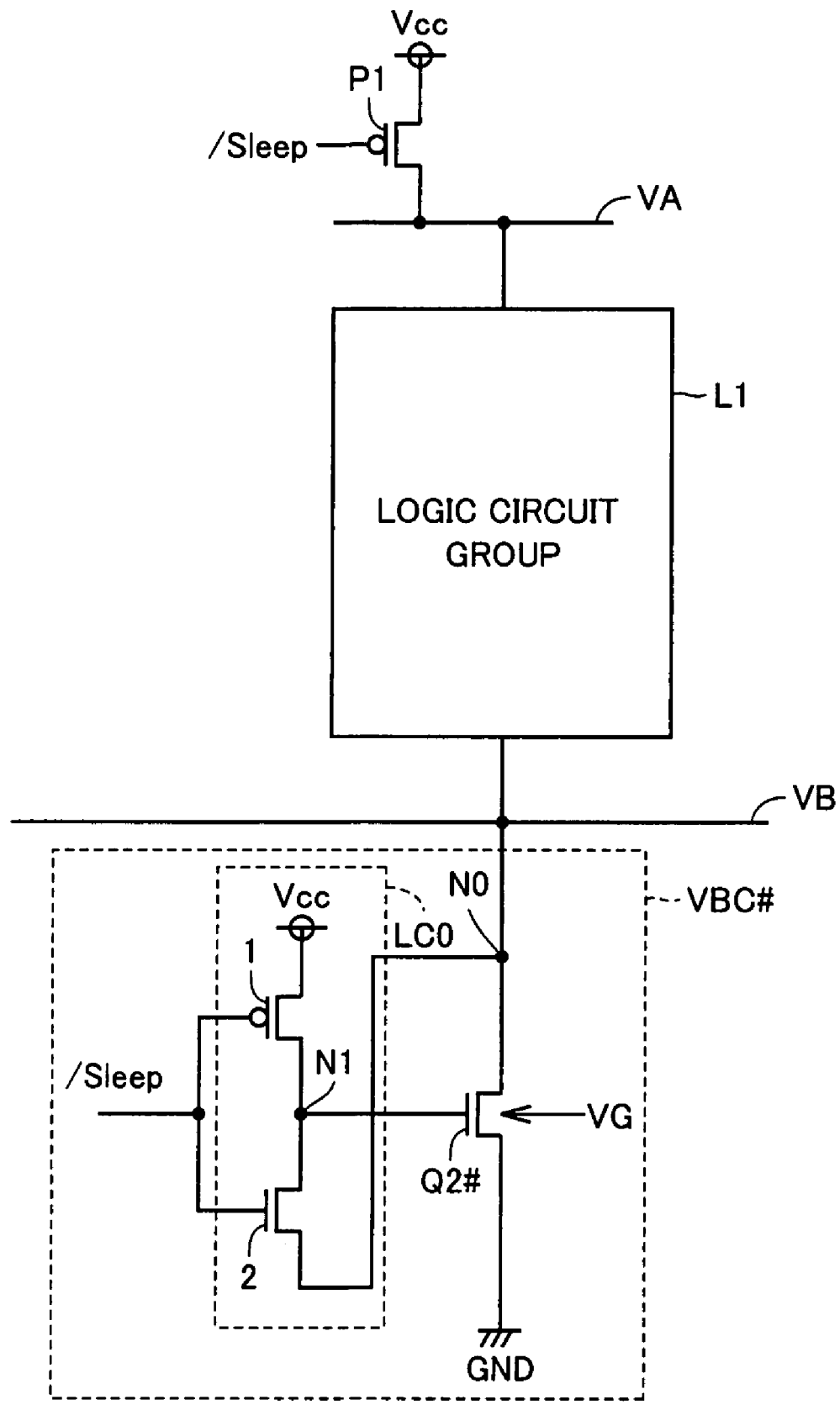
FIG. 6 illustrates another voltage supply control circuit according to the first modification of the first embodiment of the invention.

Referring to FIG. 6, description will now be given on a voltage supply control circuit VBC# according to a first modification of the first embodiment of the invention.

Referring to FIG. 6, this structure differs from the structure in FIGS. 2A-2C in that voltage supply control circuit VBC is replaced with a voltage supply control circuit VBC#.

Voltage supply control circuit VBC# includes a transistor Q2# in place of transistor Q2, and a bias is directly applied to its back gate in contrast to the structure of electrically coupling the gate and the back gate together as illustrated in FIG. 5. This structure can achieve the substantially same as that illustrated in FIG. 5.

Figure 7:
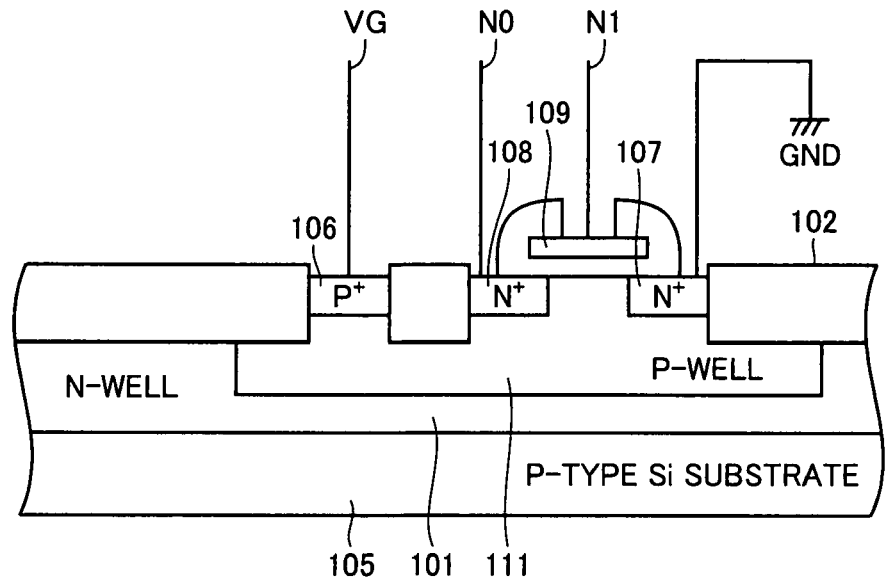
FIG. 7 illustrates a transistor according to the first modification of the first embodiment of the invention.

Referring to FIG. 7, description will now be given on transistor Q2# according to the first modification of the first embodiment of the invention.

Referring to FIG. 7, a P-well region 111 is formed in an N-well region 101 formed on a P-type silicon (Si) substrate 105, and $N^+$-well impurity regions 107 and 108 are formed in P-well region 111 to provide source and drain regions, respectively. An isolating oxide film 102 is formed at a region other than the impurity regions at the well surface. A gate 109 is arranged between the source and drain regions, and is electrically coupled to node N1. The source and drain regions are electrically coupled to ground voltage GND and node N0, respectively. A P-type impurity region 106 is arranged as a back gate voltage in P-well 111, and is supplied with a voltage VG as a back gate bias. The structure of transistor Q2# in which voltage VG is applied to impurity region 106 as a back gate voltage has been described. Transistor Q2a has a similar structure (not shown) except for that impurity region 106 is electrically coupled to node N1, and therefore description thereof is not repeated. Although the back gate bias has been described, such a structure may be employed that the gate of transistor Q2a is electrically coupled to the substrate to apply a substrate bias, and thereby a similar effect can be achieved.

Description will now be given on a transistor structure in which a back gate voltage can be applied in another manner.

Figure 8A:
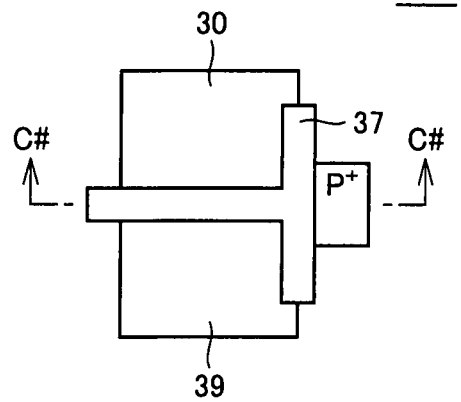
FIGS. 8A and 8B illustrate a transistor having a T-shaped gate.
Figure 8B:
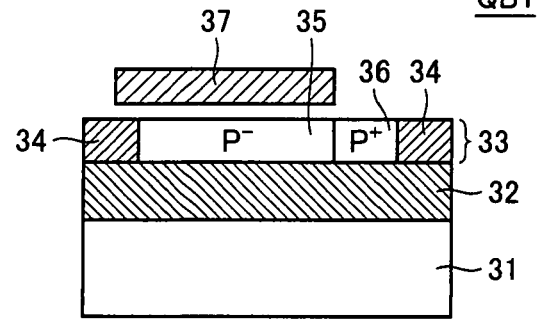

Referring to FIGS. 8A and 8B, a transistor QB1 having a T-shaped gate will now be described. FIG. 8A is a plan of transistor QB1 having a back gate potential fixed structure achieved by a T-shaped gate. FIG. 8B illustrates a sectional structure of a transistor QB1 taken along line C#-C# in FIG. 8A.

As shown therein, transistor QB1 having the back gate potential fixed structure is formed on an SOI substrate that is formed of a silicon substrate 31, a buried insulating film 32 and an SOI layer 33. SOI layer 33 is provided with a complete isolation film 34 that extends from the surface of SOI layer 33 to buried insulating film 32. Complete isolation film 34 formed around SOI layer 33 insulates and isolates SOI layer 33 from neighboring elements (transistors) so that transistor QB1 of the back gate potential fixed structure can be formed in SOI layer 33.

In SOI layer 33, a $P^-$-body region 35 and a body contact region 36 neighbors to each other. A T-shaped gate electrode 37 is formed on $P^-$-body region 35 (channel region) between a drain region 39 and source region 30 with a gate insulating film (not shown) therebetween. A lateral portion of the T-shape of gate electrode 37 is formed on a boundary region between $P^-$-body region 35 and body contact region 36.

Body contact region 36 in transistor QB1 having the back gate potential fixed structure described above can be electrically connected to T-shaped gate electrode 37 or source region 30 via an external interconnection such as an aluminum interconnection.

Figure 9A:
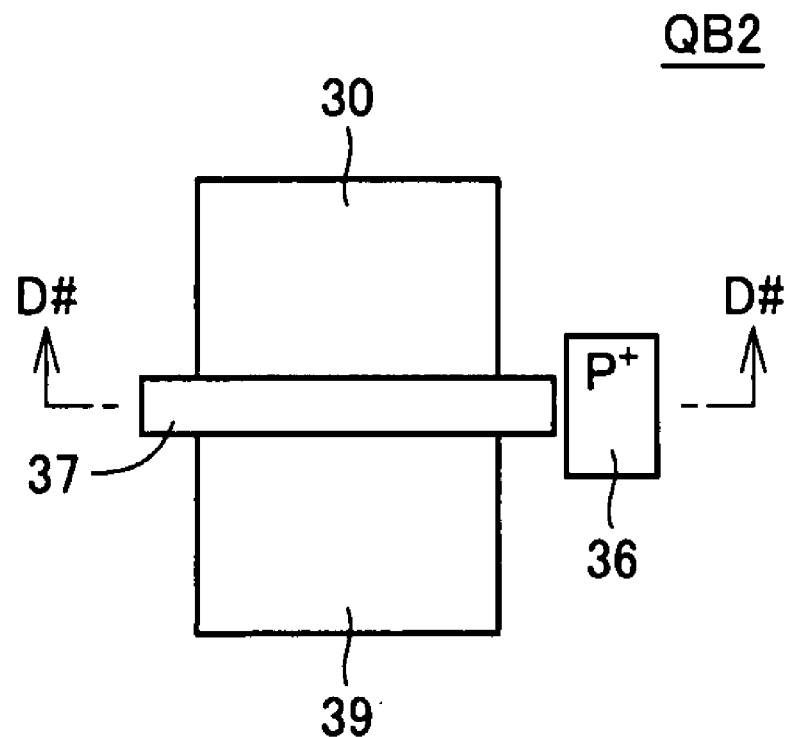
FIGS. 9A and 9B illustrate a transistor having a partially trench-isolated structure.
Figure 9B:
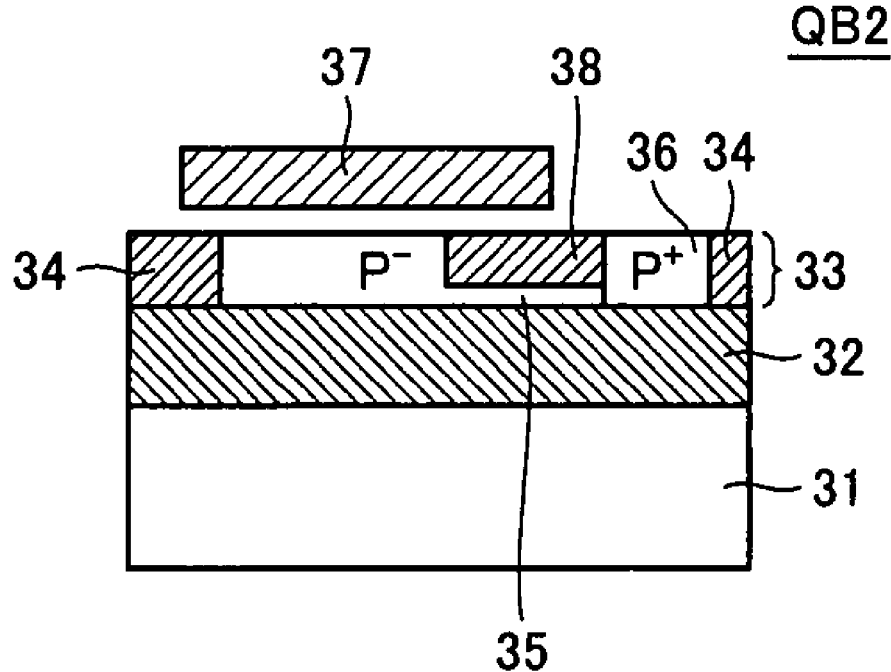

Referring to FIGS. 9A and 9B, description will now be given on a transistor QB2 of a partial trench isolating structure.

FIG. 9A is a plan showing transistor QB2 of the back gate potential fixed structure. FIG. 9B shows a sectional structure of transistor QB2 taken along line D#-D# in FIG. 9A.

Transistor QB2 of the back gate potential fixing structure shown in these figures is formed in SOI layer 33 that is isolated from other surrounding elements by complete isolation film 34, similarly to transistor QB1 of the back gate potential fixed structure.

In SOI layer 33, P—body region 35 and body contact region 36 are formed with a partial isolation film 38 therebetween. Since a portion (35) of $P^-$-body region 35 is formed under partial isolation film 38, the portion (35) of $P^-$-body region 35 under partial isolation film 38 electrically connects $P^{--}$-body region 35 to body contact region 36.

Gate electrode 37 is formed on $P^-$-body region 35 (channel region) located between source and drain regions 30 and 39 with a gate insulating film (not shown) therebetween. Body contact region 36 in transistor QB2 of the back gate potential fixed structure described above can be electrically connected to gate electrode 37 or source region 30 via an external interconnection such as an aluminum interconnection.

Second Modification of the First Embodiment

Voltage supply control circuit VBC has been described on the structure in which the turn-on/off of transistor Q2 is controlled in response to a single input signal, i.e., control signal /Sleep. A second modification will now be described on a structure in which the turn-on/off of transistor Q2 is controlled based on a combination of two input signals, i.e., control signals SleepA and SleepB.

Figure 10:
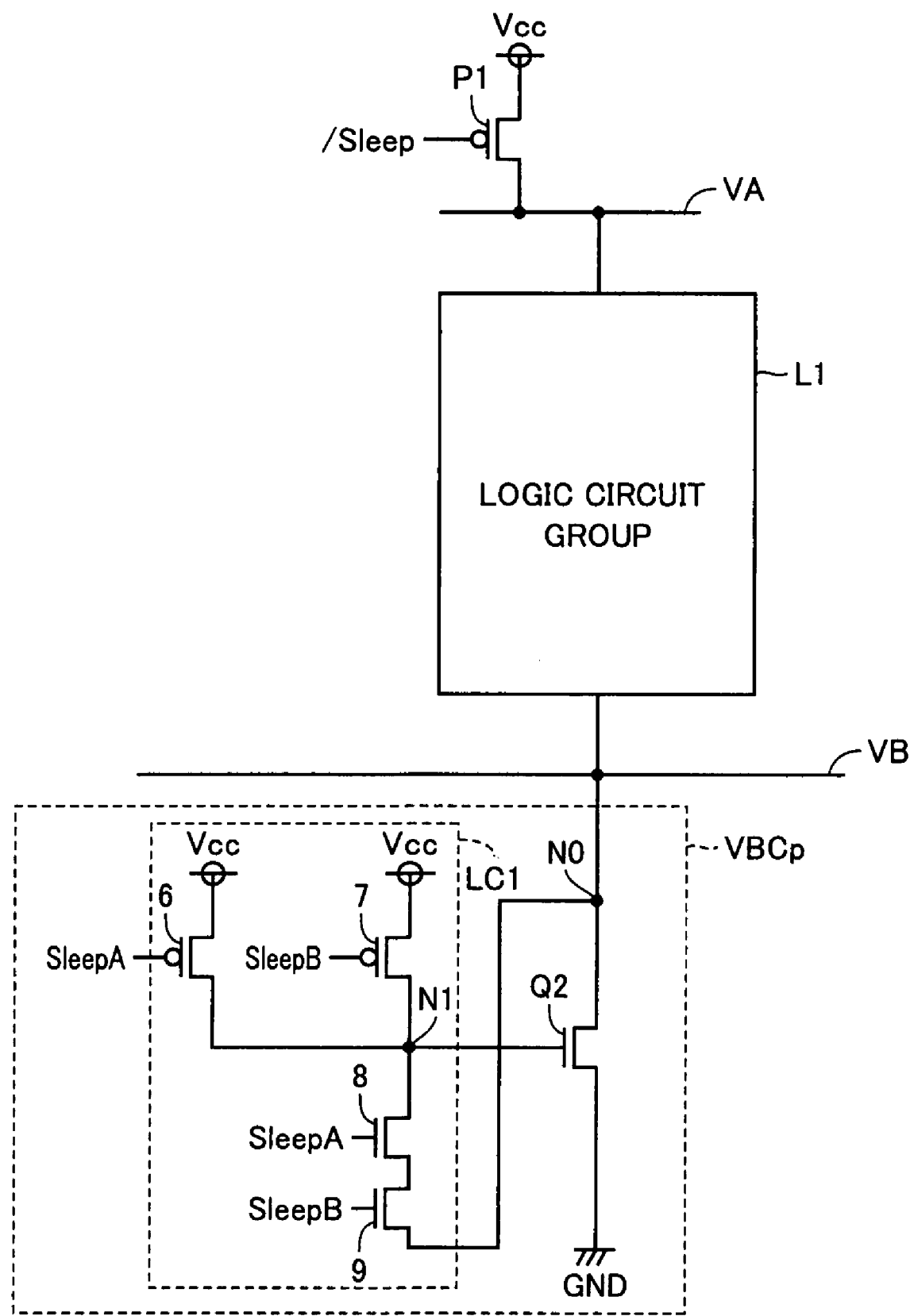
FIGS. 10-14 illustrate MTCMOS circuits according to second to sixth modifications of the first embodiment of the invention, respectively.

Referring to FIG. 10, description will now be given on an MTCMOS circuit according to the second modification of the first embodiment of the invention.

Referring to FIG. 10, the MTCMOS circuit according to the second modification of the first embodiment of the invention differs from the foregoing structure in that voltage supply control circuit VBC is replaced with a voltage supply control circuit VBCp. Other structures are substantially the same, and therefore description thereof is not repeated. Voltage supply control circuit VBCp includes transistors 6-9 and transistor Q2.

Transistors 6 and 7 are P-channel MOS transistors, and are connected in parallel between power supply voltage Vcc and node N1. Transistors 6 and 7 receive control signals SleepA and SleepB on their gates, respectively.

Transistors 8 and 9 are N-channel MOS transistors, and are connected in series between nodes N1 and N0. Transistors 8 and 9 receive control signals SleepA and SleepB on their gates, respectively. Transistors 6-9 form a logic circuit LC1.

Transistors 6-9 have threshold voltages higher in absolute value than the threshold voltages of the transistors forming logic circuit group L1, but may have threshold voltages equal in absolute value to those of the transistor forming logic circuit group L1 as described before. When transistors 6-9 have threshold voltages higher in absolute value than the threshold voltages of the transistors forming logic circuit group L1, such a situation can be suppressed that a current leaks to node N0 via node N1 and transistors 8 and 9 in the active mode.

More specifically, description will now be given on the manner of controlling the turn-on/off of transistor Q2 based on a result of logical NAND of two input control signals SleepA and SleepB.

In this example, at least one of control signals SleepA and SleepB attains the "L" level in the active mode. For example, when control signals SleepA and SleepB are at the "H" and "L" levels, respectively, transistor 6 or 7 is turned on to couple electrically node N1 to power supply voltage Vcc, and node N1 attains the "H" level.

Thereby, transistor Q2 is turned on to couple electrically node N0 to ground voltage GND, and pseudo ground line VB is supplied with ground voltage GND.

In the standby mode, control signals SleepA and SleepB are both set to the "H" level. Thereby, both transistors 6 and 7 are turned off, and both transistors 8 and 9 are turned on to couple electrically nodes N1 and N0 together. Therefore, the charged charges in node N1 are discharged to node N0 to raise the potential, and nodes N0 and N1 are electrically coupled to achieve diode connection in transistor Q2.

Similarly to the first embodiment, therefore, the charged charges in node N1, i.e., the charged charges stored in the region connected to the gate of transistor Q2 are discharged to node N0, and this can reduce the quantity of the current pulled out from power supply voltage Vcc to reduce the power consumption.

When the potential of node N0 is at the level that achieves a balance between the quantity of the current passing to pseudo ground line VB via logic circuit group L1 and a quantity of the current passing to ground voltage GND via transistor Q2, the potential at this level attains the balanced state.

In the above case, transistors 6 and 7 are electrically coupled to node N1. Therefore, as compared with the structure of the inverter formed of transistors 1 and 2 illustrated in FIGS. 2A-2C, a larger capacity load is applied to node N1 so that a larger amount of charges are charged when nodes N1 and N0 are electrically coupled. Therefore, the quantity of the current pulled out from power supply voltage Vcc is further reduced, and the power consumption is further reduced.

Description has been given by way of example on the manner in which the on/off of transistor Q2 is controlled based on a result of the logical NAND of two control signals SleepA and SleepB. However, the modification can be applied not only to the NAND circuit executing the logical NAND but also to another circuit or the like that controls on/off of transistor Q2 according to the control signal. For example, a logic circuit such as an NOR or XOR circuit can naturally be employed.

Third Modification of the First Embodiment

Figure 11:
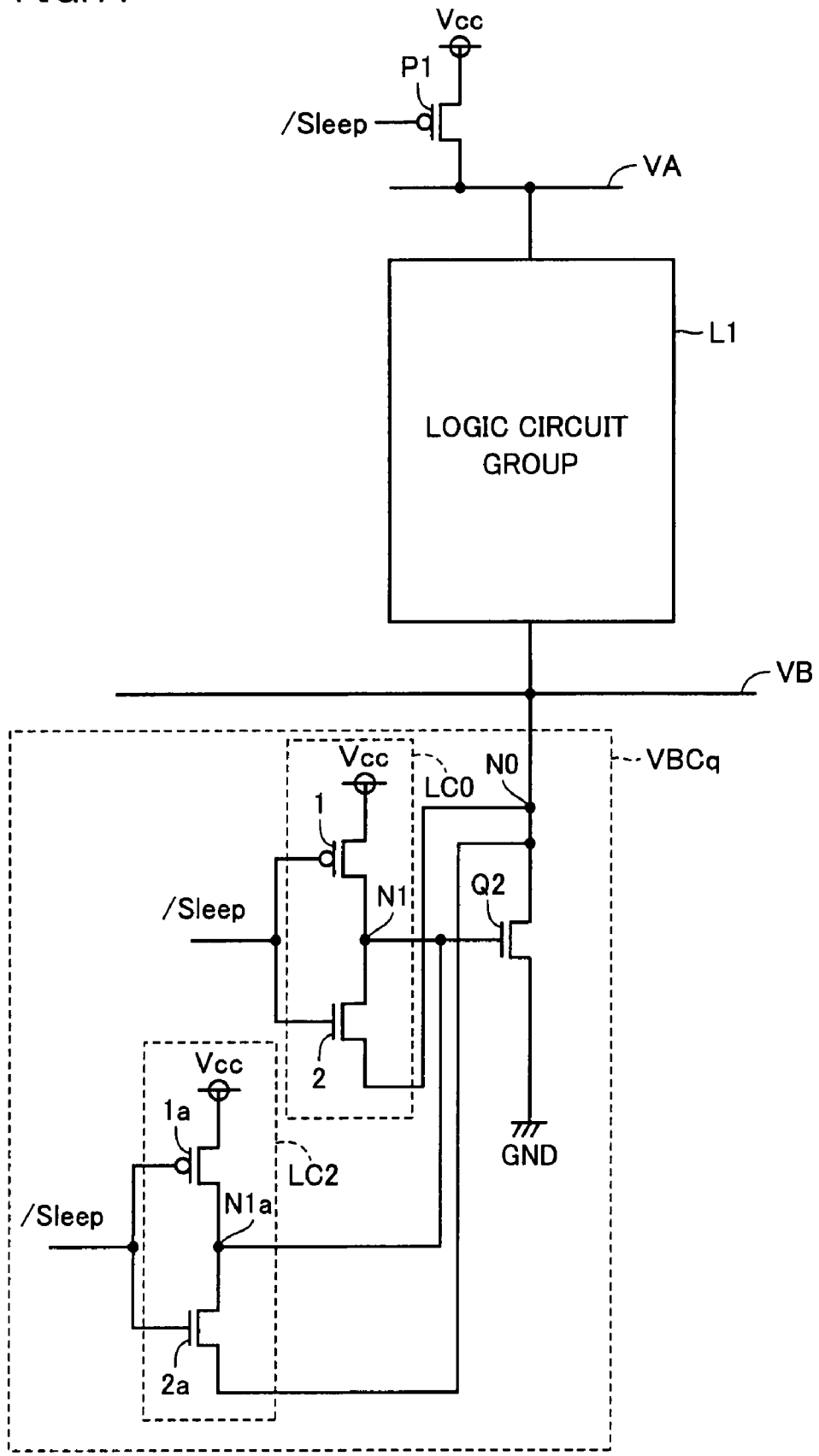

FIG. 11 illustrates an MTCMOS circuit according to a third modification of the first embodiment of the invention.

Referring to FIG. 11, the MTCMOS circuit according to the third modification of the first embodiment of the invention differs from the foregoing structure in that voltage supply control circuit VBC is replaced with a voltage supply control circuit VBCq. Voltage supply control circuit VBCq according to the third modification of the first embodiment of the invention differs from voltage supply control circuit VBC illustrated in FIGS. 2A-2C in that transistors 1a and 2a are additionally employed.

Similarly to transistors 1 and 2, transistors 1a and 2a are connected between power supply voltage Vcc and node N0, and a connection node N1a between them is electrically coupled to node N1. Each of transistors 1a and 2a receives control signal /Sleep on its gate. Transistors 1a and 2a form a logic circuit LC2.

In the active mode of this circuit structure, transistors 1 and 1a supply power supply voltage Vcc to node N1 so that transistor Q2 can be rapidly turned on, and the speed of switching to the active mode can be improved. In the standby mode, transistors 2 and 2a are turned on to couple electrically nodes N1 and N1a to node N0, and thereby can discharge the charged charges from nodes N1 and N1a.

Therefore, the quantity of the current pulled out from power supply voltage Vcc is reduced, and the power consumption can be further reduced.

Fourth Modification of the First Embodiment

Figure 12:
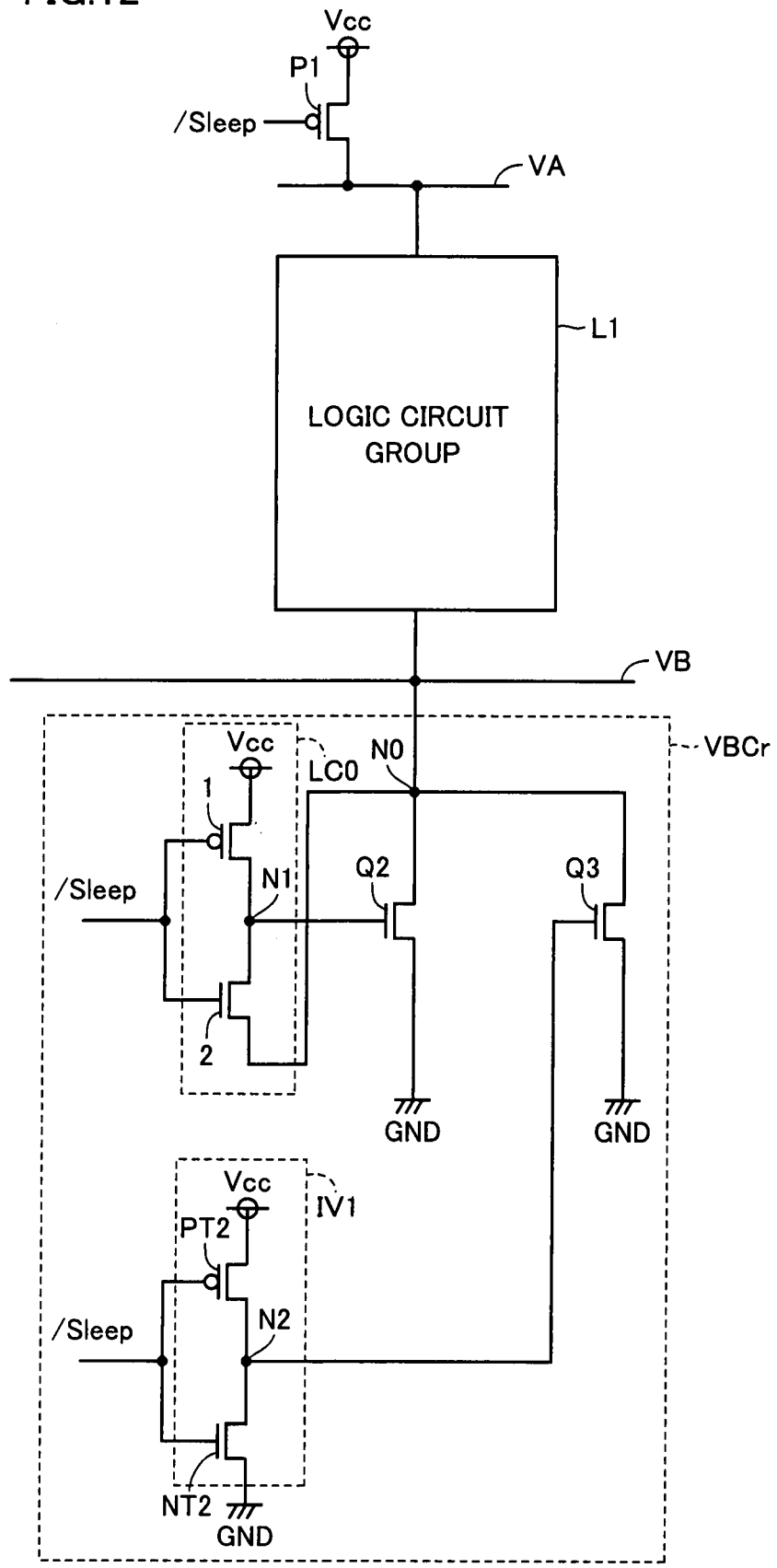

FIG. 12 illustrates an MTCMOS circuit according to a fourth modification of the first embodiment of the invention.

Referring to FIG. 12, the MTCMOS circuit according to the fourth modification of the first embodiment of the invention differs from the foregoing structure in that voltage supply control circuit VBC is replaced with a voltage supply control circuit VBCr.

Voltage supply control circuit VBCr differs from voltage supply control circuit VBC illustrated in FIGS. 2A-2C in that a transistor Q3 and transistors PT2 and NT2 are additionally employed.

Transistors PT2 and NT2 are arranged between power supply voltage Vcc and ground voltage GND, and a connection node N2 thereof is electrically coupled to a gate of transistor Q3 arranged between node N0 and ground voltage GND. Transistors PT2 and NT2 form a logic circuit, i.e., an inverter IV1.

More specifically, control signal /Sleep attains the "L" level to turn on transistors 1 and PT2 in the active mode. Thereby, nodes N1 and N2 are electrically coupled to power supply voltage Vcc to set the gates of transistors Q2 and Q3 to the "H" level, respectively. Therefore, transistors Q2 and Q3 are turned on to couple electrically pseudo ground line VB to ground voltage GND.

In the standby mode, control signal /Sleep attains the "H" level to turn on transistors 2 and NT2. Thereby, nodes N1 and N0 are electrically coupled together. Therefore, the diode connection is attained only in transistor Q2.

According to the above circuit structure, transistors 1 and PT1 operate to supply power supply voltage Vcc to nodes N1 and N2 in the active mode, and thereby can rapidly turn on transistors Q2 and Q3, respectively, so that the power supply speed in the active mode can be improved. In the standby mode, transistor 2 is turned on to couple electrically nodes N1 and N0, and thereby the charged charges in node N1 can be discharged so that the quantity of the current pulled out from power supply voltage Vcc is small, and the power consumption can be small.

In the structure described above, each of transistors Q2 and Q3 has the power supply drive capacity substantially equal to that of transistor Q2 illustrated in FIGS. 2A-2C. However, the sizes can be adjusted such that each of transistors Q2 and Q3 has the current drive capacity of "0.5", and these have the capacity of "1" in total. In this case, the voltage supply capacity does not change, but the balanced voltage of pseudo ground line VB in the sleep mode can be increased.

Fifth Modification of the First Embodiment

Figure 13:
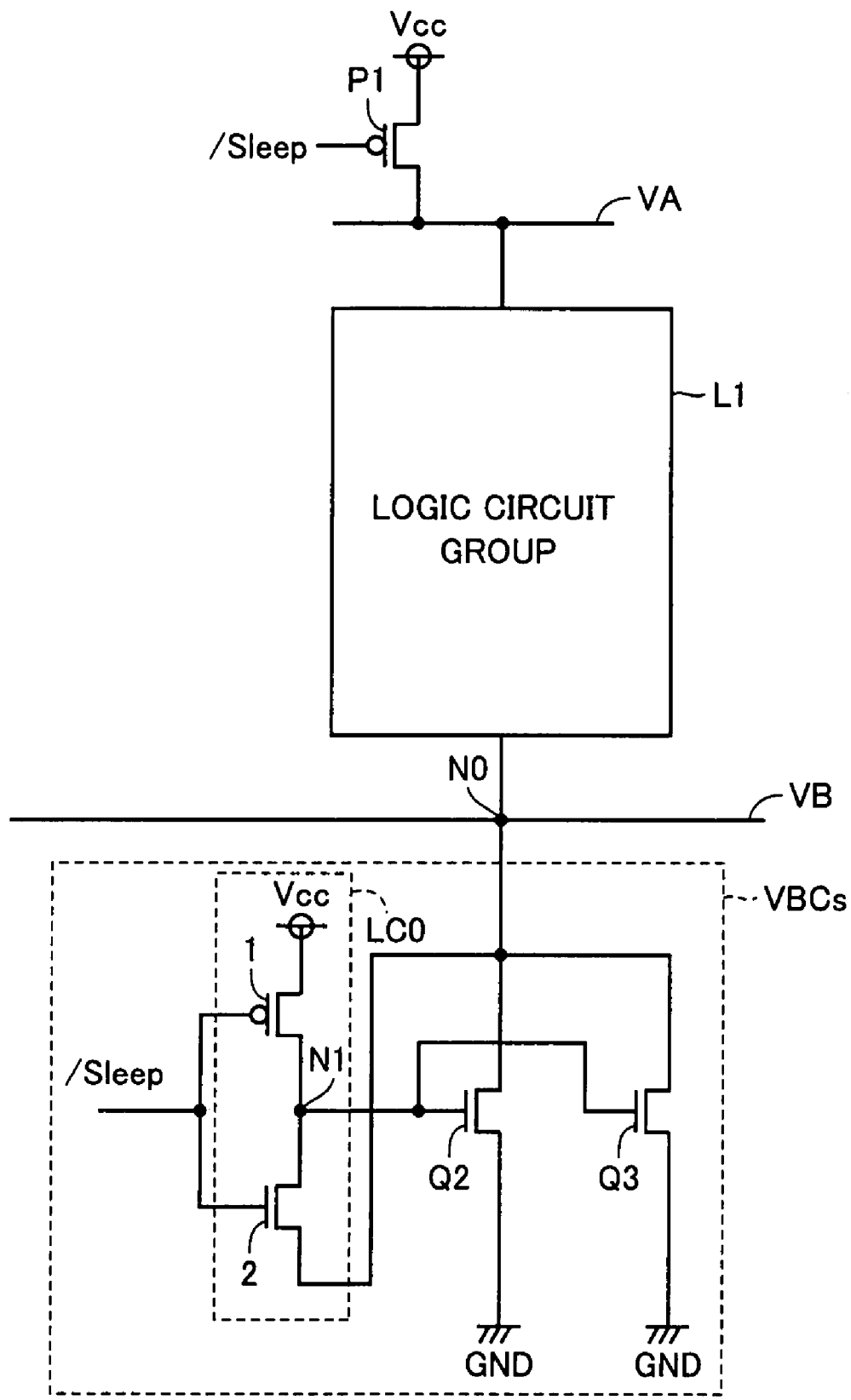

FIG. 13 illustrates an MTCMOS circuit according to a fifth modification of the first embodiment of the invention.

Referring to FIG. 13, the MTCMOS circuit according to the fifth modification of the first embodiment of the invention differs from the foregoing structure in that voltage supply control circuit VBC is replaced with a voltage supply control circuit VBCs.

Voltage supply control circuit VBCs differs from voltage supply control circuit VBC illustrated in FIGS. 2A-2C in that a transistor Q4 is further employed. Transistor Q4 is connected between node N0 and ground voltage GND, and has a gate electrically coupled to node N1. Thus, transistors Q2 and Q4 are connected in parallel between node N0 and ground voltage GND.

In this structure, both transistors Q2 and Q4 are turned on in response to control signal /Sleep. In the active mode, therefore, transistor 1 operates to supply power supply voltage Vcc to node N1 so that transistors Q2 and Q4 can be turned on, and the power supply speed in the active mode can be improved.

In this standby mode, transistor 2 is turned on to couple electrically node N1 to node N0, and thereby can discharge the charged charges from node N1. Node N1 is electrically coupled to the gate of each of transistors Q2 and Q4, and this increases the load capacity of node N1 so that the charged charges increase, and the charged charges supplied to node N0 in the standby mode increase.

Therefore, the quantity of the current pulled out from power supply voltage Vcc decreases, and the power consumption can further decreases.

In the structure described above, each of transistors Q2 and Q4 has the power supply drive capacity substantially equal to that of transistor Q2 illustrated in FIGS. 2A-2C. However, the sizes can be adjusted such that each of transistors Q2 and Q4 has the current drive capacity of "0.5", and these have the capacity of "1" in total. In this case, the voltage supply capacity does not change, but node N1 has a larger capacity so that the degree or magnitude of the potential rising caused by the charged charges can be increased.

Sixth Modification of the First Embodiment

Figure 14:
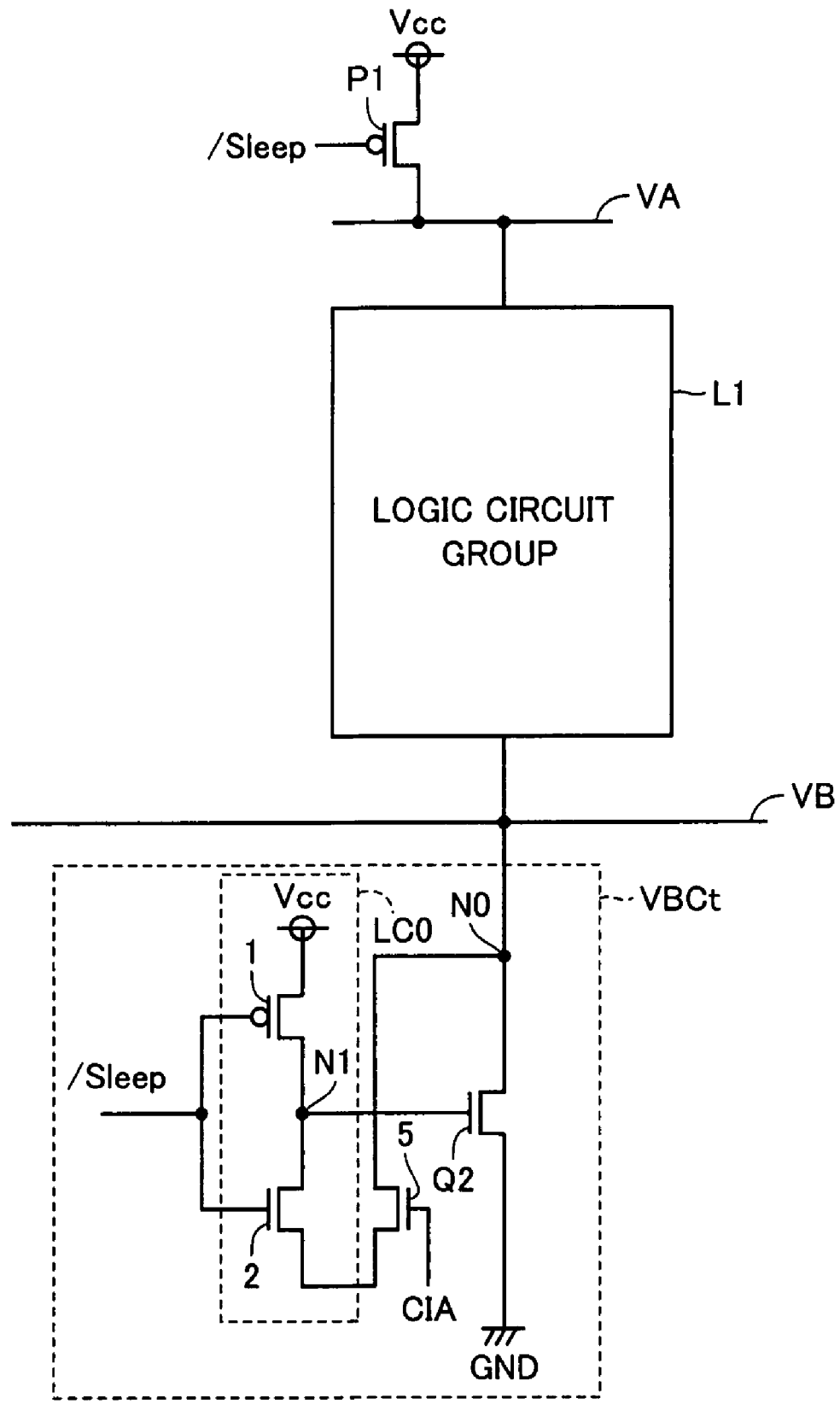

FIG. 14 illustrates an MTCMOS circuit according to a sixth modification of the first embodiment of the invention.

Referring to FIG. 14, the MTCMOS circuit according to the sixth modification of the first embodiment of the invention differs from the foregoing structure in that voltage supply control circuit VBC is replaced with a voltage supply control circuit VBCt.

Voltage supply control circuit VBCt differs from voltage supply control circuit VBC in that an N-channel MOS transistor 5 is further employed. Transistors 5 and 2 are connected in series between nodes N1 and N0. Transistor 5 receives control signal CIA on its gate.

Control signal CIA attains the "H" level in the active mode.

In the active mode, control signal /Sleep attains the "L" level. Thereby, transistor 1 is turned on to couple electrically power supply voltage Vcc to node N1, and transistor Q2 is turned on. Thereby, pseudo ground line VB is electrically coupled to ground voltage GND. In this state, transistor 5 is on because control signal CIA is at the "H" level.

Logic circuit group L1 receives a power supply required for the operations, and executes a predetermined operation.

In the standby mode, control signal /Sleep attains the "H" level. Thereby, transistor 2 is turned on, and transistor 1 is turned off.

Therefore, nodes N1 and N0 are electrically coupled, and the charged charges in node N1 are discharged to node N0 as described before. Since the charges accumulated in node N1 are discharged to node N0 immediately after the start of the standby mode, the quantity of the current pulled out from power supply voltage Vcc can be small in the standby mode.

Then, control signal CIA attains the "L" level. Thereby, transistor 5 is turned off to isolate electrically nodes N0 and N1 from each other.

Figure 15:
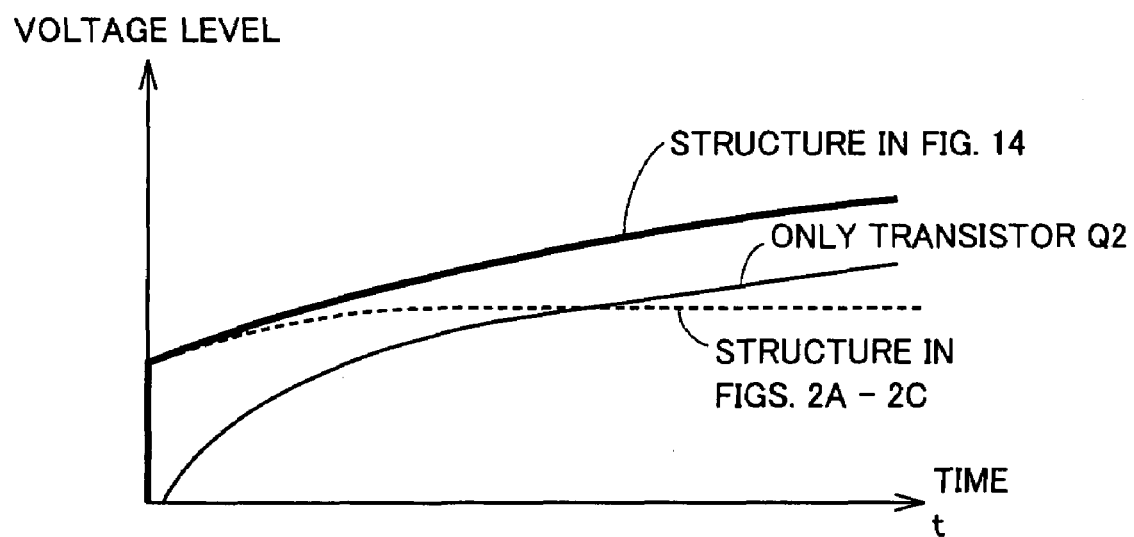
FIG. 15 illustrates a voltage level of a pseudo ground line of the MTCMOS circuit according to the sixth modification of the first embodiment of the invention.

Referring to FIG. 15, description will now be given on the voltage level of the pseudo ground line of the MTCMOS circuit according to the sixth modification of the first embodiment of the invention.

Since the charges accumulated in node N1 are discharged to node N0 immediately after the start of the standby mode as illustrated in FIG. 15, the potential level of the pseudo ground line rapidly rises. Control signal CIA attains the "L" level, and transistor 5 is turned off so that the potential level of the pseudo ground line connected to node N0 rises. Although the potentials of pseudo power supply line VA and pseudo ground line VB approach each other, this structure can likewise reduce the quantity of the current pulled from power supply voltage Vcc immediately after the start of the standby mode so that the power consumption can be small.

The description has been given on the case where transistor 5 is completely turned off. However, the potential level of the pseudo ground line may be adjusted by setting control signal CIA to an intermediate potential level instead of changing control signal CIA from the "H" level to the "L" level.

In this case, transistor 5 enters a partially turned-on state. Therefore, such a state is attained that nodes N0 and N1 are electrically coupled, and thus feedback is effected on the gate of transistor Q2. Owing to this state, the potential level of node N0 can be set higher than that of node N1. Thus, the balanced potential of node N0 can be minutely adjusted by adjusting the potential level applied to the gate of transistor 5. Since this structure allows the minute adjustment of node N0 as well as the adjustment for achieving the high balanced potential of pseudo ground line VB, this structure is effective, e.g., at reducing the power consumption while ensuring a potential difference that can holds a logical state.

Seventh Modification of the First Embodiment

Figure 16:
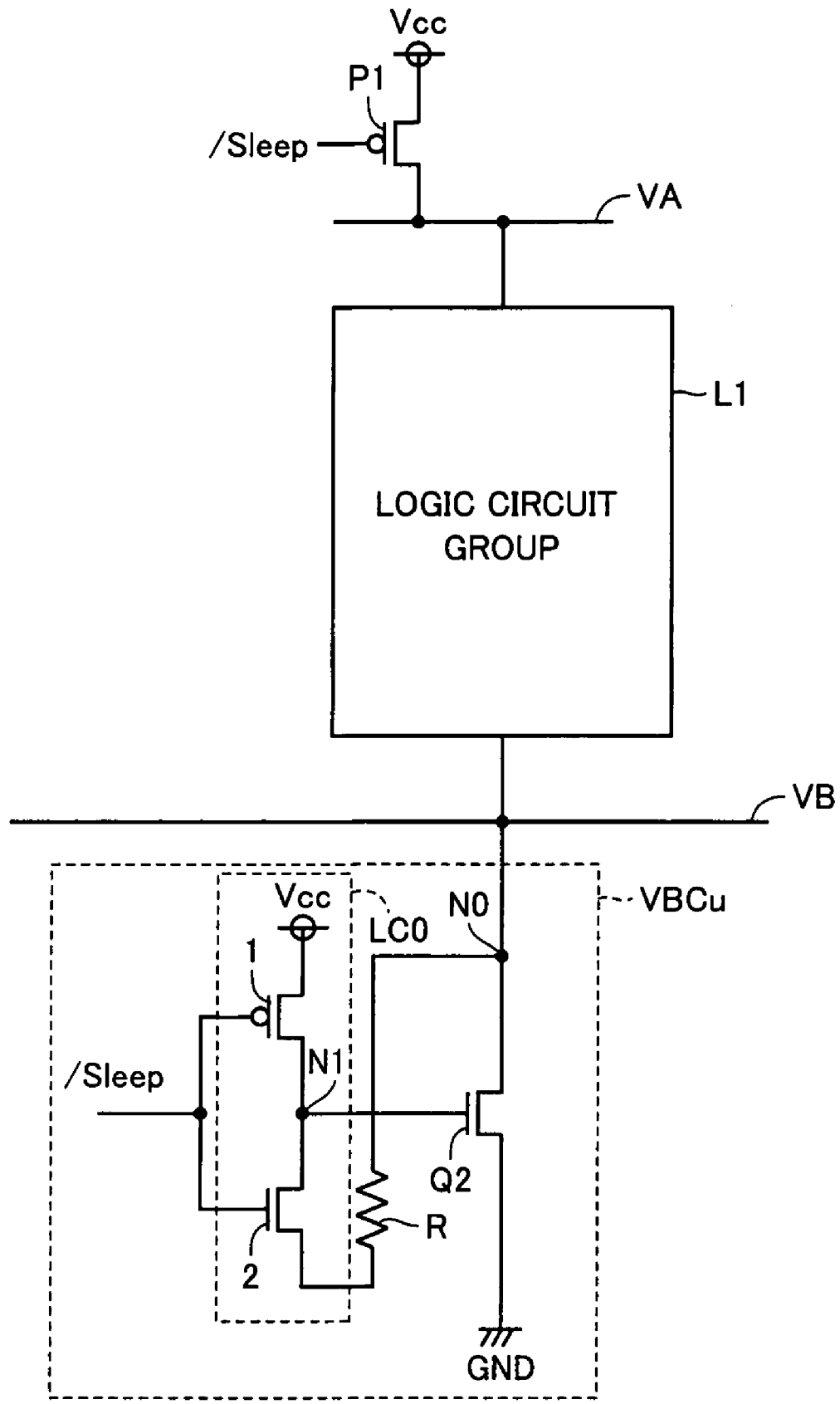
FIGS. 16 and 17 illustrate MTCMOS circuits according to seventh and eighth modifications of the first embodiment of the invention, respectively.

Referring to FIG. 16, description will now be given on an MTCMOS circuit according to a seventh modification of the first embodiment of the invention.

Referring to FIG. 16, the MTCMOS circuit according to the seventh modification of the first embodiment of the invention differs from the foregoing structure in that voltage supply control circuit VBC is replaced with a voltage supply control circuit VBCu.

Voltage supply control circuit VBCu differs from voltage supply control circuit VBC in that a resistance R is further employed. Resistance R and transistor 2 are connected in series between nodes N1 and N0. Resistance R may include a resistance based on a resistance element or a resistance based on a parasitic resistance (interconnection resistance). However, resistance R has a resistance value larger than 0 ohms and smaller than the off resistance of transistor 2.

Thus, the structure is equivalent to a structure in which transistor 5 in FIG. 14 is replaced with resistance R.

In the standby mode, control signal /Sleep attains the "H" level. Thereby, transistor 2 is turned on, and transistor 1 is turned off. Therefore, nodes N1 and N0 are electrically coupled via resistance R. Therefore, the initial potential of node N1 is higher than that of node N0 so that the charges discharged from node N1 are small in quantity.

Thereafter, node N0 is charged to raise its potential. The potential of node N0 rises with time, and exceeds the potential of node N1. In this state, the potential of node N1 is lower than that of node N0 so that transistor Q2 cannot be readily turned on, and a high potential can be set in node N0.

Since this structure employs resistance R instead of transistor 5, the circuit area and thus the footprint can be reduced.

Eighth Modification of the First Embodiment

Figure 17:
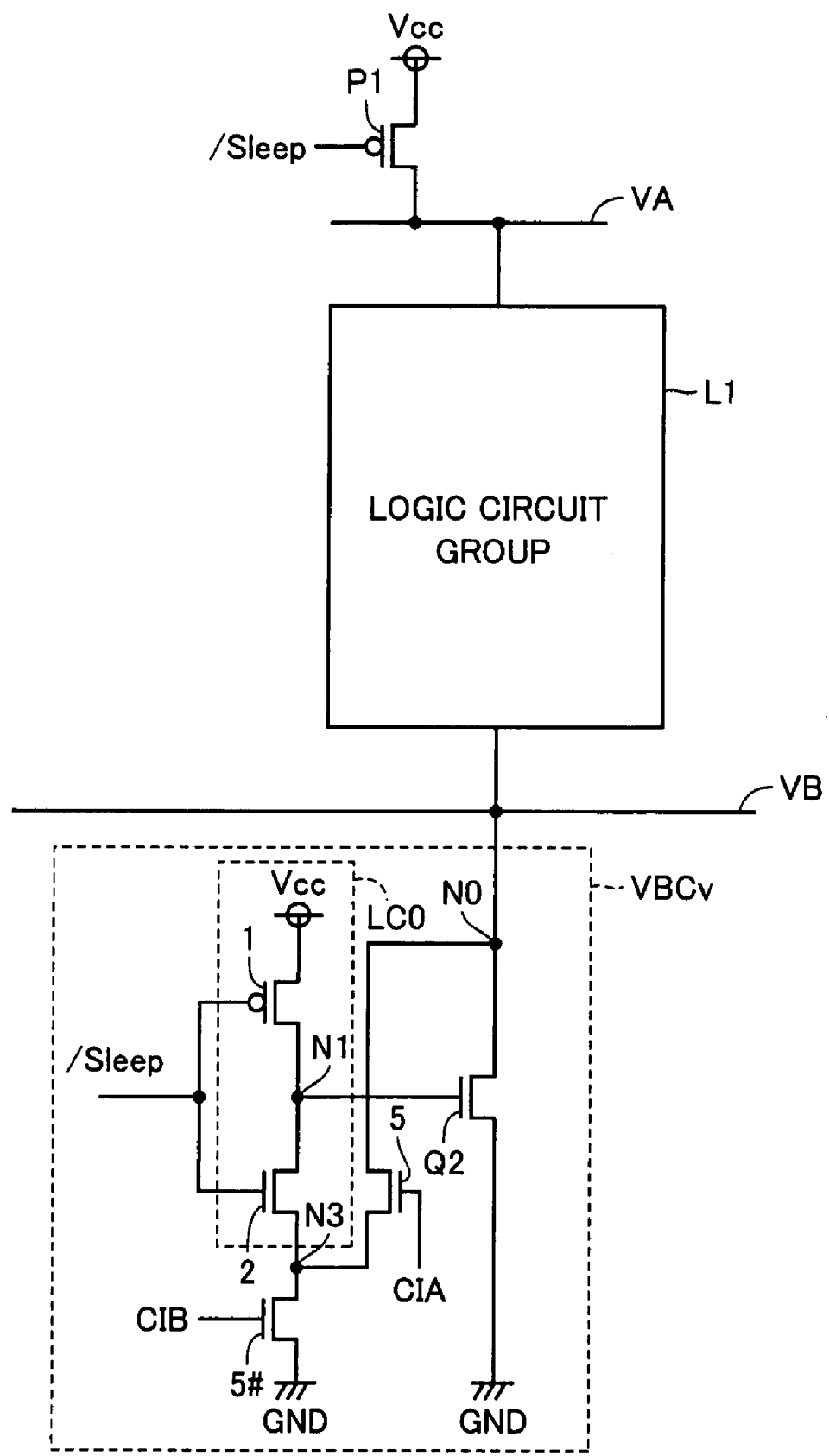

Referring to FIG. 17, description will now be given on an MTCMOS circuit according to an eighth modification of the first embodiment of the invention.

Referring to FIG. 17, the MTCMOS circuit according to the eighth modification of the first embodiment of the invention differs from the foregoing structure in that voltage supply control circuit VBC is replaced with a voltage supply control circuit VBCv.

Voltage supply control circuit VBCv differs from voltage supply control circuit VBC in that transistors 5 and 5# are further employed. Transistors 5 and 2 are connected in series with a node N3 therebetween, and are connected between nodes N1 and N0. Transistor 5 receives control signal CIA on its gate. Transistors 5# and 2 are connected in series with node N3 therebetween, and are connected between node N1 and ground voltage GND. Transistor 5# receives a control signal CIB on its gate.

Description will now be given on the operation of voltage supply control circuit VBCv according to the eighth modification of the first embodiment of the invention.

In the active mode, control signal /Sleep attains the "L" level. Control signals CIA and CIB attain the "H" level.

Thereby, transistor 1 is turned on to couple electrically node N1 to power supply voltage Vcc, and transistor Q2 is turned on. Thereby, pseudo ground line VB and ground voltage GND are electrically coupled.

In the above case, since the two current paths are formed, ground voltage GND can be rapidly supplied to pseudo ground line VB. Description has been given on the case where both control signals CIA and CIB are at the "H" level, and more specifically when the current paths are formed for transistors 5 and 5#. However, such a structure may be employed that sets at least one of control signals CIA and CIB to the "L" level and does not provide the current path in the active mode.

In the standby mode, control signal /Sleep attains the "H" level. Control signal CIB attains the "L" level before entering the standby mode. Control signal CIA attains the "H" level before entering the standby mode.

In this structure, when the standby mode starts, the charged charges in node N1 are discharged to node N0 via transistors 2 and 5. Therefore, similarly to the foregoing case, the potential of node N0 can rapidly rise, the quantity of the current pulled out from power supply voltage Vcc is further reduced so that the power consumption can be reduced.

When control signal CIA attains the "H" level, feedback is performed from node N0 to node N1 as the potential of node N0 rises, and thereby transistor Q2 enters a state equivalent to a state where the diode connection is performed, and starts to be turned on. Thereby, the balanced state is attained where the quantity of passing current is nearly balanced as already described. In this modification, control signal CIA attains the "L" level thereafter. Thereby, nodes N1 and N0 are electrically isolated from each other. In the structure shown in FIG. 14, transistor 5 is in a high-impedance state, but node N1 is not at the "L" level so that transistor Q2 is turned on to a certain extent. In view of this, control signals CIA and CIB in this structure are set to the "H" and "L" levels, respectively. Thereby, transistor 5# is turned on to set node N1 to the "L" level, and transistor Q2 is completely turned off.

Figure 18:
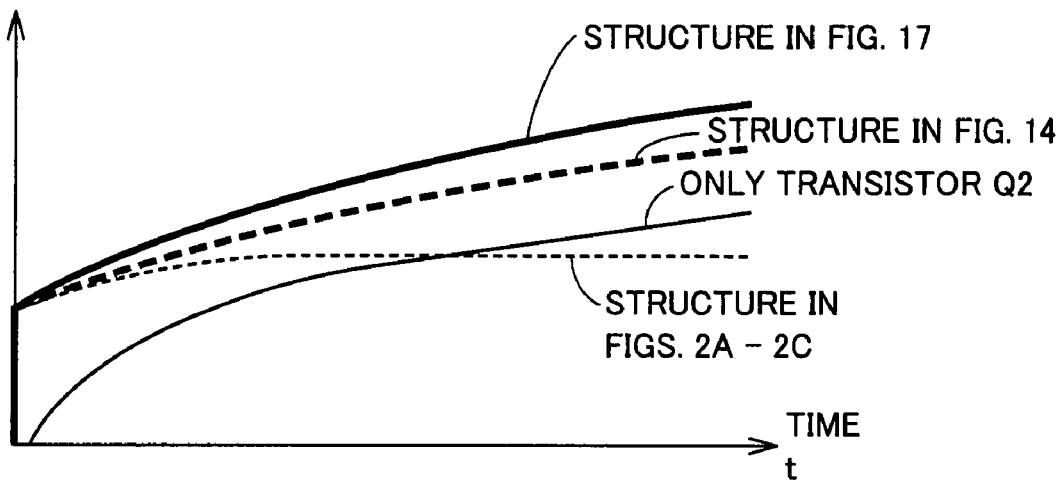
FIG. 18 illustrates a voltage level of a pseudo ground line of the MTCMOS circuit according to the eighth modification of the first embodiment of the invention.

Referring to FIG. 18, description will now be given on the voltage level of the pseudo ground line of the MTCMOS circuit according to the eighth modification of the first embodiment of the invention.

As illustrated in FIG. 18, the charges accumulated in node N1 are discharged to node N0 immediately after the start of the standby mode, so that the potential of the pseudo ground line rapidly rises. Control signal CIA attains the "L" level to turn off transistor 5 so that the potential level of the pseudo ground line connected to node N0 will rise. Control signal CIB attains the "H" level, and transistor 5# is turned on to couple electrically node N0 to ground voltage GND. Thereby, transistor Q2 is completely turned off. Therefore, the potentials of pseudo power supply line VA and pseudo ground line VB approach each other to a higher extent than that in the waveform diagram of FIG. 15 because transistor Q2 is completely off. In this structure, however, the power consumption can be reduced because it is possible to reduce the quantity of the current that is pulled out from power supply voltage Vcc immediately after the start of the standby mode. Further, transistor Q2 is completely off, and does not allow passage of any current. This can likewise reduce the power consumption.

Description has been given on the structure in which transistor Q2 is completely turned off. As already described in connection with the structure in FIG. 14, however, control signal CIA may be set to the intermediate potential, and control signal CIB may be set to the "L" level, whereby the potential of pseudo ground line VB electrically coupled to node N0 can be minutely adjusted.

Ninth Modification of the First Embodiment

Figure 19:
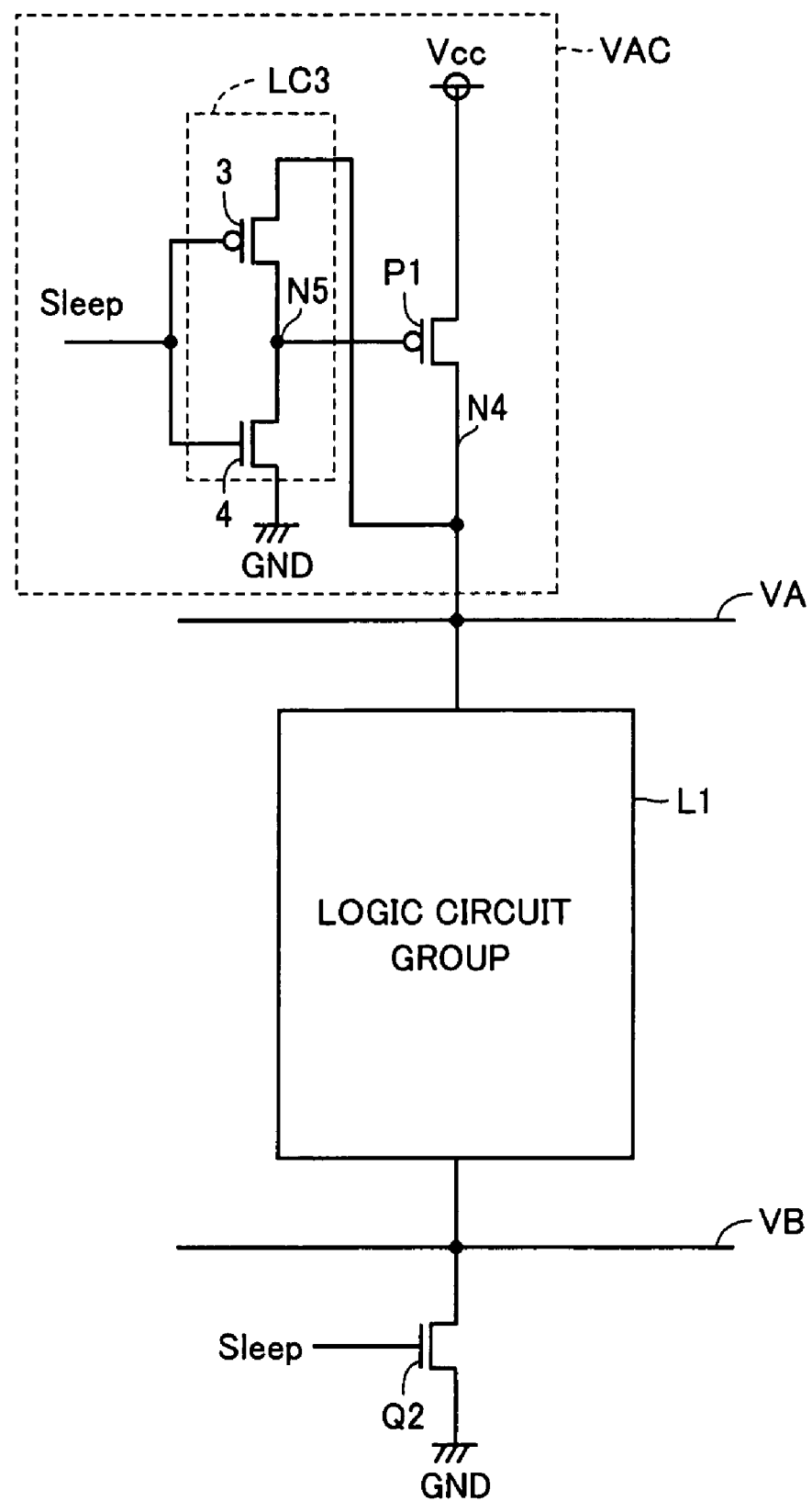
FIGS. 19 and 20 illustrate MTCMOS circuits according to ninth and tenth modifications of the first embodiment of the invention, respectively.

Referring to FIG. 19, description will now be given on an MTCMOS circuit according to a ninth modification of the first embodiment of the invention.

Referring to FIG. 19, the MTCMOS circuit according to the ninth modification of the first embodiment of the invention differs from the foregoing structure in that a voltage supply control circuit VAC is arranged corresponding to pseudo power supply line VA.

More specifically, voltage supply control circuit VAC according to the ninth embodiment of the invention includes a P-channel MOS transistor 3, an N-channel MOS transistor 4 and P-channel MOS transistor P1. Transistor P1 is connected between power supply voltage Vcc and a node N4 electrically coupled to pseudo power supply line VA, and has a gate electrically coupled to a node N5. Transistor 3 is arranged between nodes N4 and N5, and has a gate receiving a control signal Sleep. Transistor 4 is connected between ground voltage GND and node N5, and has a gate receiving control signal Sleep. Transistors 3 and 4 form a logic circuit LC3.

Transistors 3 and 4 complementarily operate in response to control signal Sleep.

For example, control signal Sleep is at the "H" level in the active mode. Thereby, transistor 4 is turned on, and node N3 is electrically coupled to ground voltage GND so that node N5 attains the "L" level, and transistor P1 is turned on. Thereby, power supply voltage Vcc and pseudo power supply line VA are electrically coupled.

Then, control signal Sleep attains the "L" level in the standby mode. Thereby, transistor 3 is turned on to couple electrically nodes N4 and N5. In the active mode, node N4 has accumulated the charges charged thereto. When transistor 3 is turned on, the charged charges in node N4 are discharged to node N5 to raise the potential. Thereby, nodes N5 and N4 are electrically coupled to achieve the diode connection in transistor P1. Intrinsically, the source terminal of transistor 3 is electrically coupled to power supply voltage Vcc. In the structure of voltage supply control circuit VAC, a phenomenon reverse to the above phenomenon of pseudo ground line VB occurs to discharge the charged charges in node N4 to node N5. This reduces a quantity of the current to be intrinsically pulled out from power supply voltage Vcc on the source terminal side, and can reduce the power consumption.

In this structure, as described above, nodes N4 and N5 are electrically coupled in the standby mode. Thus, the diode connection is achieved in transistor P1. Thereby, transistor P1 starts to be turned on when the potential of pseudo power supply line VA lowers to the voltage level of the threshold voltage of transistor P1, and the current starts to flow from power supply voltage Vcc via transistor P1. Thus, when the potential of pseudo power supply line VA electrically coupled to node N4 lowers a magnitude corresponding to the threshold voltage of transistor P1, transistor P1 is fully turned on. When the above magnitude of lowering is smaller than the threshold voltage, transistor P1 is turned on to a smaller extent.

Therefore, the potential of node N4 is in the balanced state when it is at the level that keeps a balance between the quantity of the current flowing to logic circuit group L1 to pseudo power supply line VA and a quantity of the current flowing from power supply voltage Vcc via transistor P1. This balanced potential depends on the threshold voltage, transistor width and the like of transistor P1.

According to the ninth modification of the first embodiment of the invention having the above structure, therefore, transistor 3 is turned on to couple electrically nodes N4 and N5 together, and thereby the charged charges in node N4 can be discharged so that the quantity of the current pulled out from power supply voltage Vcc can be small, and the power consumption can be small. During the standby, nodes N4 and N5 are electrically coupled to achieve the diode connection in transistor P1 so that the potential of pseudo power supply line VA can be adjusted to a high level.

Accordingly, the voltage supply control circuit according to the ninth embodiment of the first embodiment of the invention can reduce the power consumption. Since the transistor for adjusting and attaining the balanced potential is not required, and the components of the circuit can be reduced in umber. Therefore, this circuit structure is advantageous in layout and cost.

Tenth Modification of the First Embodiment

Figure 20:
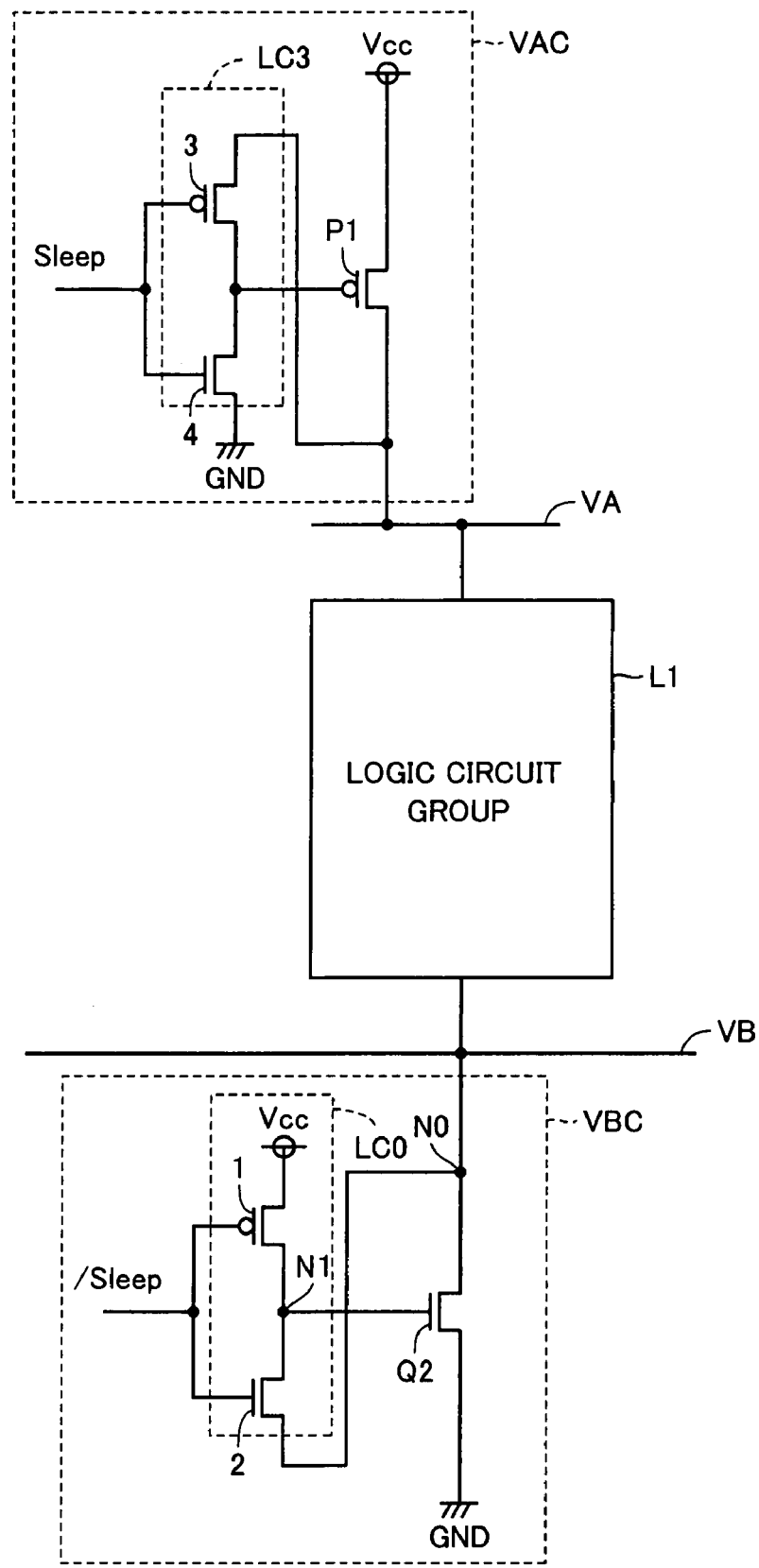

Referring to FIG. 20, description will now be given on an MTCMOS circuit according to a tenth modification of the first embodiment of the invention.

Referring to FIG. 20, the MTCMOS circuit according to the tenth modification of the first embodiment of the invention differs from the foregoing structure in that voltage supply control circuit VAC is arranged corresponding to pseudo power supply line VA, and voltage supply control circuit VBC is arranged corresponding to pseudo ground line VB. Voltage supply control circuits VBC and VAC are substantially the same as those already described with reference to FIGS. 2 and 19, and therefore detailed description thereof is not repeated.

According to this structure, the gate of transistor P1 is electrically coupled to pseudo power supply line VA immediately after the start of the standby mode as described before, and the charges are discharged from pseudo power supply line VA to the gate of transistor P1. Also, the gate of transistor Q2 is electrically coupled to pseudo ground line VB, and the charges are discharged from the gate of transistor Q2 to pseudo ground line VB. Owing to this structure, it is possible to reduce the current that acts to pull out the charges from the side of ground voltage GND or to pull out the charges from the side of power supply voltage Vcc, and the power consumption can be reduced.

As described above, each of pseudo power supply line VA and pseudo ground line VB is kept at the predetermined potential achieving the balanced state. Therefore, a sufficient difference can be ensured in voltage level between pseudo power supply line VA and pseudo ground line VB, and the internal logic circuit group can hold the data even when the internal logic circuit group is formed of flip-flops, latch circuits or the like storing the internal states.

Eleventh Modification of the First Embodiment

The first embodiment have been described in connection with the structures in which the voltage supply control circuit is arranged, e.g., in logic unit 100. However, it is not essential that all the circuit elements forming the voltage supply control circuit are arranged in logic unit 100. Further, it is not essential that the circuit elements are arranged in the same chip, and these may be arranged in a plurality of chips in a divided fashion as is done in the SIP.

Figure 21A:
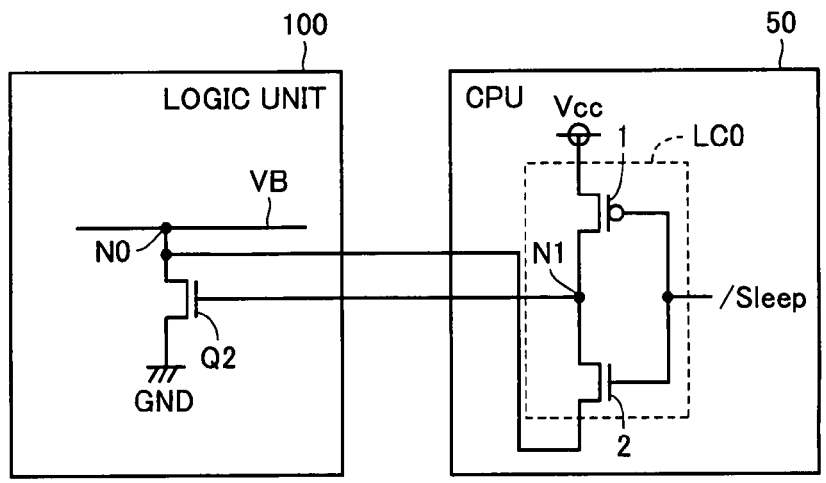
FIGS. 21A, 21B and 21C illustrate a voltage supply control circuit according to an eleventh modification of the first embodiment of the invention.
Figure 21B:
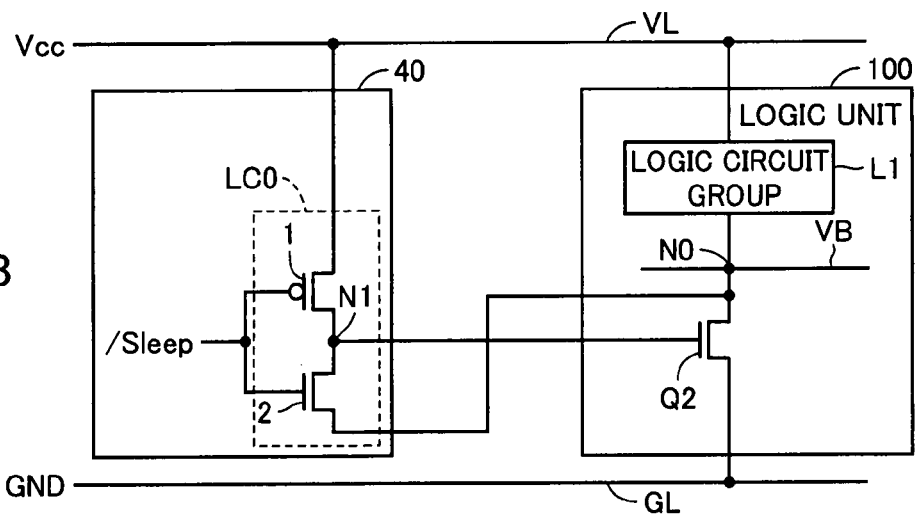
Figure 21C:
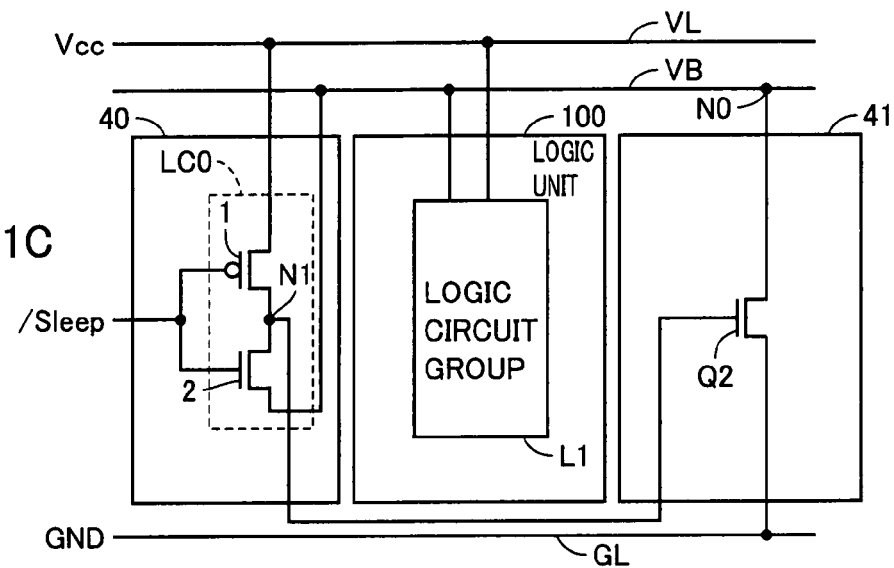

FIGS. 21A, 21B and 21C illustrate the voltage supply control circuit according to the eleventh modification of the first embodiment of the invention.

Referring to FIG. 21A, a circuit structure of a voltage supply control circuit corresponds to that shown in FIGS. 2A-2C, but differs therefrom in that transistor Q2 is arranged in logic unit 100, and another logic circuit LC0 is arranged on the side including CPU 50. The circuit operation is substantially the same as that already described with reference to FIGS. 2A-2C, and detailed description thereof is not repeated.

As can be seen from the structure shown in FIG. 21A, a load capacity acting on the gate of transistor Q2 increases with increase in length of node N1 electrically coupled to the gate of transistor Q2, i.e., with increase in length of the signal interconnection electrically coupled to the gate of transistor Q2. Therefore, the charged charges accumulated in node N1 increase with increase in length of the signal interconnection electrically coupled to the gate, and the quantity of charges discharged to node N0 increases. In logic unit 100, it is naturally possible to increase the length of the signal interconnection connected to the gate of transistor Q2.

Accordingly, the charges accumulated in the node N1 are discharged to node N0 immediately after the start of the standby mode, and this can further reduce the quantity of the current pulled out from power supply voltage Vcc.

The description has been given, by way of example, on the structure that is provided on the side of CPU 50 with logic circuit LC0 formed of transistors 1 and 2 receiving control signal /Sleep issued for the purpose of increasing the distance between the gate of transistor Q2 and node N1 of logic circuit LC0 formed of transistors 1 and 2, i.e., for the purpose of increasing the length of the signal interconnection connected to the gate of transistor Q2. However, the structure is not restrictive. Naturally, it is possible to employ a structure in which logic circuit LC0 is arranged in another circuit block such as controller 20, or is arranged in another chip. Further another structure may also be employed.

FIG. 21B shows a structure in which a part of the voltage supply control circuit is arranged in a semiconductor device independently of logic unit 100. More specifically, transistor Q2 is arranged in a circuit block region of logic unit 100, and logic circuit LC0 formed of transistors 1 and 2 is arranged in another circuit block region 40. The circuit operation is substantially the same as that illustrated in FIGS. 2A-2C, and detailed description thereof is not repeated. By increasing the distance between circuit block region 40 and logic unit 100, the length of the signal interconnection connected to the gate of transistor Q2 is increased so that it is possible to increase the quantity of the charges charged to pseudo ground line VB in the standby mode.

Referring to FIG. 21C, the semiconductor device is provided with the voltage supply control circuit having portions that are spaced from logic unit 100 and from each other. More specifically, circuit block region 40 having logic circuit LC0 formed of transistors 1 and 2 as well as a circuit block region 41 having transistor Q2 are arranged in different regions with logic unit 100 therebetween. The circuit operation is substantially the same as that already described with reference to FIGS. 2A-2C, and detailed description thereof is not repeated. With increase in distance between circuit block regions 40 and 41, the length of the signal interconnection connected to the gate of transistor Q2 increases so that the quantity of the charges charged to pseudo ground line VB can increase in the standby mode. Although description has been given on the structure that has logic unit 100 located between circuit block regions 40 and 41, this is not restrictive. Logic unit 100 may be arranged between other circuit blocks. Also, circuit block regions 40 and 41 may be spaced from each other without interposing any portion therebetween.

The load capacity of the gate of transistor Q2 increases with increase in interconnection length of the signal line. Therefore, when it is desired to increase the quantity of the charges charged to pseudo ground line VB in the standby mode, the layout of transistor Q2 and transistors 1 and 2 is devised to increase the load capacity of the gate in the above manner, and thereby the interconnection length thereof is increased so that the quantity of the charged charges can be adjusted.

The first embodiment and the modifications thereof already described can be naturally combined with the following embodiments.

Second Embodiment

In the foregoing first embodiment, an example of the internal circuit included in semiconductor device 10 has been described on the manner of reducing the power consumption in the standby mode, using the voltage supply control circuit for logic circuit group L1 included in logic unit 100. In contrast to this, the second embodiment will be described in connection with a structure applied for reducing the power consumption of memory cells MC in a storage, which is an example of the internal circuit.

Figure 22:
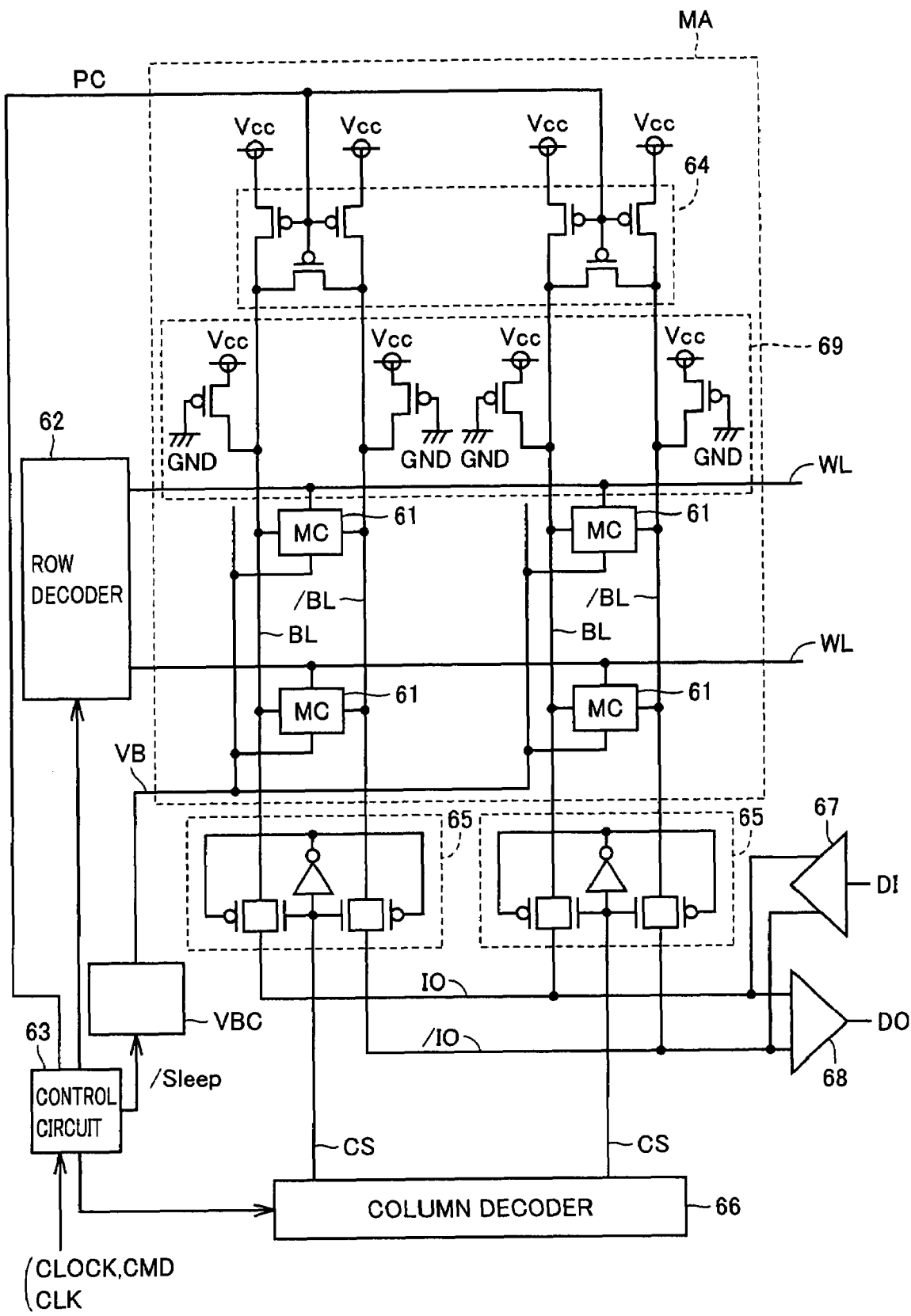
FIG. 22 shows a schematic structure for partially illustrating a storage according to a second embodiment of the invention.

Referring to FIG. 22, a part of a storage 15 according to the second embodiment of the invention will now be described.

Referring to FIG. 22, storage 15 according to the second embodiment of the invention includes a memory array MA including memory cells MC arranged in rows and columns, a row decoder 62 selecting rows of memory cells MC, a column decoder 66 selecting a column of memory cells MC, a control circuit 63 such as row and column decoders for controlling circuit blocks, and data lines IO and /IO that are mutually complementary and are used for data reading and data writing. Control circuit 63 receives a clock CLK and a command CMD, and provides signals such as control signals for operating various circuits. FIG. 22 shows an example, in which control signal /Sleep indicating the active mode or standby mode as well as a control signal PC instructing the precharging are provided to voltage supply control circuit VBC.

Memory array MA includes word lines WL arranged corresponding to the respective memory cell rows, and pairs of mutually complementary bit lines BL and /BL arranged corresponding to the respective memory cell columns.

A column select gate 65 is arranged corresponding to each memory cell column for electrically coupling a data line IO and bit line BL that is selected in response to a column select instruction CS provided from column decoder 66. Complementary bit line /BL is electrically coupled to complementary data line /IO.

The structure further includes a write driver 67 that sets data lines IO and /IO to predetermined voltage levels corresponding to write data DI in response to reception of write data DI, and a read amplifier 68 that detects, in the data read operation, the potential levels of bit lines BL and /BL corresponding to the data read current flowing through bit lines BL and /BL in the selected column, and provides read data DO.

A precharge circuit 64 is employed for precharging bit lines BL and /BL in memory array MA. Precharge circuit 64 responds to control signal PC provided from control circuit 63, and thereby electrically couples power supply voltage Vcc to bit lines BL and /BL to equalize and precharge bit lines BL and /BL to the level of power supply voltage Vcc. A bit line load group 69 is further employed for bit lines BL and /BL of memory array MA for the purpose of supplying a data read current to memory cells MC in the data read operation. Although not shown, a switch or the like may be employed for cutting off the connection between bit line load group 69 supplying the above data read current and bit lines BL and /BL.

Figure 23:
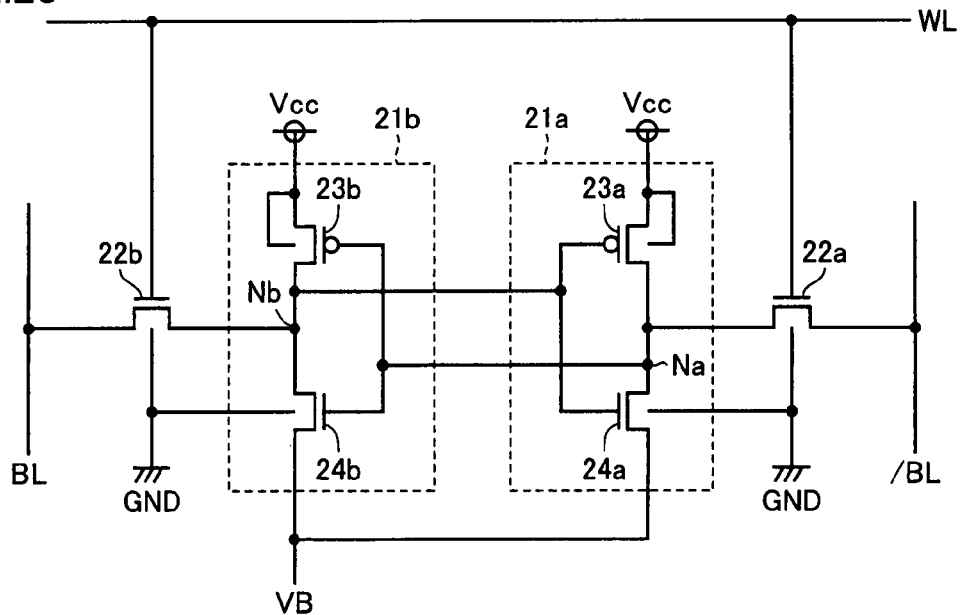
FIG. 23 illustrates a circuit structure of a memory cell according to the second embodiment of the invention.

Referring to FIG. 23, description will now be given on a circuit structure of memory cell MC according to the second embodiment of the invention.

Referring to FIG. 23, memory cell MC is formed of two inverter circuits 21a and 21b.

More specifically, inverter circuit 21a includes transistors 23a and 24a, and is connected between power supply voltage Vcc and pseudo ground line VB via a storage node Na. Each of the gates is electrically coupled to a storage node Nb. Inverter 21b includes transistors 23b and 24b, which are connected between power supply voltage Vcc and pseudo ground line VB via storage node Nb. Each of transistors 23b and 24b has a gate electrically coupled to node Na.

Two inverter circuits 21a and 21b store mutually complementary potential levels at the storage nodes, respectively. Access transistors 22a and 22b are arranged. Access transistor 22a is arranged between storage node Na and complementary bit line /BL, and has a gate electrically coupled to word line WL. Transistor 22b is arranged between storage node Nb and bit line BL, and has a gate electrically coupled to word line WL.

In the data write operation, data lines IO and /IO that attain the voltage levels corresponding to write data DI provided via write driver 67 are electrically coupled to bit lines BL and /BL in the selected column, respectively, and set them to "H" and "L" levels or vice versa, respectively. Word line WL in the selected row becomes active to set storage nodes Na and Nb of selected memory cell MC to the mutually complementary potential levels, respectively.

In the data read operation, word line WL is selected after precharge circuit 64 precharges bit lines BL and /BL to power supply voltage Vcc. Read amplifier 68 detects that the currents corresponding to the potential levels of the storage nodes of selected memory cell MC flow through bit lines BL and /BL as well as data lines IO and /IO, and provides the read data DO corresponding to the difference between the detected currents.

Figure 24:
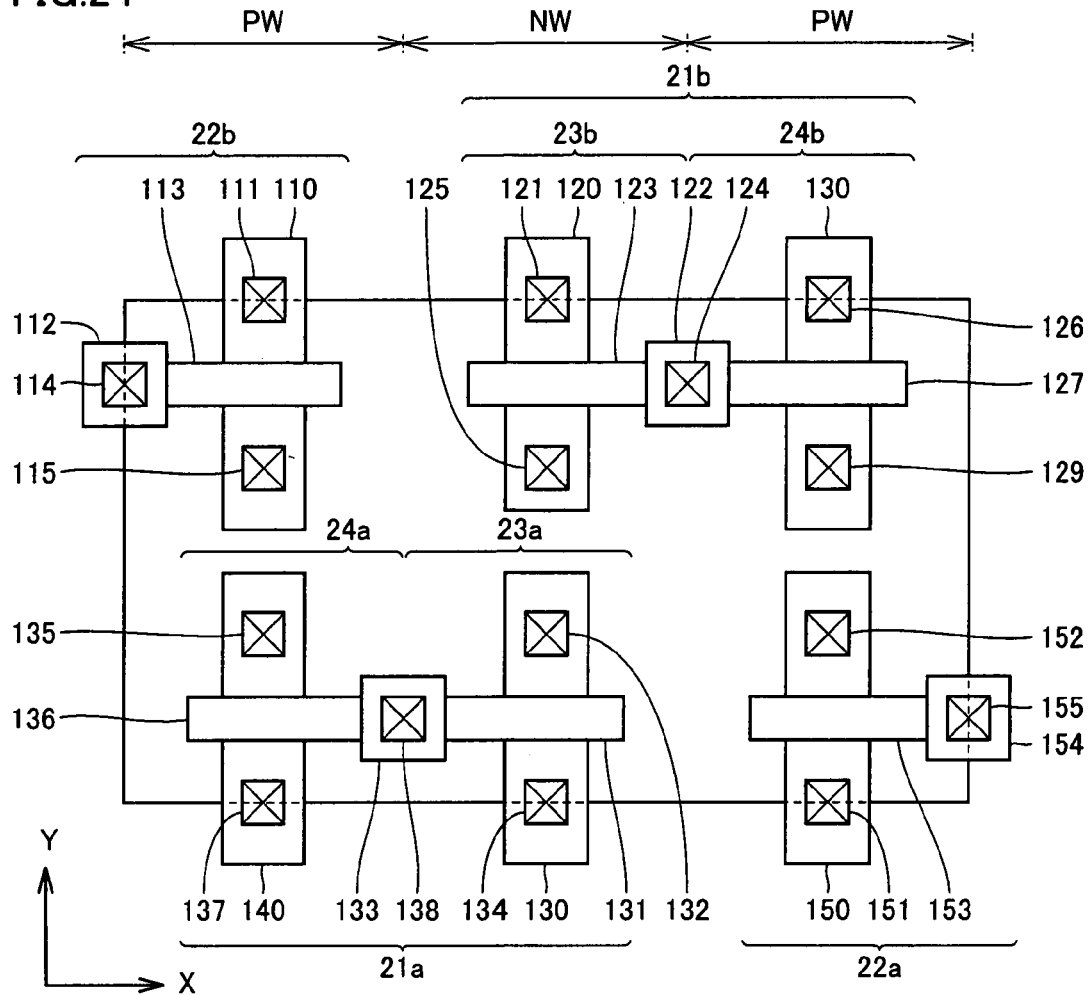
FIG. 24 specifically illustrates a layout structure of a lower layer region of the memory cell according to the second embodiment of the invention.

FIG. 24 illustrates a layout structure of a lower layer region of memory cell MC according to the second embodiment of the invention. Although a structure including a first metal interconnection layer is shown, the following layout structure is by way of example only, and is not restrictive.

Referring to FIG. 24, memory cell MC according to the second embodiment of the invention includes the six transistors already described. More specifically, it includes transistors 22a, 22b, 23a, 23b, 24a and 24b.

The layout of the transistors will now be described. In this example, N-channel MOS transistors having P-well structures are formed at opposite side portions, respectively, and P-channel MOS transistors of N-type well structures are formed between them.

Diffusion layers forming the source/drain regions of the transistor are formed in a Y-axis direction at a substrate.

More specifically, a diffusion layer 110 of transistor 22b extends in the Y-axis direction. Also, a diffusion layer 140 of transistor 24a is formed. Further, diffusion layers 120 and 130 of respective transistors 23b and 23a as well as diffusion layers 130 and 150 of respective transistors 24b and 22a are formed.

Gate polycrystalline silicon gates forming gates regions of respective transistors 22a, 22b, 23a, 23b, 24a and 24b extend in the X-axis direction.

Diffusion layer 110 of transistor 22b is electrically coupled to a metal of an upper layer via contacts 111 and 115 formed at the source and drain regions, respectively. In the gate region, a gate electrode 112 is formed above a polycrystalline silicon gate 113 of transistor 22b. Gate electrode 112 is electrically coupled to a metal of an upper layer via a contact 114.

Diffusion layer 140 of transistor 24a is electrically coupled to a metal of an upper layer via contacts 135 and 137 formed respectively at the source and drain regions. In a gate region, a gate electrode 133 is formed above polycrystalline silicon gate 136 of transistor 24a. Gate electrode 133 also serves as a gate electrode of transistor 23a as will be described later. Gate electrode 133 is electrically coupled to the metal of the upper layer via a contact 138.

Diffusion layer 130 of transistor 24b is electrically coupled to a metal of the upper layer via contacts 129 and 126 formed respectively at the source and drain regions. In the gate region, a gate electrode 122 is arranged above a polycrystalline silicon gate 127 of transistor 24b. Gate electrode 122 is electrically coupled to a metal of an upper layer via a contact 124. Gate electrode 122 also serves as a gate electrode of transistor 23b as will be described later.

Diffusion layer 120 of transistor 23b is electrically coupled to a metal of an upper layer via contacts 125 and 121 arranged respectively in the source and drain regions. In the gate region, shared gate electrode 122 is arranged above a polycrystalline silicon gate 123 of transistor 23b.

Diffusion layer 130 of transistor 23a is electrically coupled to a metal of an upper layer via contacts 132 and 134 arranged respectively in the source and drain regions. In the gate region, shared gate electrode 133 is arranged above a polycrystalline silicon gate 131 of transistor 23a.

Diffusion layer 150 of transistor 22a is electrically coupled to a metal of an upper layer via contacts 152 and 151 arranged respectively in the source and drain regions. In the gate region, a gate electrode 154 is arranged above a polycrystalline silicon gate 153 of transistor 22a. Gate electrode 154 is electrically coupled to a metal of an upper layer via a contact 155.

Figure 25:
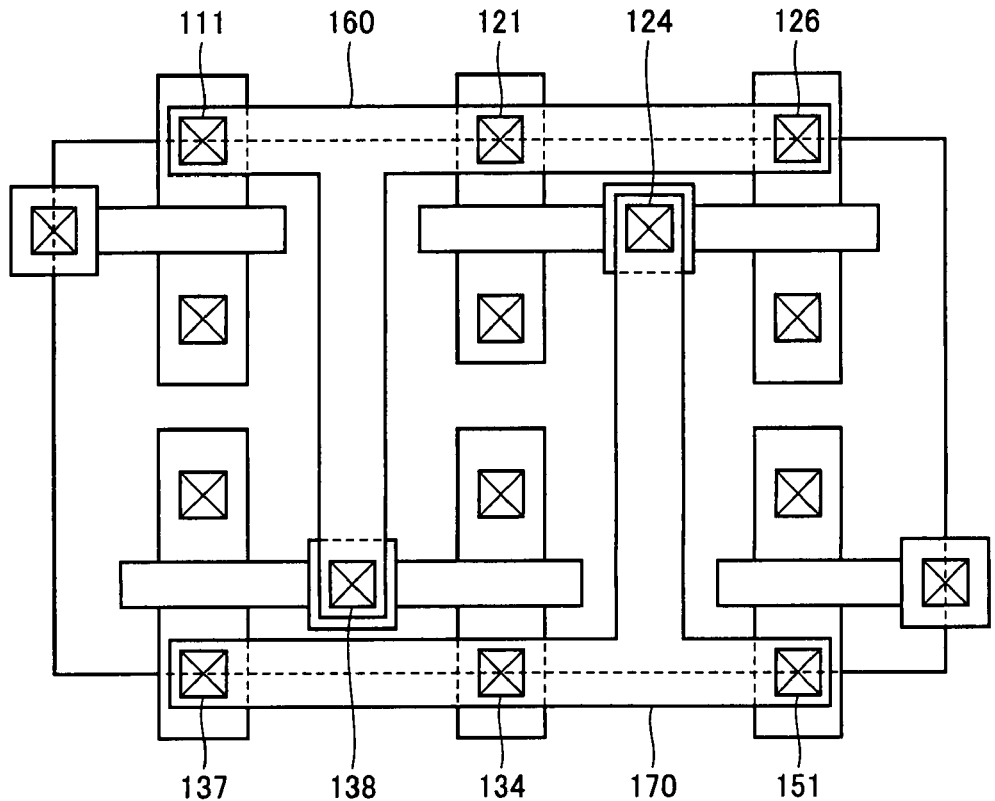
FIGS. 25, 26 and 27 specifically illustrate layout structures in which first, second and third metal interconnection layers are formed at upper layer regions of the memory cell according to the second embodiment of the invention, respectively.

Referring to FIG. 25, description will now be given on a layout structure having the first metal interconnection layer at the upper layer region of memory cells MC according to the second embodiment of the invention.

Referring to FIG. 25, a metal 160 is arranged, and is electrically coupled to a drain side of transistor 22b via a contact 111. Metal 160 is electrically coupled to contacts 121 and 126, and is electrically coupled to drain sides of transistors 23b and 24b. Further, metal 160 is electrically coupled to contact 138, and is electrically coupled to gates of transistors 23a and 24a. A region including metal 160 forms storage node Nb.

Likewise, a metal 170 is arranged, and is electrically coupled to a drain side of transistor 22a via contact 151. Metal 170 is electrically coupled to contacts 134 and 137, and is electrically coupled to drain sides of transistors 23a and 24a. Metal 170 is electrically coupled to contact 124, and is electrically coupled to gates of transistors 23b and 24b. A region including metal 170 forms storage node Na.

Figure 26:
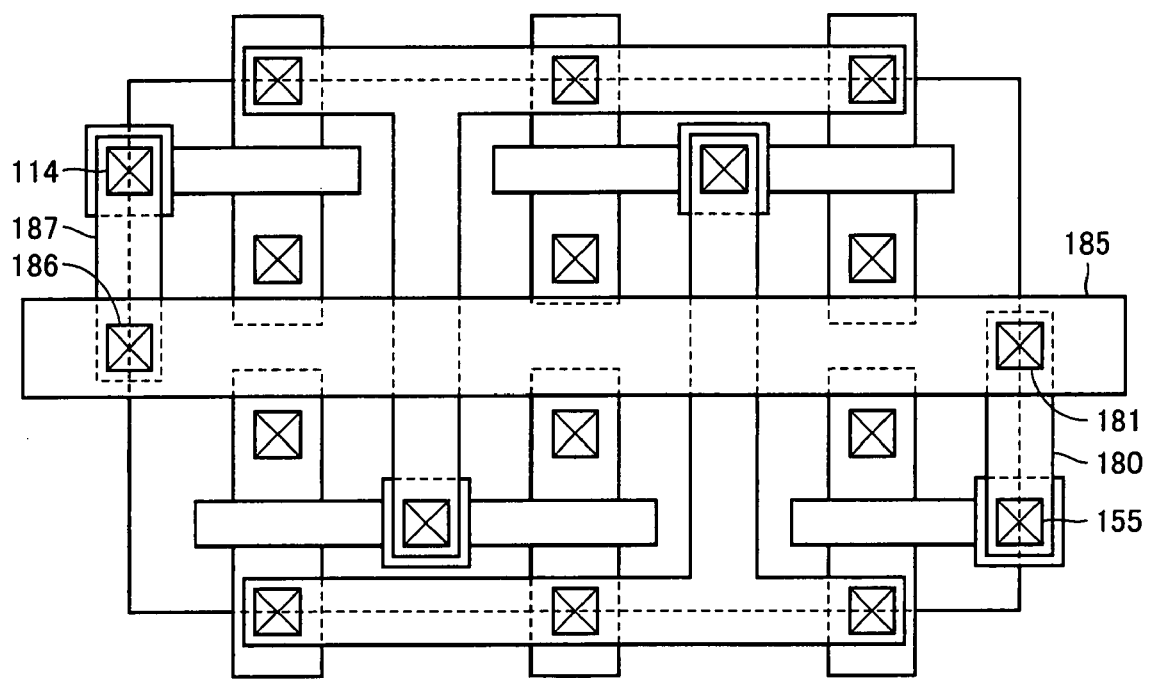

Referring to FIG. 26, description will now be given on a layout structure having a second metal interconnection layer of an upper region of memory cells MC according to the second embodiment of the invention.

Referring to FIG. 26, a metal 187 is arranged using the first metal interconnection layer, and is electrically coupled to contact 114. Metal 187 is also coupled electrically to a metal 185 arranged at the upper second metal interconnection layer via a contact 186. Metal 185 forms word line WL. A metal 180 is arranged using the first metal interconnection layer, and is electrically coupled to contact 155. Further, metal 180 is electrically coupled to metal 185 arranged at the upper second metal interconnection layer via a contact 181. Metal 185 extends in the X-axis direction.

Figure 27:
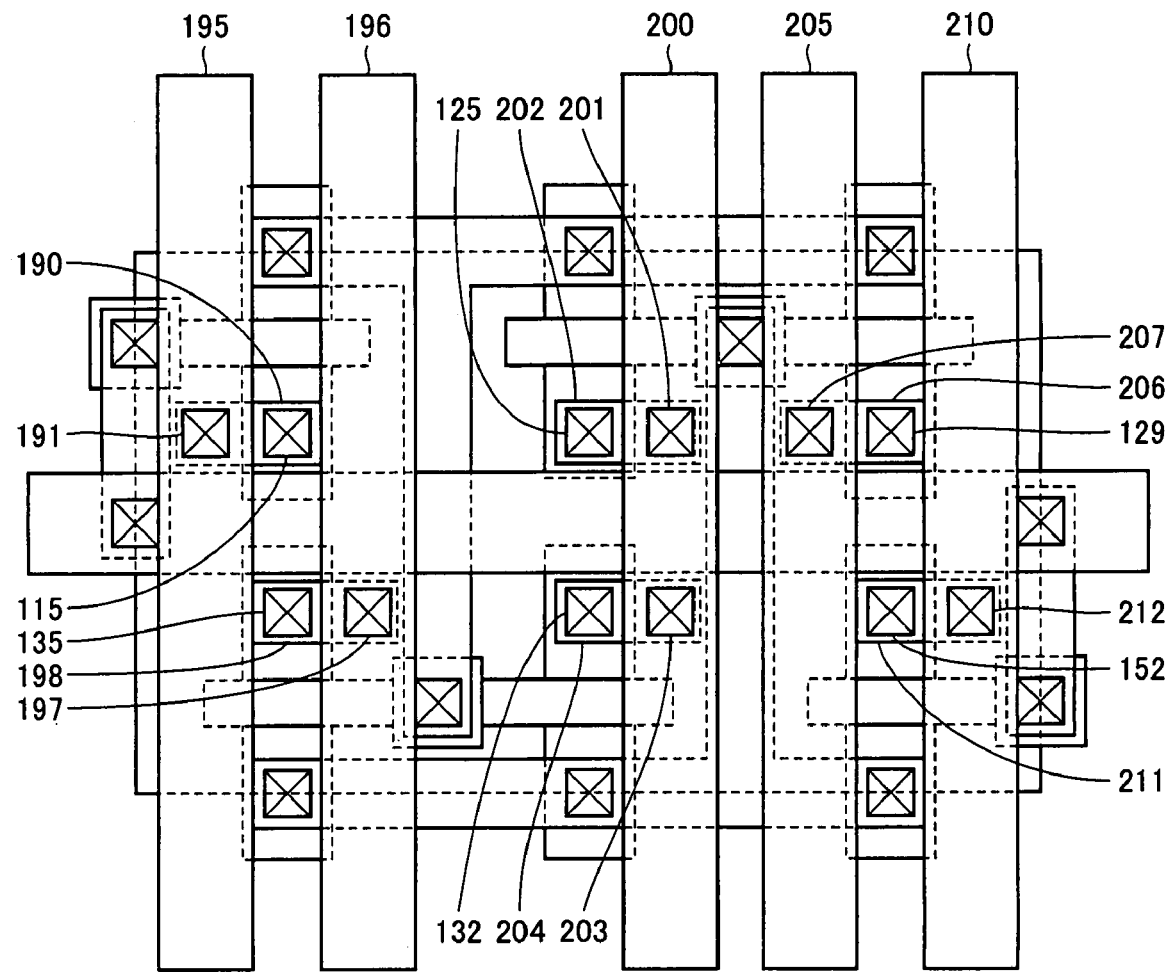

Referring to FIG. 27, description will now be given on the layout structure having a third metal interconnection layer at an upper layer region of memory cells MC according to the second embodiment of the invention.

Referring to FIG. 27, a metal 190 is arranged at the second metal interconnection layer, and is electrically coupled to a source side of transistor 22b via contact 115. Metal 190 is electrically coupled to a metal 195 arranged at the upper third metal interconnection layer via a contact 191. Metal 195 forms bit line BL.

Further, a metal 198 is arranged at the second metal interconnection layer, and is electrically coupled to a source side of transistor 24a via contact 135. Metal 198 is electrically coupled to a metal 196 arranged at the upper third metal interconnection layer via a contact 197. Metal 196 forms a ground line supplied with ground voltage GND.

The structure is also provided with a metal 202 arranged at the second metal interconnection layer. Metal 202 is electrically coupled to the source side of transistor 24a via contact 125. Metal 202 is electrically coupled to a metal 200 arranged at the upper third metal interconnection layer via a contact 201. Metal 200 forms the power supply line supplied with power supply voltage Vcc.

The structure further includes a metal 204 arranged at the second metal interconnection layer. Metal 204 is electrically coupled to a source side of transistor 23a via contact 132. Metal 204 is electrically coupled to metal 200 arranged at the upper third metal interconnection layer via a contact 203.

The structure is also provided with a metal 206 arranged at the second metal interconnection layer. Metal 206 is electrically coupled to a source side of transistor 24b via contact 129. Metal 206 is electrically coupled to a metal 205 arranged at the upper third metal interconnection layer via a contact 207. Metal 205 forms a ground line supplied with ground voltage GND.

The structure is also provided with a metal 211 arranged at the second metal interconnection layer. Metal 211 is electrically coupled to a source side of transistor 22a via contact 152. Metal 211 is electrically coupled to a metal 210 arranged at the upper third metal interconnection layer via a contact 212. Metal 210 forms complementary bit line /BL.

The power supply line and the ground line as well as the mutually complementary bit lines BL and /BL extend in the Y-axis direction. The example described above employs the two metals as the ground line arranged in memory cells MC. However, only one metal may be employed, and the number of the metal(s) is not restricted.

Figure 28:
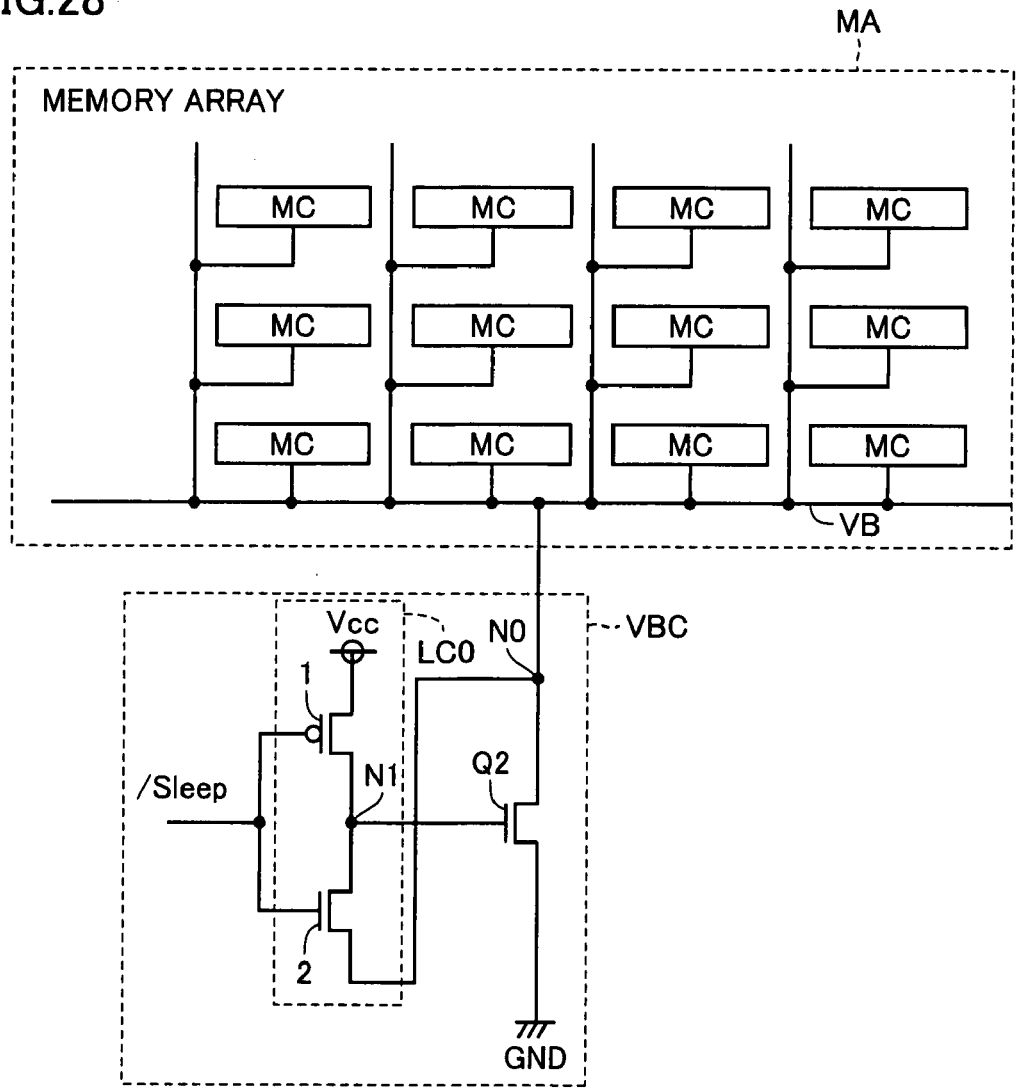
FIG. 28 illustrates a structure in which a voltage supply control circuit is arranged for a pseudo ground line of the memory cell according to the second embodiment of the invention.

Referring to FIG. 28, description will now be given on a structure in which voltage supply control circuit VBC is arranged for pseudo ground line VB of memory cell MC according to the second embodiment of the invention.

Referring to FIG. 28, memory array MA includes the plurality of memory cells MC arranged in rows and columns, and each memory cell is electrically coupled to pseudo ground line VB.

Voltage supply control circuit VBC controls on/off of transistor Q2 in response to control signal /Sleep as described before, and transistor Q2 is turned on to couple electrically pseudo ground line VB to ground voltage GND in the active mode.

In the standby mode, control signal /Sleep attains the "H" level so that transistor Q2 is turned off to discharge the charged charges in node N1 to node N0.

Figure 29:
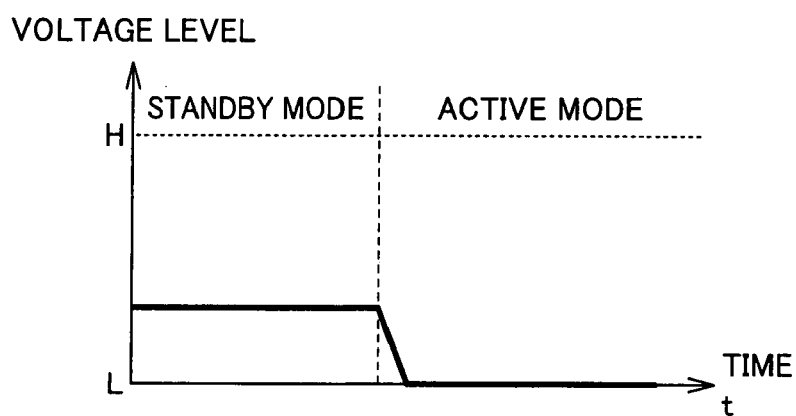
FIG. 29 illustrates a voltage level of the pseudo ground line in standby and active modes.

Referring to FIG. 29, description will now be given on the voltage level of pseudo ground line VB in the standby mode and the active mode.

In the standby mode, pseudo ground line VB is at the balanced potential achieving the balanced state in contrast to the active mode.

In the active mode, transistor Q2 is completely on, and the voltage on pseudo ground line VB is at the "L" level of 0 volts.

The above structure can control the potential level of pseudo ground line VB of memory cell MC, and can reduce a standby leak current during the standby mode of memory cell MC. The charges accumulated in node N1 are discharged to node N0 so that the power consumption can be reduced.

First Modification of the Second Embodiment

In the active mode, the power consumption is further reduced as described below.

Figure 30:
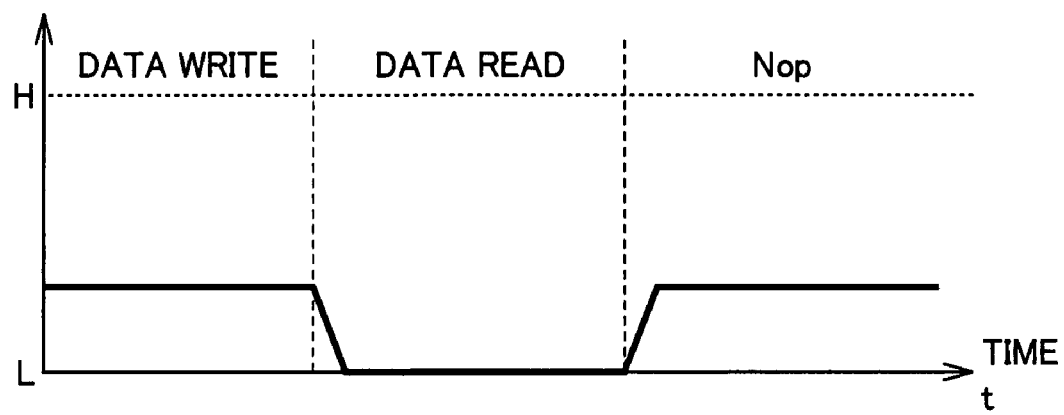
FIG. 30 illustrates the voltage level of the pseudo ground line in data write, data read and Nop states.

Referring to FIG. 30, description will now be given on the potential level of pseudo ground line VB during the data reading or the Nop state, in which access or the like is not performed.

During the data writing and the Nop state, pseudo ground line VB is at the intermediate potential achieving the balanced state. During the data reading, it is electrically coupled to ground voltage GND, and is at the low level.

In the active mode, control signal /Sleep of voltage supply control circuit VBC attains the "H" level during the data writing and the Nop state. Thereby, transistor 2 is turned on similarly to the foregoing operation, and nodes N1 and N0 are electrically coupled. Thus, the state similar to that in the standby mode is attained.

Figure 31:
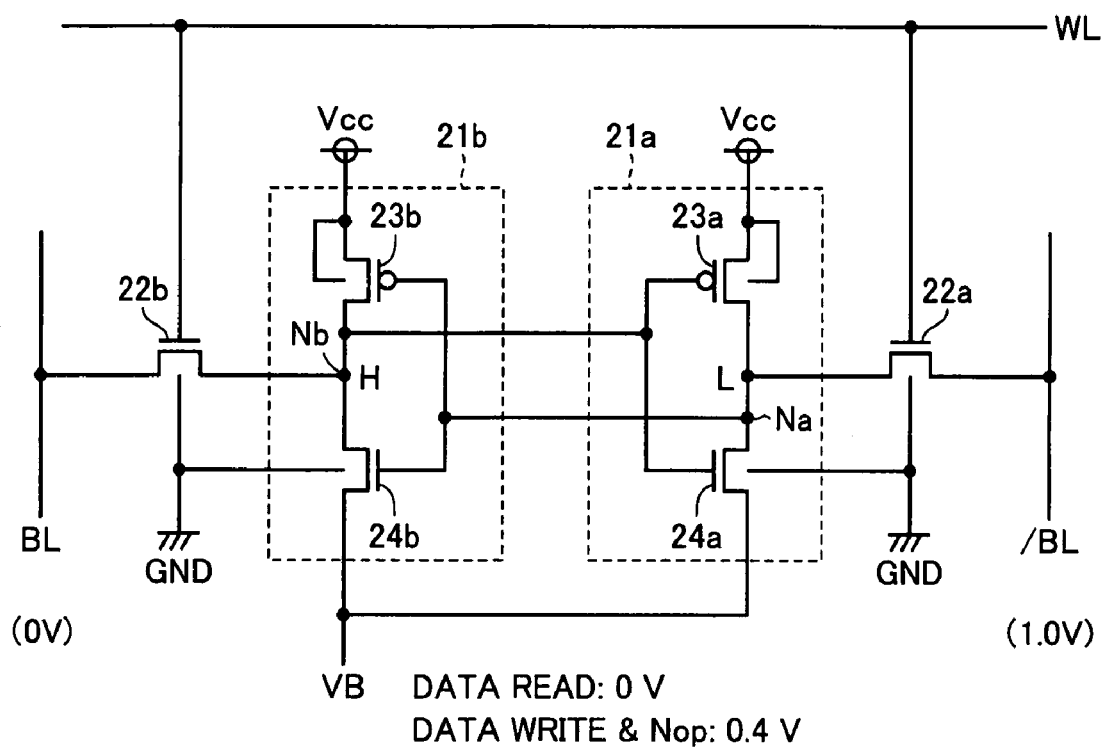
FIG. 31 illustrates a relationship between potentials of various nodes in an operation of writing inverted data of data stored in the memory cell.

Referring to FIG. 31, description will now be given on an potential relationship between the nodes in the operation of writing inverted data of the data stored in memory cell MC.

Referring to FIG. 31, storage nodes Na and Nb are at the data levels, e.g., of "L" and "H", respectively. When power supply voltage Vcc is, e.g., 1.0 V, node Nb is at the level of 1.0 V. Since node Na is on according to the voltage of 1.0 V applied to the gate of transistor 24a, pseudo ground line VB bears the same potential. As already described with reference to FIG. 29, when the balanced potential, i.e., the intermediate potential is, e.g., 0.4 V, the potential of node Na is at 0.4 V.

In the data write operation, word line WL becomes active, and transistors 22a and 22b are turned on to couple electrically bit lines BL and /BL to storage nodes Nb and Na, respectively.

In this example, write driver 67 drives bit lines BL and /BL via data lines IO and /IO to place 1.0 V and 0 V on bit lines BL and /BL according to the input of write data DI.

Thereby, transistors 22a and 22b are turned on so that the charges are discharged from node Nb to bit line BL, and simultaneously transistor 23a is driven to charge node Na. This data writing ends when the charges of node Nb are discharged. In connection with node Nb, the potential of node Na rises to turn off transistor 23b and to turn on transistor 24b. Therefore, when the drive powers of transistors 23a and 23b are small, these are readily turned off, and the data write operation becomes fast.

As described above, pseudo ground line VB is at the balanced potential level of 0.4 V so that transistor 23b electrically coupled to node Na has a small drive power, and the data write operation is fast.

Therefore, pseudo ground line VB is set to 0.4 V during the data writing and the Nop state, and is set to ground voltage GND (0 V) during the data reading, whereby the SRAM circuit capable of fast writing and reading is achieved.

For the memory cells that are not accessed, the potential level of pseudo ground line VB is set to 0.4 V. This is preferable in view of suppression of a leak current in the inactive memory cells. Thus, the device can operate with low power consumption.

Second Modification of the Second Embodiment

Figure 32:
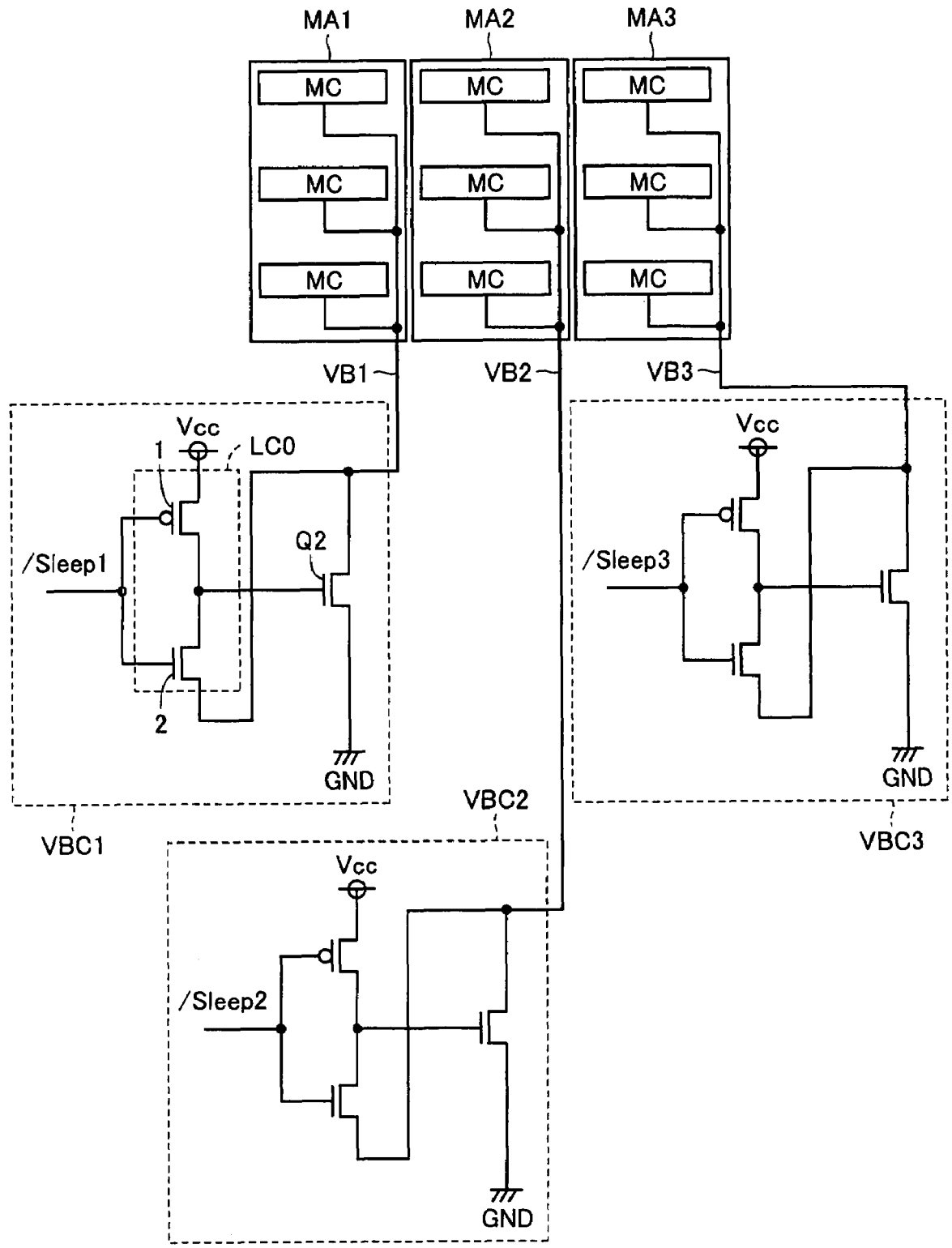
FIG. 32 illustrates a structure having a voltage supply control circuit corresponding to each of memory arrays according to a second modification of the second embodiment of the invention.

Referring to FIG. 32, description will now be given on a structure in which voltage supply control circuits are employed corresponding to a plurality of memory arrays according to a second modification of the second embodiment of the invention, respectively.

Referring to FIG. 32, pseudo ground lines VB are arranged corresponding to, e.g., a plurality of memory arrays MA1-MA3, respectively. More specifically, pseudo ground lines VB1-VB3 are arranged corresponding to memory arrays MA1-MA3, respectively.

Voltage supply control circuit VBC is arranged corresponding to each pseudo ground line VB. More specifically, voltage supply control circuits VBC1-VBC3 are arranged corresponding to pseudo ground lines VB1-VB3, respectively.

This structure can control the potential level of pseudo ground line VB in each memory array MA independently of the others, and the low power consumption can be achieved. By controlling the voltage level of pseudo ground line VB in each memory array independently of the others, the manner and configuration in the first modification of the second embodiment already described can be used to execute the fast data writing in each of memory blocks MA.

Third Embodiment

In the description described above, two transistors operate complementarily to each other to control the voltage level of pseudo ground line VB in response to control signal /Sleep, for example, as is done in voltage supply control circuit VBC in FIGS. 2A-2C. However, this is not restrictive, and such a manner may be employed that the transistors receive independent control signals for operations, respectively.

Figure 33A:
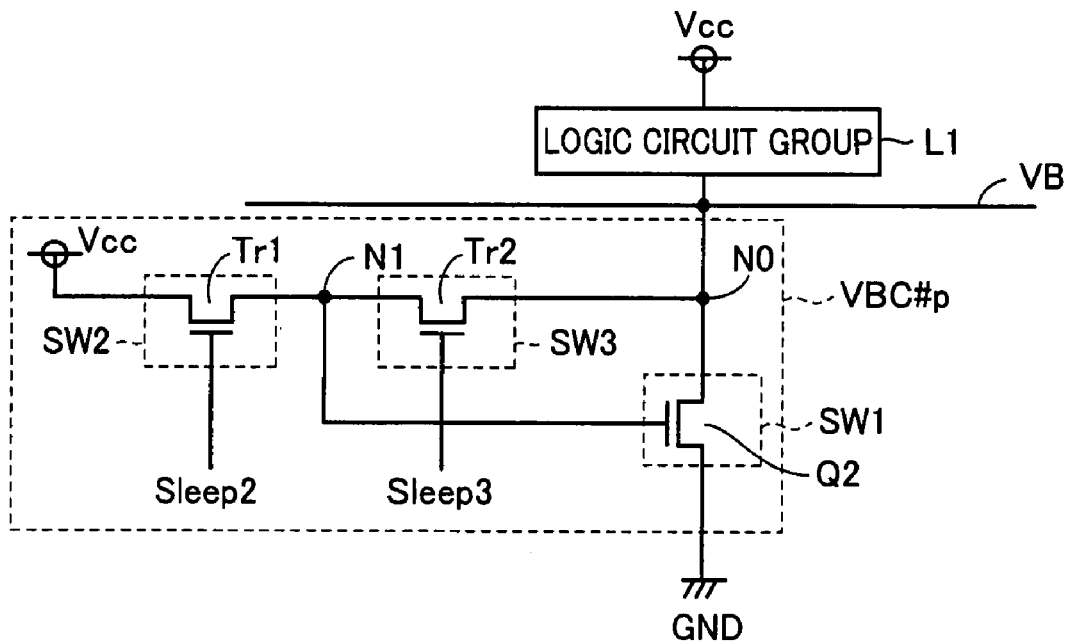
FIGS. 33A and 33B illustrate an MTCMOS circuit according to a third embodiment of the invention.
Figure 33B:
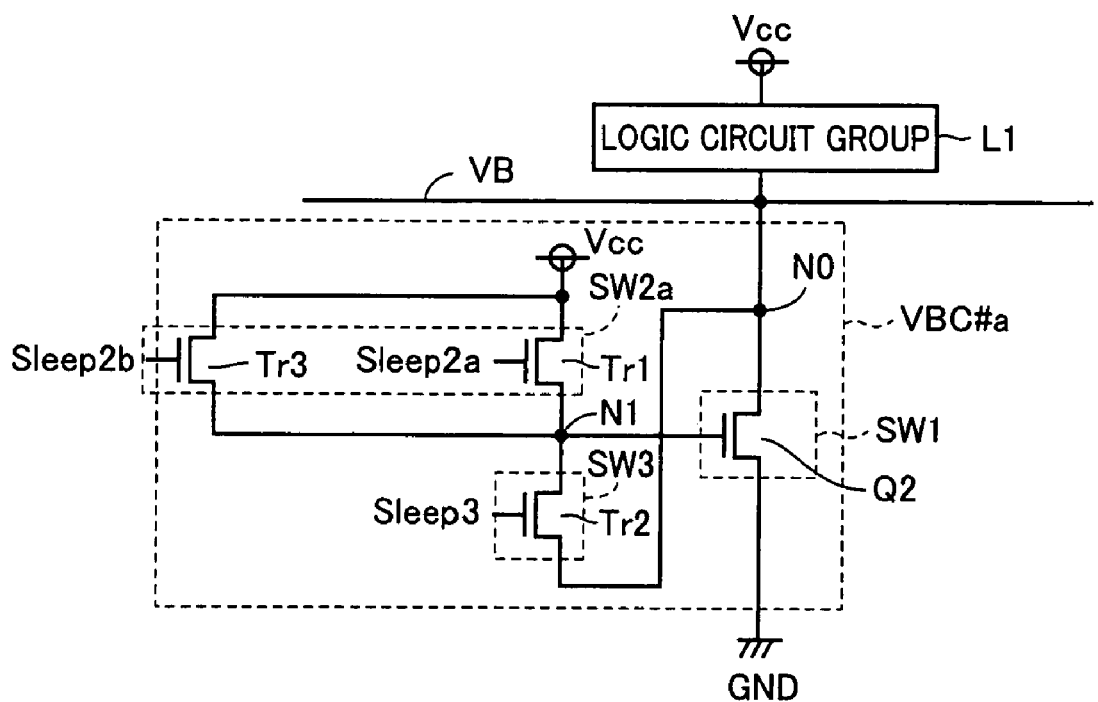

FIGS. 33A and 33B illustrate an MTCMOS circuit according to a third embodiment of the invention.

Referring to FIG. 33A, voltage supply control circuit VBC already described is replaced with voltage supply control circuit VBC#p. Voltage supply control circuit VBC#p includes three switches SW1-SW3.

Switch SW1 is arranged between node N0 and ground voltage GND, and receives a voltage signal from node N1. Switch SW2 is arranged between node N1 and power supply voltage Vcc, and receives a control signal Sleep2. Switch SW3 is arranged between nodes N1 and N0, and receives a control signal Sleep3. In the example described below, MOS transistors form switches SW. However, this structure is not restrictive, and bipolar transistors may be employed. Also, a fin-type Field-Effect Transistor (FET) may be used. An element or the like other than the semiconductor switch may also be employed provided that it is turned on in response to an input signal.

Transistor Q2 forming switch SW1 receives on its gate a voltage signal from node N1. A transistor Tr1 forming switch SW2 receives control signal Sleep2 on its gate, and a transistor Tr2 forming switch SW3 receives control signal Sleep3 on its gate.

The operation of the MTCMOS circuit is as follows. In the active mode, control signal Sleep2 attains the "H" level, and control signal Sleep3 attains the "L" level. In response to this, switch SW2 is turned on to couple electrically node N1 to power supply voltage Vcc, and node N1 attains the "H" level. The voltage level transmitted to node N1 is provided to switch SW1 so that switch SW1 is turned on to couple electrically ground voltage GND to node N0. Thus, pseudo ground line VB is electrically coupled to ground voltage GND via node N0, and logic circuit group L1 is supplied with the power required for the operation, and executes the predetermined operation.

In the standby mode, control signal Sleep2 attains the "L" level. Control signal Sleep3 attains the "H" level. Thereby, switch SW3 is turned on to couple electrically nodes N1 and N0 together. The charged charges have been accumulated in the path including node N1 and extending to switch SW1 because switch SW2 is turned on and power supply voltage Vcc was electrically coupled to node N1 in the active mode.

Therefore, when switch SW3 is turned on, the charged charges in node N1 are discharged to node N0. Thereby, in contrast to the standby mode in which a leak current of power supply voltage Vcc gradually charges pseudo ground line VB to change its potential level, the charges accumulated in node N1 are discharged to node N0 immediately after the start of the standby mode so that the quantity of the current pulled out from power supply voltage Vcc can be reduced, and this manner can achieve the effect substantially the same as that by the structure in FIGS. 2A-2C.

In the example described above, a single transistor forms switch SW. However, this structure is not restrictive.

Figure 34A:
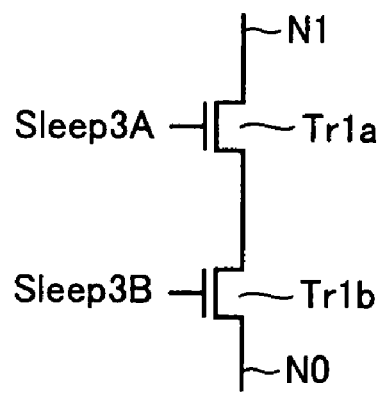
FIGS. 34A and 34B illustrate other structures of switches.
Figure 34B:
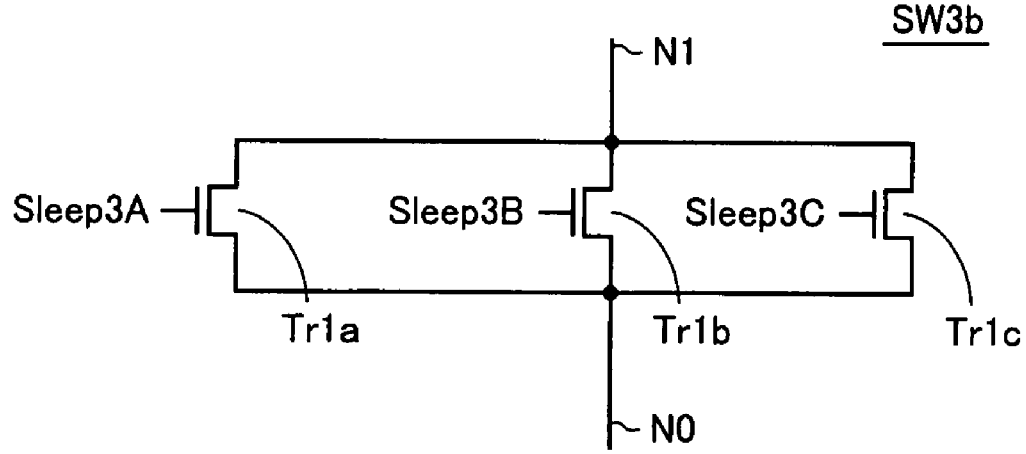

Referring to FIGS. 34A and 34B, other structures relating to switches SW1-SW3 will now be described.

Referring to FIGS. 34A and 34B, each of switches SW3*a* and SW3*b* is replaceable with switches SW1-SW3. As shown in FIG. 34A, a switch structure controlling switches SW1-SW3 may be configured such that two switches Tr1*a* and Tr1*b* are connected in series, and receive control signals Sleep3A and Sleep3B, respectively. As shown in FIG. 34B, a switch structure controlling switches SW1-SW3 may also be configured such that three switches Tr1*a*-Tr1*c* are connected in parallel between nodes N1 and N0, and receive control signals Sleep3A-Sleep3C on their gates, respectively.

Referring to FIG. 33B, an example of switch SW2 formed of two parallel switches will now be described. The structure in FIG. 33B differs from that in FIG. 33A in that voltage supply control circuit VBC#p is replaced with voltage supply control circuit VBC#a. More specifically, voltage supply control circuit VBC#a includes switch SW2*a* instead of switch SW2.

Switches SW1 and SW3 have substantially the same structures as those in FIG. 33A, and therefore detailed description thereof is not repeated. Switch SW2*a* is formed of parallel transistors Tr2*a* and Tr2*b*.

In the active mode, when one of control signals Sleep2*a* and Sleep2*b* attains the "H" level, switch SW1 is turned on to couple electrically ground voltage GND to node N0. Thus, pseudo ground line VB is electrically coupled to ground voltage GND via node N0, and supplies a voltage required for the operation to logic circuit group L1 to perform the predetermined operation.

In the standby mode, control signals Sleep2*a* and Sleep2*b* attain the "L" level. Control signal Sleep3 attains the "H" level. Thereby, switch SW3 is turned on to couple electrically nodes N1 and N0 together, and the structure can achieve substantially the same effect as that illustrated in FIG. 3A.

In the mode or state other than the standby mode, the voltage supply control circuit can likewise adjust the potential of pseudo ground line VB to a predetermined potential level in response to the provided control signal. In the structure shown in FIG. 3O, as described above, the potential of pseudo ground line VB is adjusted to the predetermined level in the active mode.

It is not necessary that switches SW2*a* and SW3 operate according to the same timing. For example, a time difference may be employed, and switch SW3 may be turned off after a certain time elapsed from the turn-off off of switch SW2*a*.

Fourth Embodiment

In the structure of the third embodiment described above, power supply voltage Vcc serving as the operation voltage of the voltage supply control circuit is electrically coupled to node N1 so that the current is supplied, and the voltage on node N1 controlling switch SW1 attains the "H" level. However, such a structure may be employed that the current is supplied from the control signal applied to the signal interconnection instead of power supply voltage Vcc.

Figure 35:
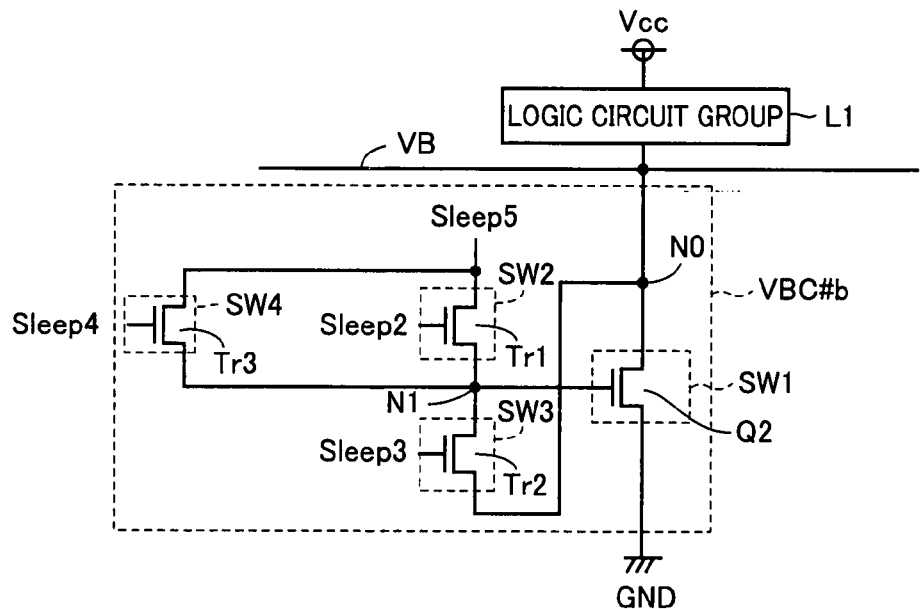
FIG. 35 illustrates an MTCMOS circuit according to a fourth embodiment of the invention.

Referring to FIG. 35, description will now be given on an MTCMOS circuit according to a fourth embodiment of the invention.

Referring to FIG. 35, this structure employs a voltage supply control circuit VBC#b instead of voltage supply control circuit VBC#a. Voltage supply control circuit VBC#b is not connected to power supply voltage Vcc of voltage supply control circuit VBC#a illustrated in FIG. 33B, but can be supplied with a control signal Sleep5.

Switches SW3 and SW4 function as so-called path transistors.

In the active mode, voltage supply control circuit VBC#b receives control signal Sleep5 at the "H" level. In the active mode, at least one of control signals Sleep3 and Sleep4 is at the "H" level. Thereby, at least one of switches SW3 and SW4 is turned on to transmit control signal Sleep5 at the "H" level to node N1. The subsequent operations are substantially the same as those already described so that description thereof is not repeated.

In the standby mode, control signals Sleep3 and Sleep4 are at the "L" level, and control signal Sleep2 is at the "H" level. Thereby, nodes N1 and N0 are electrically coupled together. In the active mode, node N1 already accumulated the charged charges when control signal Sleep5 was provided to switch SW1. Therefore, when switch SW2 is turned on, the charged charges in node N1 are discharged to node N0. Thereby, the charges accumulated in node N1 are discharged to node N0 immediately after the start of the standby mode, in contrast to the manner in which the potential level of pseudo ground line VB is gradually charged by the leak current of power supply voltage Vcc in the standby mode. Therefore, the quantity of the current pulled out from power supply voltage Vcc can be reduced, and the manner of this embodiment can achieve substantially the same effect as that illustrated in FIGS. 2A-2C.

The signal at the "H" level used in the voltage supply control circuit may be different in level from power supply voltage Vcc.

Control signal Sleep5 indicates that it is electrically coupled to a signal interconnection supplying a voltage signal indicating the logical level of the control signal in question, and this signal interconnection is included in the voltage interconnections supplying voltages already described in connection with the first embodiment. Control signal Sleep5 can be configured such that a voltage signal indicting a logical level is fixedly supplied, and can also be configured such that its logical level is changed for supplying when necessary.

First Modification of the Fourth Embodiment

In the embodiment already described, the current is supplied to logic circuit group L1, using the power supply voltage as the operation voltage. However, the voltage supply control circuit according to the invention can likewise be applied to the structure that supplies a current from the control signal provided to the signal interconnection instead of power, supply voltage Vcc.

Figure 36:
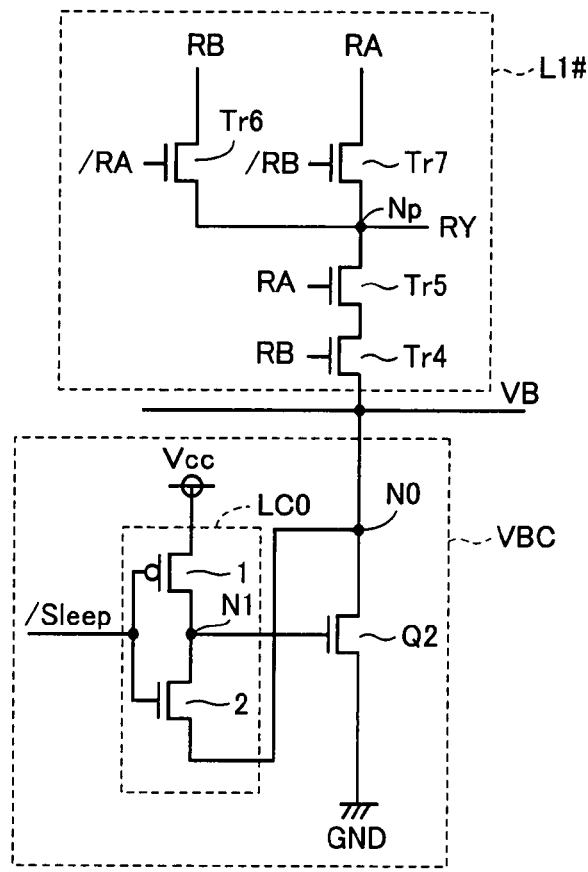
FIG. 36 illustrates an MTCMOS circuit according to a first modification of the fourth embodiment of the invention.

Referring to FIG. 36, description will now be given on the MTCMOS circuit according to the first modification of the fourth embodiment of the invention.

Referring to FIG. 36, this structure differs from the structure illustrated in FIGS. 2A-2C in that logic circuit group L1 is replaced with a logic circuit group L1#. Logic circuit group L1# is supplied with a current for operation from a signal provided to the signal interconnection instead of power supply voltage Vcc, and is an XOR circuit formed of so-called path transistors.

More specifically, logic circuit group L1# includes transistors Tr4-Tr7. Transistors Tr4 and Tr5 are connected in series between an output node Np transmitting an output signal RY and pseudo ground line VB, and receive signals RA and RB on their gates, respectively.

Transistor Tr6 receives signal RB provided to its input end on the source side, and has a drain electrically coupled to node Np. Transistor Tr6 also receives a signal /RA on its gate. Transistor Tr7 receives signal RA on its input end on the source side, and has a drain electrically coupled to node Np. Transistor Tr7 receives a signal /RB on its gate.

An operation of this logic circuit group L1# will now be described.

For example, when signals RA and RB are both at the "L" level, transistors Tr6 and Tr7 receiving inverted signals of signals RA and RB on their gates are turned on to transmit signals RA and RB to node Np, respectively. Since both signals RA and RB are at the "L" level, both transistors Tr4 and Tr5 are off. Since signals RA and RB are at the "L" level, signal RY at the "L" level is provided from output node Np.

When signals RA and RB are at the "H" and "L" level, respectively, an inverted signal at the "L" level of signal RA is provided to the gate of transistor Tr6, and an inverted signal at the "H" level of signal RB is provided to the gate of transistor Tr7. Thereby, transistor Tr7 is turned on to transmit signal RA to node Np. Thus, signal RY at the "H" level is provided from output node Np. Since one of signals RA and RB is at the "L" level, only one of transistors Tr4 and Tr5 is turned on, and the other is off so that pseudo ground line VB is electrically isolated from node Np.

When signals RA and RB are at the "L" and "H" levels, respectively, an inverted signal at the "H" level of signal RA is provided to the gate of transistor Tr6, and an inverted signal at the "L" level of signal RB is provided to the gate of transistor Tr7. Thereby, transistor Tr6 is turned on to transmit signal RB to node Np. Thus, output node Np provides signal RY at the "H" level. Since only one of signals RA and RB is at the "L" level, only one of transistors Tr4 and Tr5 is on, and the other is off so that pseudo ground line VB is electrically isolated from node Np.

When signals RA and RB are both at the "H" level, inverted signals at the "L" level of signals RA and RB are provided to the gates of transistors Tr6 and Tr7, and both transistors Tr6 and Tr7 are off. Since signals RA and RB are provided to transistors Tr5 and Tr4, respectively, both transistors Tr5 and Tr4 are turned on to couple electrically output node Np to pseudo ground line VB. Since pseudo ground line VB is electrically coupled to ground voltage GND, a signal at the "L" level is transmitted to output node Np, and signal RY at the "L" level is output.

In this XOR circuit, output node Np is electrically coupled to the input nodes of signals RA and RB in response to signals RA and RB. Thereby, the signal transmission paths of signals RA and RB are formed, and output node Np is electrically coupled to ground voltage GND so that the signal transmission path of the fixed signal at the "L" level is formed.

In the active mode of this XOR circuit, voltage supply control circuit VBC receives control signal /Sleep at the "L" level. In the standby mode, it receives control signal /Sleep at the "H" level. The operation is substantially the same as that already described in connection with the first embodiment, and detailed description thereof is not repeated.

In this structure, when signals RA and RB that are externally supplied in the standby mode are at the "L" level, signals /RA and /RB are at the "H" level so that the charges are pulled out from the gates of transistors Tr6 and Tr7, and are charged via transistors Tr5 and Tr4 to pseudo ground line VB.

In the standby mode, the charged charges in node N1, i.e., the charged charges stored in the region connected to the gate of transistor Q2 are discharged to node N0, similarly to the operation in the first embodiment already described so that the quantity of the charges pulled out from the gates of transistors Tr6 and Tr7 is small, and the power consumption can be small.

An external incoming current is consumed when logic circuit group L1# not having a power supply operates only with external signals, as is done in the above structure. Therefore, by discharging the charged charges in node N1 to node N0 and charging pseudo ground line VB, the incoming current can be reduced, and the power consumption of the whole circuit can be reduced.

Although the XOR circuit using the path transistors has been described as an example of logic circuit group L1#, a logic circuit other than the XOR circuit can be naturally formed, using the path transistors.

Signals RA and RB and the like are electrically coupled to the signal interconnections supplying voltage signals indicative of logic levels of such signals, and these signal interconnections are included in the voltage interconnections supplying the voltages already described in connection with the first embodiment. The logic levels of signal RA and, RB and the like can be appropriately changed.

Second Modification of the Fourth Embodiment

The embodiments have been described on the structure in which power supply voltage Vcc or the control signal is used for externally supplying the current. However, a structure having an internal power supply unit instead of using power supply voltage Vcc may be employed.

Figure 37:
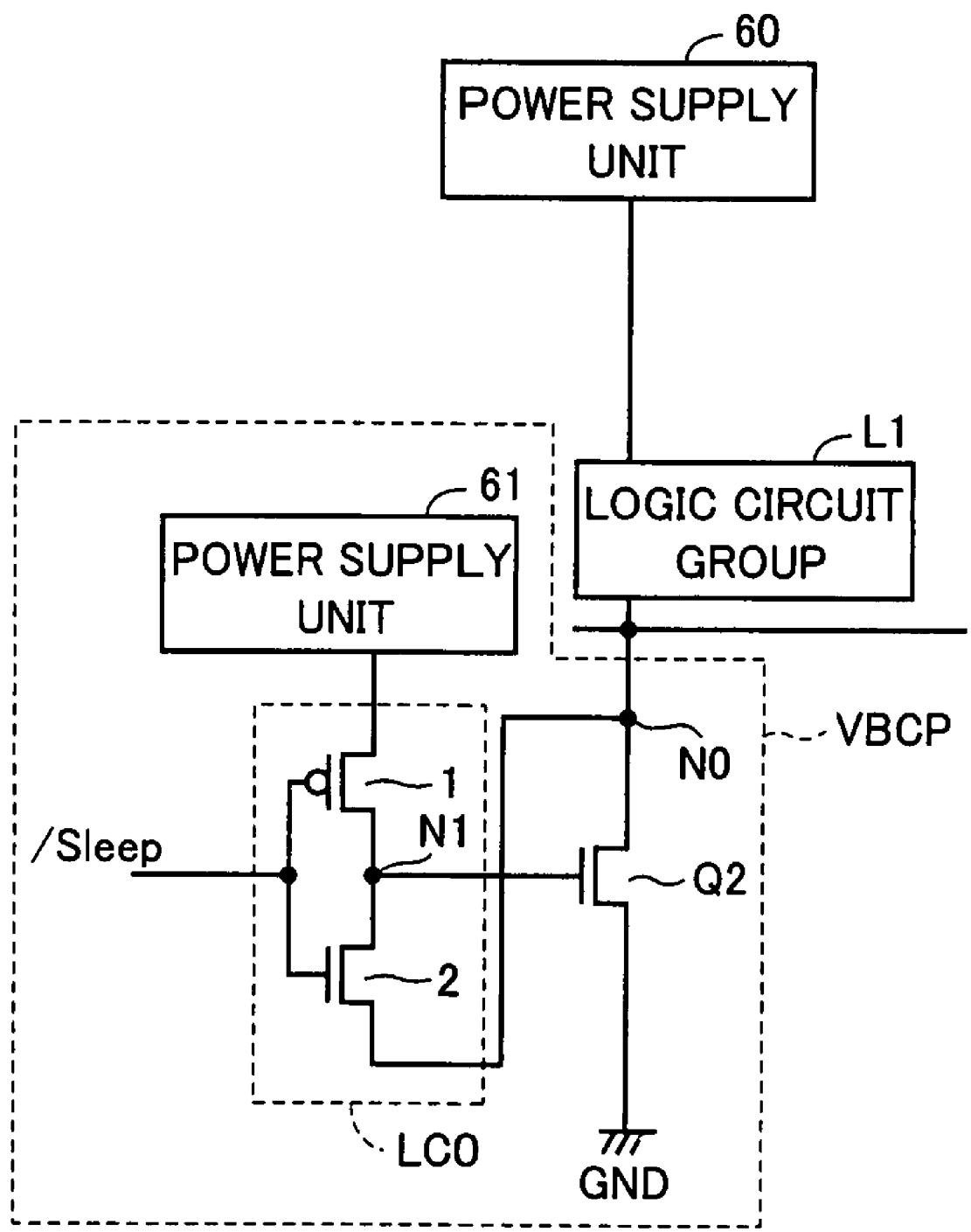
FIG. 37 illustrates an MTCMOS circuit according to a second modification of the fourth embodiment of the invention.
Figure 38:
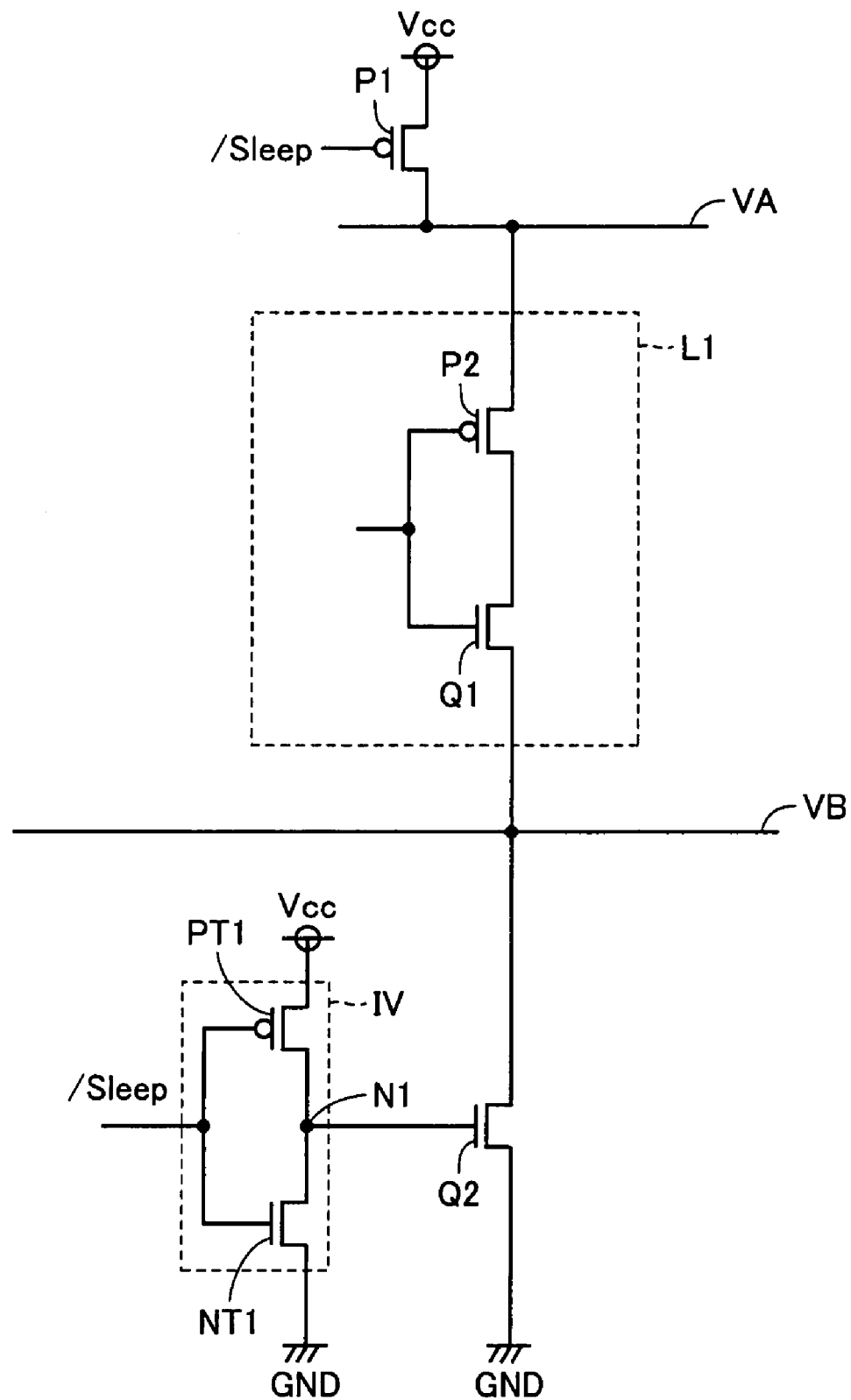
FIG. 38 illustrates a conventional MTCMOS circuit.

Referring to FIG. 37, description will now be given on an MTCMOS circuit according to a second modification of the fourth embodiment of the invention.

Referring to FIG. 37, the structure differs from the structure illustrated in FIGS. 2A-2C in that a power supply unit 60 is connected instead of power supply voltage. Vcc. Other points are substantially the same, and therefore description thereof is not repeated. A voltage supply control circuit VBCP according to the second modification of the fourth embodiment differs from voltage supply control circuit VBC illustrated in FIGS. 2A-2C in that a power supply unit 61 is connected instead of power supply voltage Vcc. Other structures are substantially the same.

For example, power supply units 60 and 61 may be formed of rechargeable elements such as a rechargeable battery or a capacitor element instead of power supply voltage Vcc. Even in the MTCMOS circuit using power supply units 60 and 61 as the power supplies, the provision of voltage supply control circuit VBCP can suppress the pull-out of the charges accumulated in the power supply unit, and can reduce the power consumption of the power supply unit similarly to the foregoing structures.

The power supply unit may be formed of an electric generator element such as a rechargeable battery or a capacitor element that generates an electric power by converting a physical energy to an electric energy. For example, it is possible to employ a photoelectric generator element generating an electric power based on an light intensity of the solar rays, a generator element that uses a spring and generates an electric power based on a motion moment of a spring, or a thermal generator element generating an electric power based on a heat flow. For example, an example of such electric generator element is disclosed in a non-patent reference (N. Hama, A. Yajima, Y. Yoshida, F. Utsunomiya, J. Kodate, T. Tsukahara, T. Douseki, "SOI Circuit Technology for Batteryless Mobile System with Green Energy Sources," Symposium on VLSI Circuits Digest of Technical Papers, IEEE, pp. 280-283, 2002).

Naturally, the structures, manners and others of the third and fourth embodiments as well as the modifications thereof may be applied to the first embodiment. For example, power supply voltage Vcc1 shown in FIGS. 2A-2C may be replaced with control signal RA, RB or the like, and power supply voltage Vcc2 may be replaced with a signal (voltage interconnection) such as control signal Sleep5 or the like.

The foregoing switches in the embodiments may take a form of a semiconductor integrated circuit.

The structures, manners and the like in the embodiment and modifications already described may be appropriately combined with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a first voltage interconnection supplying a first voltage;
a second voltage interconnection supplying a second voltage;
a third voltage interconnection supplying a third voltage;
a first voltage supply interconnection arranged between said first and second voltage interconnections;
an internal circuit connected between said second voltage interconnection and said first voltage supply interconnection, and forming a current path between said second voltage interconnection and said first voltage supply interconnection according to an input signal; and
a first voltage supply control circuit connected between said first voltage interconnection and said first voltage supply interconnection, and being capable of controlling a conductive state between said first voltage interconnection and said first voltage supply interconnection according to an input instruction signal, wherein
said first voltage supply control circuit includes:
a first switch arranged between said first voltage supply interconnection and said first voltage interconnection, and
a first logic circuit controlling said first switch according to said instruction signal; and
said first logic circuit includes:
a second switch arranged between said third voltage interconnection and a control end of said first switch, and electrically coupling said third voltage interconnection to the control end of said first switch according to an instruction signal setting said first switch to a conductive state, and
a third switch arranged between said first voltage supply interconnection and the control end of said first switch, and electrically coupling said first voltage supply interconnection to the control end of said first switch when said first switch attains a non-conductive state with a lower amount of current than in a conductive state caused by said second switch attaining a non-conductive state.

2. The semiconductor device according to claim 1, wherein said first and third voltage interconnections are electrically coupled together, and said first and third voltages are at the same level,
the control ends of said second and third switches of said first logic circuit are electrically coupled together, and receives the same instruction signal,
said second switch of said first logic circuit is formed of a field-effect transistor of a first conductivity type,
said third switch of said first logic circuit is formed of a field-effect transistor of a second conductivity type.

3. The semiconductor device according to claim 1, wherein said first switch is formed of a field-effect transistor, and said field-effect transistor has a gate electrically coupled to a body region or a substrate region of said field-effect transistor.

4. The semiconductor device according to claim 1, wherein said first switch is formed of a field-effect transistor, and a predetermined bias voltage is applied to a body region or a substrate region of said field-effect transistor.

5. The semiconductor device according to claim 1, wherein said first logic circuit controls said first switch according to a plurality of said instruction signals,
said second switch electrically couples said third voltage interconnection to the control end of said first switch based on a combination of a plurality of said instruction signals provided for setting said first switch to the on state, and
said third switch electrically couples the control end of said first switch to said first voltage supply interconnection based on a combination of a plurality of said instruction signals provided for setting said first switch to the off state.

6. The semiconductor device according to claim 1, wherein said first voltage supply control circuit includes a second logic circuit controlling said first switch in response to said instruction signal; and
said second logic circuit includes:
a fourth switch arranged between said third voltage interconnection and the control end of said first switch, and electrically coupling said third voltage interconnection to the control end of said first switch according to said instruction signal setting said first switch to the conductive state, and
a fifth switch arranged between said first voltage supply interconnection and the control end of said first switch, and electrically coupling said first voltage supply interconnection to the control end of said first switch when said first switch attains a non-conductive state with a lower amount of current than in a conductive state caused by said fourth switch attaining a non-conductive state.

7. The semiconductor device according to claim 1, wherein said first voltage supply control circuit includes:
a fourth switch arranged between said first voltage supply interconnection and said first voltage interconnection, and
a second logic circuit controlling said fourth switch according to said instruction signal.

8. The semiconductor device according to claim 1, wherein said first voltage supply control circuit further includes a fourth switch arranged between said first voltage supply interconnection and said first voltage interconnection, and having a control end electrically coupled to the control end of said first switch.

9. The semiconductor device according to claim 1, wherein said first voltage supply control circuit further includes a fourth switch controlling connection between the control end of said first switch and said first voltage supply interconnection via said third switch in response to a first control signal.

10. The semiconductor device according to claim 9, wherein
the voltage signal level of said first control signal of said fourth switch is adjustable.

11. The semiconductor device according to claim 10, wherein
said first voltage supply interconnection is set to an intermediate potential between said first and second voltages according to the voltage signal level of said first control signal.

12. The semiconductor device according to claim 9, wherein
said first voltage supply control circuit further includes a fifth switch connecting a connection node between said third and fourth switches to said first voltage interconnection in response to a second control signal.

13. The semiconductor device according to claim 1, wherein
said first voltage supply control circuit further includes a resistance arranged between the control end of said first switch and said first voltage supply interconnection via said third switch.

14. The semiconductor device according to claim 1, further comprising:
a second voltage supply interconnection arranged between said first and second voltage interconnections; and
a second voltage supply control circuit connected between said second voltage interconnection and said second voltage supply interconnection, and being capable of controlling a state of electrical conduction between said second voltage interconnection and said second voltage supply interconnection according to said instruction signal, wherein
said second voltage supply control circuit includes:
a fourth switch arranged between said second voltage supply interconnection and said second voltage interconnection, and
a second logic circuit controlling said fourth switch according to said instruction signal; and
said second logic circuit includes:
a fifth switch arranged between said first voltage interconnection and a control end of said fourth switch, and electrically coupling said first voltage interconnection to the control end of said fourth switch according to said instruction signal setting said fourth switch to an on state, and
a sixth switch arranged between said second voltage supply interconnection and the control end of said fourth switch, and electrically coupling said second voltage supply interconnection to the control end of said fourth switch when said fourth switch attains a non-conductive state with a lower amount of current than in a conductive state caused by said fifth switch attaining a non-conductive state.

15. The semiconductor device according to claim 1, wherein
said first switch is arranged in a first circuit block region, and
said second and third switches are arranged in a second circuit block region different from said first circuit block region.

16. The semiconductor device according to claim 1, wherein
said instruction signal includes a plurality of input instruction signals, and
at least one of said first to third switches operates in response to reception of a plurality of said input instruction signals.

17. The semiconductor device according to claim 1, wherein
said internal circuit corresponds to a memory array having a plurality of memory cells.

18. The semiconductor device according to claim 17, wherein
each of said memory cells includes a flip-flop circuit for setting first and second storage nodes to different potential levels according to data to be stored, respectively;
said flip-flop circuit includes:
a first transistor arranged between said second voltage and said first storage node, and having a gate electrically coupled to said second storage node,
a second transistor arranged between said voltage supply interconnection and said first storage node, and having a gate electrically coupled to said second storage node,
a third transistor arranged between said second voltage and said second storage node, and having a gate electrically coupled to said first storage node, and
a fourth transistor arranged between said voltage supply interconnection and said second storage node, and having a gate electrically coupled to said first storage node;
said first switch is turned off in response to said instruction signal in a data write operation; and
said first voltage supply interconnection is set to an intermediate potential between said first and second voltages.

19. The semiconductor device according to claim 17, wherein
said internal circuit includes a plurality of said memory arrays; and
said semiconductor device further comprises:
a plurality of said first voltage supply interconnections corresponding to said plurality of memory arrays, respectively, and
a plurality of said voltage supply control circuits corresponding to said plurality of first voltage supply interconnections, respectively, each connected between said first voltage interconnection and the corresponding first voltage supply interconnection, and each being capable of controlling a conductive state between said first voltage interconnection and the corresponding first voltage supply interconnection according to an instruction signal.

* * * * *